(12) United States Patent
Nishikizawa et al.

(10) Patent No.: US 9,171,727 B2
(45) Date of Patent: Oct. 27, 2015

(54) METHOD OF MANUFACTURING A SEMICONDUCTOR DEVICE

(71) Applicant: Renesas Electronics Corporation, Kawasaki-shi, Kanagawa (JP)

(72) Inventors: Hiroshi Nishikizawa, Kanagawa (JP); Takuro Homma, Kanagawa (JP); Hiraku Chakihara, Kanagawa (JP); Mitsuhiro Noguchi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/146,054

(22) Filed: Jan. 2, 2014

(65) Prior Publication Data
US 2014/0242767 A1    Aug. 28, 2014

(30) Foreign Application Priority Data

Feb. 28, 2013 (JP) .................................. 2013-040046

(51) Int. Cl.
| | |
|---|---|
| *H01L 29/792* | (2006.01) |
| *H01L 21/28* | (2006.01) |
| *H01L 21/3105* | (2006.01) |
| *H01L 21/8234* | (2006.01) |
| *H01L 29/423* | (2006.01) |
| *H01L 29/66* | (2006.01) |
| *H01L 27/115* | (2006.01) |

(52) U.S. Cl.
CPC .... *H01L 21/28008* (2013.01); *H01L 21/28282* (2013.01); *H01L 27/11568* (2013.01); *H01L 29/42344* (2013.01); *H01L 29/66833* (2013.01); *H01L 29/792* (2013.01)

(58) Field of Classification Search
CPC ....... H01L 21/76; H01L 21/336; H01L 23/48; H01L 23/52; H01L 27/108
USPC .................... 257/296, 758; 438/257, 261, 454
See application file for complete search history.

(56) References Cited

U.S. PATENT DOCUMENTS

| | | | |
|---|---|---|---|
| 6,664,155 B2 | 12/2003 | Kasuya | |
| 7,112,870 B2 | 9/2006 | Uchiyama et al. | |
| 2003/0166320 A1* | 9/2003 | Kasuya | ......................... 438/257 |

FOREIGN PATENT DOCUMENTS

| | | |
|---|---|---|
| JP | 2003-243619 A | 8/2003 |
| JP | 2010-010716 A | 1/2010 |
| JP | 2012-069837 A | 4/2012 |

* cited by examiner

*Primary Examiner* — Kimberly Rizkallah
*Assistant Examiner* — Brian Turner
(74) *Attorney, Agent, or Firm* — Miles & Stockbridge P.C.

(57) ABSTRACT

After forming a first film over the main surface of a semiconductor substrate, the first film is patterned, thereby forming a control gate electrode for a non-volatile memory, a dummy gate electrode, and a first film pattern. Subsequently, a memory gate electrode for the non-volatile memory adjacent to the control gate electrode is formed. Then, the first film pattern is patterned thereby forming a gate electrode and a dummy gate electrode.

13 Claims, 55 Drawing Sheets

| OPERATION \ APPLICATION VOLTAGE | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

METHOD OF MANUFACTURING A SEMICONDUCTOR DEVICE

CROSS-REFERENCE TO RELATED APPLICATIONS

The disclosure of Japanese Patent Application No. 2013-040046 filed on Feb. 28, 2013 including the specification, drawings, and abstract is incorporated herein by reference in its entirety.

BACKGROUND

The present invention relates to a method of manufacturing a semiconductor device, which can be used suitably to a method of manufacturing a semiconductor device having a non-volatile memory.

As electrically programmable and erasable non-volatile semiconductor memory devices, EEPROM (Electrically Erasable and Programmable Read Only Memory) have been employed generally. Such memory devices typically represented by flash memories and used generally at present have a conductive floating gate electrode surrounded by an oxide film or a trapping insulation film below a gate electrode of a MISFET, use the state of charges accumulated in the floating gate or the charge trapping insulation film as memory information, and read out the same as a threshold value of the transistor. This charge trapping insulation film is an insulation film capable of accumulating charges therein and includes, for example, a silicon nitride film. By injection and release of charges into and from the charge region, the threshold value of the MISFET is shifted to operate the same as a memory device. The flash memory includes a split gate cell using a MONOS (Metal-Oxide-Nitride-Oxide-Semiconductor) film. Such a memory uses a silicon nitride film as a charge accumulation region and has various advantages, for example, that it is excellent in the reliability of data holding compared with a conductive floating gate film due to discrete charge accumulation. In addition, owing to the excellent reliability of data holding, the thickness of the oxide film over and below the silicon nitride film can be reduced, making it possible to decrease the voltage for write and erase operations.

Japanese Patent Laid-Open No. 2003-243619 describes a technique relating to a non-volatile semiconductor memory device. Further, Japanese Patent Laid-Open No. 2010-10716 describes a technique relating to a dummy pattern in a semiconductor device having a step of planarizing the surface by using a CMP method. Further, Japanese Patent Laid-Open No. 2012-69837 describes a technique relating to a semiconductor device having a CMP step.

SUMMARY

Also in the semiconductor device having the non-volatile memory, it is desired to improve the reliability of the semiconductor device as much as possible. Alternatively, it is desired to improve the performance of the semiconductor device, or improve both of them.

Other objects and novel features of the present invention will become apparent from the description in the present specification and the accompanying drawings.

In one aspect of the present invention, there is provided a method of manufacturing a semiconductor device having a memory cell of a non-volatile memory formed in a first region of a semiconductor substrate, and a MISFET formed in a second region of the semiconductor substrate. The method includes a step of forming a first film over the main surface of the semiconductor substrate, a step of patterning the first film thereby forming a gate electrode, a first film pattern, and a dummy gate of the memory cell, and a step of patterning the first film pattern thereby forming a gate electrode and a second dummy electrode of the MISFET.

According to the aspect, the reliability of the semiconductor device can be improved.

Alternatively, the performance of the semiconductor device can be improved

Alternatively, both of the reliability and the performance of the semiconductor device can be improved.

DETAILED DESCRIPTION

Figure 1:
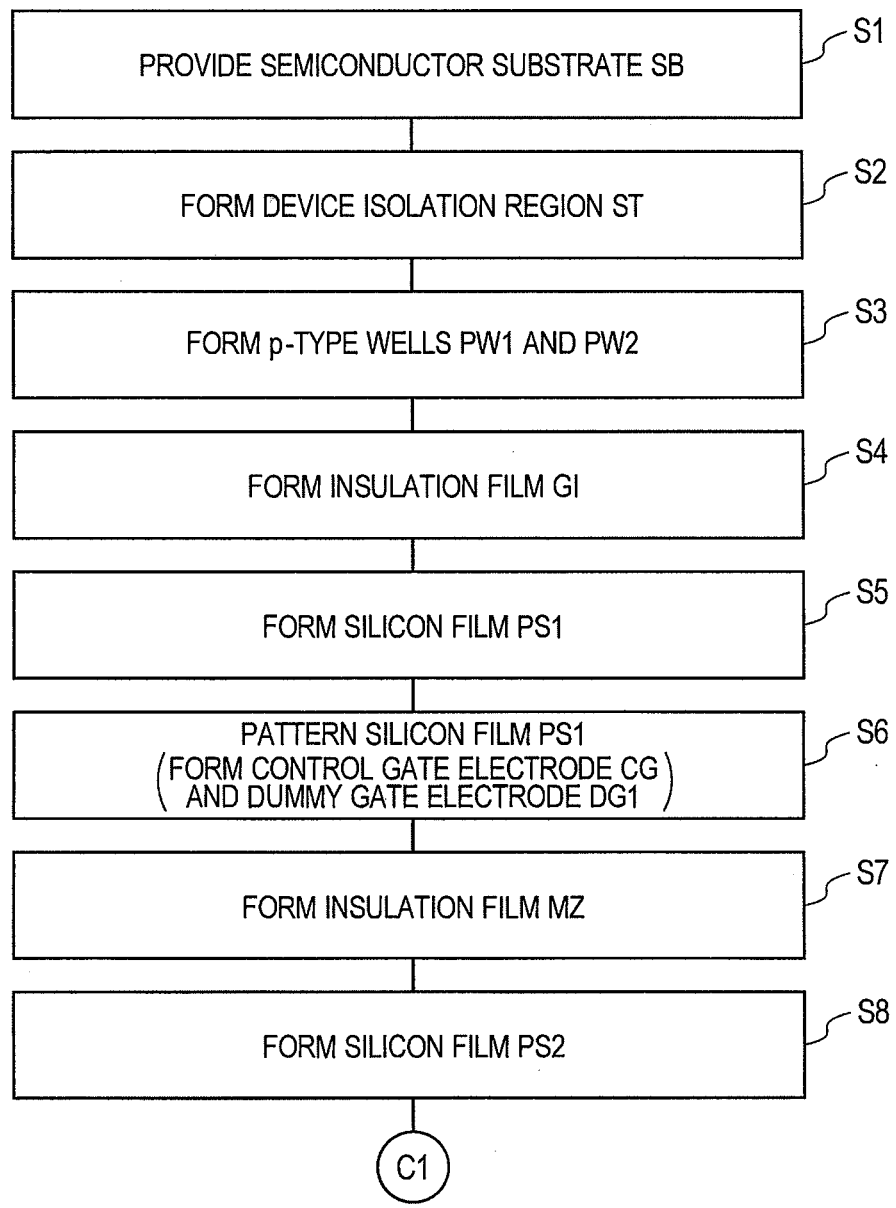
FIG. 1 is a process flow chart illustrating a portion of a manufacturing step of a semiconductor device as a preferred embodiment.

In the description of the following embodiment, the embodiment may be described in a plurality of divided sections or embodiments for the sake of convenience, if required. However, unless otherwise specified, they are not independent of each other, but are in such a relation such that one is a modification example, details, complementary explanation, or the like of a part or the whole of the other. Further, in the following embodiment, when a reference is made to the number of element or the like (including number, numerical value, quantity, range, and the like), the number of elements is not limited to the specified number, but may be greater than or less than the specified number unless otherwise specified, and except the case where the number is apparently limited to the specified number in principle, etc. Further in the following embodiment, it is needless to say that the constitutional elements (including element steps and the like) are not always essential unless otherwise specified, and except the case where they are apparently considered essential in principle, etc. Similarly, in the following embodiment, when a reference is made to the shape, positional relationship, or the like of constitutional elements, or the like, it is understood that they include ones substantially analogous or similar to the shape, or the like, unless otherwise specified, unless otherwise considered apparently in principle, or the like. This also applies to the foregoing numerical values and ranges.

Embodiments of the present invention will be described below in details by reference to the accompanying drawings.

Incidentally, throughout the drawings for describing the embodiments, the members having the same function carry the same reference signs, and a repeated description therefor is omitted. Further, in the following embodiment, descriptions for the same or similar parts will not be repeated in principle unless it is particularly required.

Further, in the drawings to be used for the embodiment, hatching may sometimes be omitted even in a cross-sectional view for easy understanding of the drawings. On the other hand, hatching may be sometimes added even in a plan view for easy understanding of the drawings.

First Embodiment

Semiconductor Device Manufacturing Step

A semiconductor device of this embodiment and the following embodiment is a semiconductor device having a non-volatile memory (non-volatile memory device, flash memory, non-volatile semiconductor memory device). This embodiment and the following embodiment are described with reference to a memory cell based on an n-channel type MISFET (Metal Insulator Semiconductor Field Effect Transistor). Further, the polarity in this embodiment and the following embodiment (polarity of application voltage upon write, erase, read and polarity of carriers) is for the explanation of the operation in a case of the memory cell based on a n-channel type MISFET and, when it is based on a p-channel type MISFET, identical operation can be obtained in principle by reversing all of polarities such as of application potential, conduction type of carriers.

A method of manufacturing the semiconductor device of this embodiment is to be described with reference to the drawings.

Figure 2:
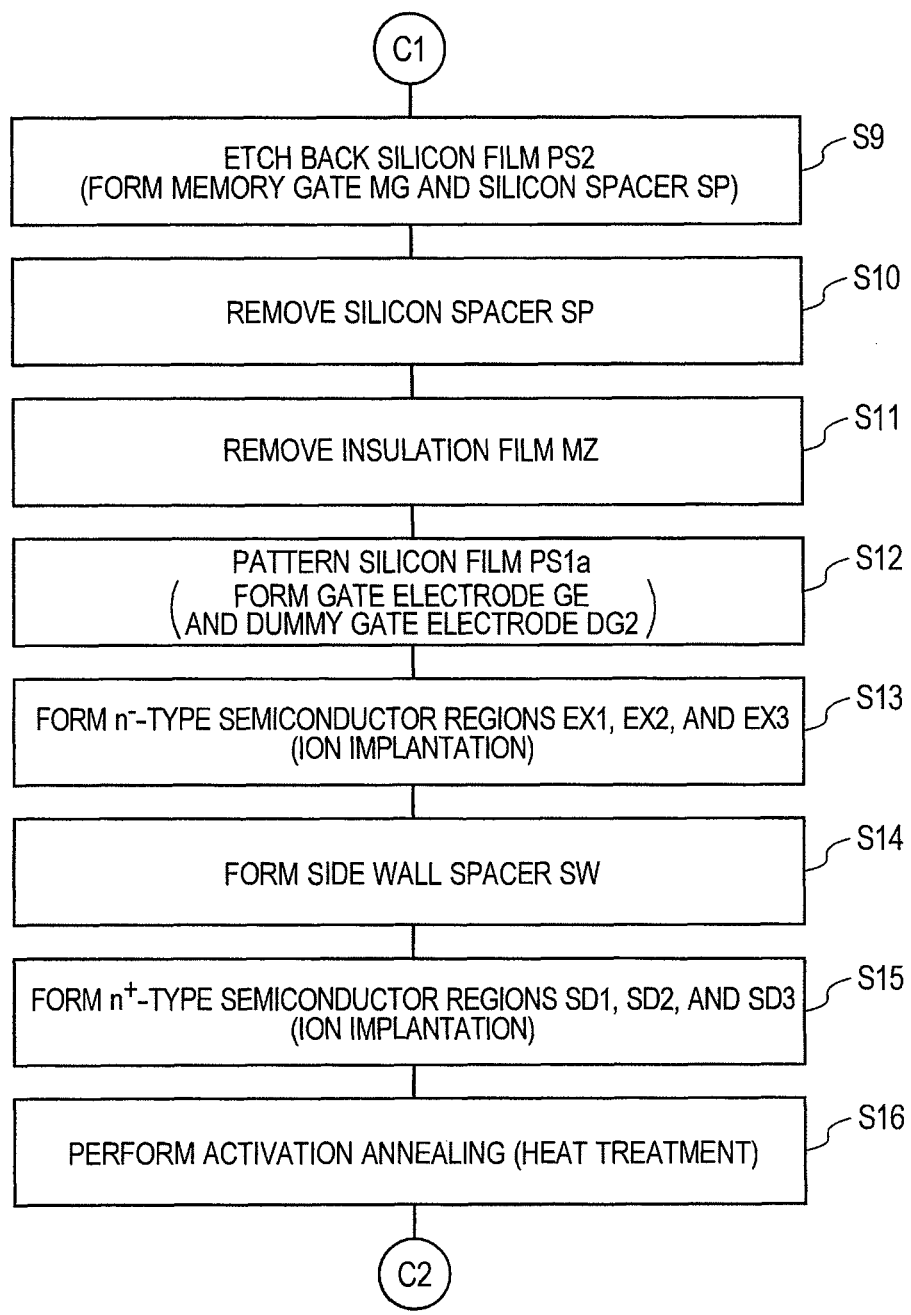
FIG. 2 is a process flow chart illustrating a portion of the manufacturing step of the semiconductor device as the preferred embodiment.
Figure 3:
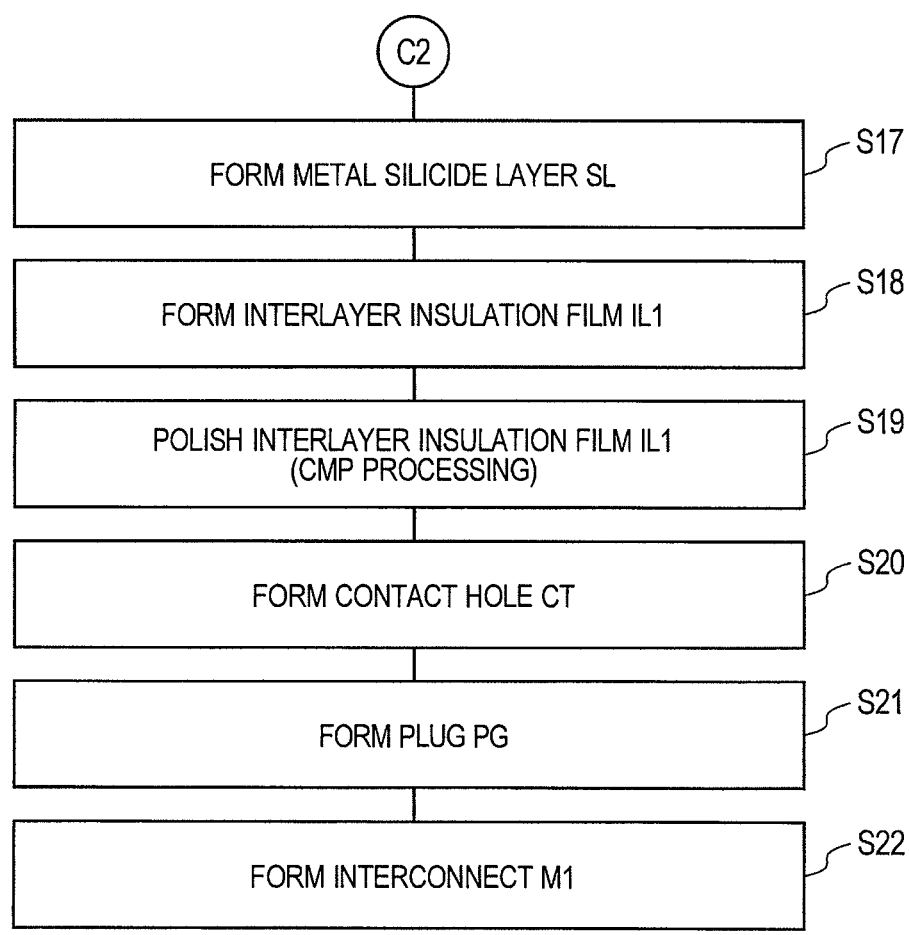
FIG. 3 is a process flow chart illustrating a portion of the manufacturing step of the semiconductor device as the preferred embodiment.
Figure 4:
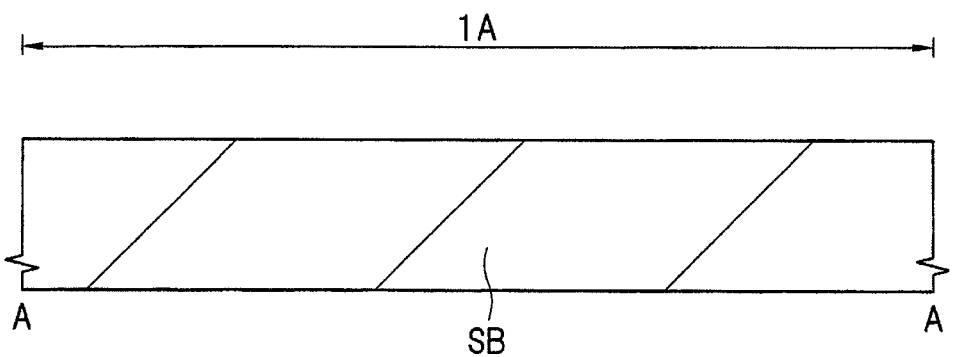
FIG. 4 is a fragmentary cross sectional view for a main portion of a semiconductor device during the manufacturing step thereof according to the embodiment of the present invention.
Figure 72:
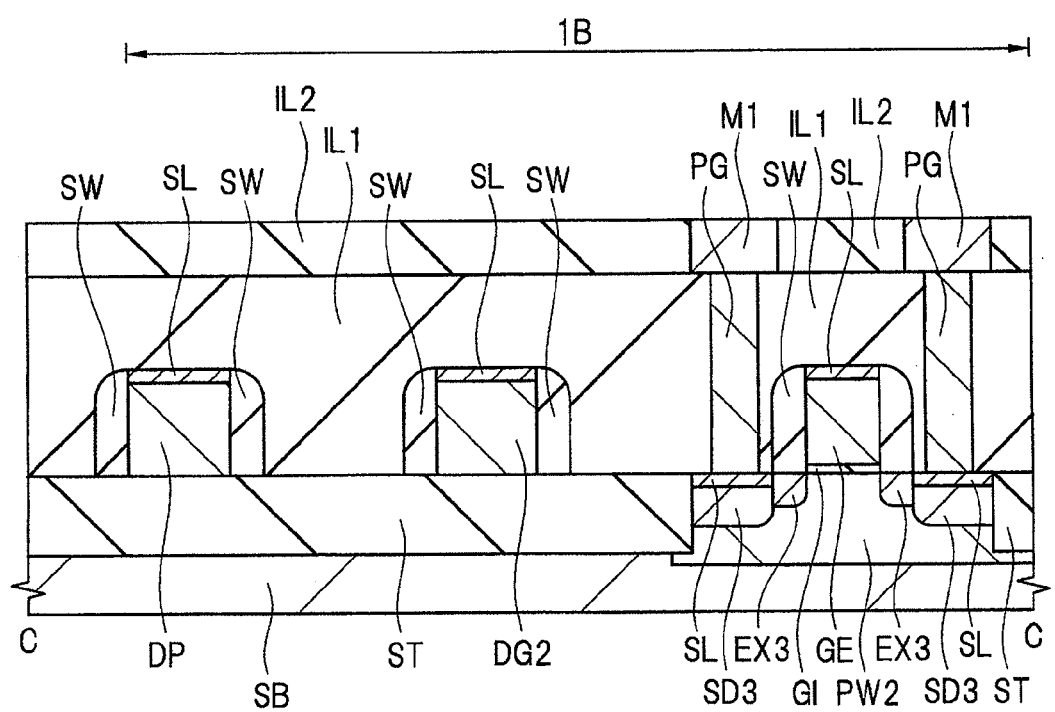
FIG. 72 is a fragmentary cross sectional view for a main portion of the semiconductor device identical with that of FIG. 70 during the manufacturing step thereof.

FIG. 1 to FIG. 3 are process flow charts illustrating a portion of the step of manufacturing a semiconductor device according to this embodiment. FIG. 4 to FIG. 72 are fragmentary cross sectional views or plan views each for a main portion of the semiconductor device during the manufacturing step according to this embodiment. In FIG. 4 to FIG. 72, FIG. 19 to FIG. 21, FIG. 37, FIG. 47, and FIG. 48 are plan views and others are cross sectional views.

FIG. 4, FIG. 7, FIG. 10, FIG. 13, FIG. 16, FIG. 22, FIG. 25, FIG. 28, FIG. 31, FIG. 34, FIG. 38, FIG. 41, FIG. 44, FIG. 49, FIG. 52, FIG. 55, FIG. 58, FIG. 61, FIG. 64, FIG. 67, and FIG. 70 substantially correspond to cross sectional views along line A-A shown in the plan views of FIG. 19 to FIG. 21, FIG. 37, FIG. 47, and FIG. 48. Accordingly, the cross sectional views (FIG. 4, etc.) illustrate a fragmentary cross sectional views for a main portion of a memory cell region 1A and illustrate a state where two memory cells (memory cells of a non-volatile memory) having a n$^+$-type semiconductor region SD2 in common are formed to the semiconductor substrate SB.

Further, FIG. 5, FIG. 8, FIG. 11, FIG. 14, FIG. 17, FIG. 23, FIG. 26, FIG. 29, FIG. 32, FIG. 35, FIG. 39, FIG. 42, FIG. 45, FIG. 50, FIG. 53, FIG. 56, FIG. 59, FIG. 62, FIG. 65, FIG. 68, and FIG. 71 substantially correspond to cross sectional views along line B-B shown in the plan views of FIG. 19 to FIG. 21, FIG. 37, FIG. 47, and FIG. 48. Accordingly, the cross sectional views (FIG. 6, etc.) each illustrate a fragmentary cross sectional views for a main portion of a peripheral circuit region 1B and the dummy forming region 1C and illustrate a state in which MISFET and a dummy gate electrode DG2 are formed in the peripheral circuit region 1B and the dummy gate electrode DG1 is formed in the dummy gate electrode forming region.

Further, FIG. 6, FIG. 9, FIG. 12, FIG. 15, FIG. 18, FIG. 24, FIG. 27, FIG. 30, FIG. 33, FIG. 36, FIG. 40, FIG. 43, FIG. 46, FIG. 51, FIG. 54, FIG. 57, FIG. 60, FIG. 63, FIG. 66, FIG. 69, and FIG. 72 substantially correspond to cross sectional views along line C-C shown in the plan views of FIG. 19 to FIG. 21, FIG. 37, FIG. 47 and FIG. 48. Accordingly, the cross sectional views (FIG. 6, etc.) show cross sectional views of the peripheral circuit region 1B, showing a state where the MISFET and the dummy gate electrodes DG2 are formed in the peripheral circuit region.

Further, FIG. 19 to FIG. 21, FIG. 37, FIG. 47, and FIG. 48 illustrate different stage of steps in an identical planar region which are hatched for the sake of easy understanding of the drawings although they are planar views. Specifically, a silicon film PS1 is hatched in FIG. 19, and a photoresist pattern PR1 is hatched in FIG. 20. Further, a silicon film pattern PS1 is hatched in FIG. 21. That is, a control gate electrode CG, a dummy gate electrode DG1, and a silicon film PS1a are hatched. Further, in FIG. 37, a memory gate electrode MG, a control gate electrode CG, a dummy gate electrode DG1, and a silicon film PS1a are hatched. Further, a photoresist pattern PR3 is hatched in FIG. 47, and a memory gate electrode MG, a control gate electrode CG, a gate electrode GE, dummy gate electrodes DG1 and DG2, and a dummy pattern DP are hatched in FIG. 48.

The memory cell region 1A is a region in which a memory cell of a non-volatile memory is to be formed in a semiconductor substrate SB (main surface thereof). Further, the peripheral circuit 1B is a region where a peripheral circuit is to be formed in the semiconductor substrate SB (main surface thereof). In the peripheral circuit region 1B, since the dummy gate electrode DG2 is formed, for example, in a vacant space or an outer peripheral region of the peripheral circuit, the peripheral circuit region 1B can be regarded as a region to form the peripheral circuit and the dummy gate electrode DG2 in the semiconductor substrate SB (main surface thereof). Further, a dummy forming region 1C is a region in which the dummy gate electrode DG1 is to be formed over the semiconductor substrate SB (main surface thereof). The memory cell region 1A, the peripheral circuit region 1B, and the dummy forming region 1C are present in an identical semiconductor substrate SB. That is, the memory cell region 1A, the peripheral circuit region 1B, and the dummy forming region 1C correspond to planar regions different from each other over the main surface of an identical semiconductor substrate SB.

The peripheral circuit is a circuit other than the non-volatile memory which includes, for example, a processor such as a CPU, a control circuit, a sense amplifier, a column decoder, a row decoder, and an input/output circuit. The MISFET formed in the peripheral circuit region 1B is a MISFET for the peripheral circuit.

In this embodiment, while description is to be made to a case of forming n-channel type MISFET (control transistor and memory transistor) in the memory cell region 1A, p-channel type MISFET (control transistor and memory transistor) can also be formed in the memory cell region 1A by reversing the conduction type. In the same Manner, in this embodiment, while description is to be made to a case of forming the n-channel type MISFET in the peripheral circuit region 1B, a p-channel type MISFET can also be formed in the peripheral circuit region 1B, or CMISFET (Complementary MISFET), etc. can also be formed in the peripheral circuit region by reversing the conduction type.

Figure 5:
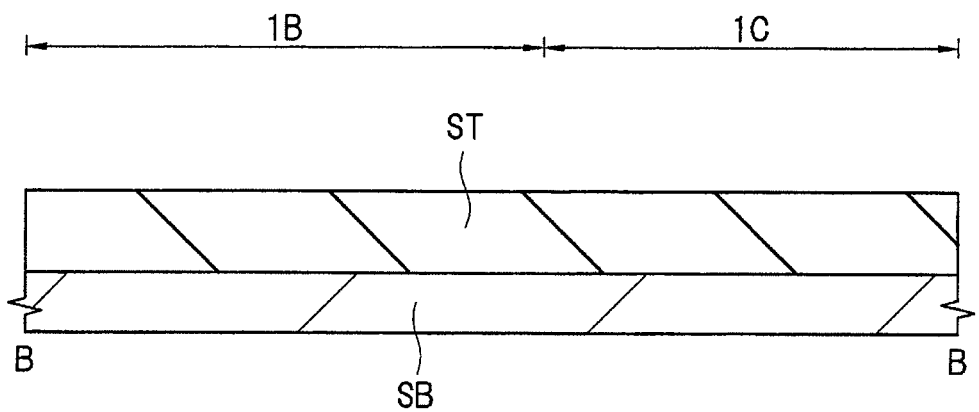
FIG. 5 is a fragmentary cross sectional view for a main portion of the semiconductor device identical with that of FIG. 4 during the manufacturing step thereof.
Figure 6:
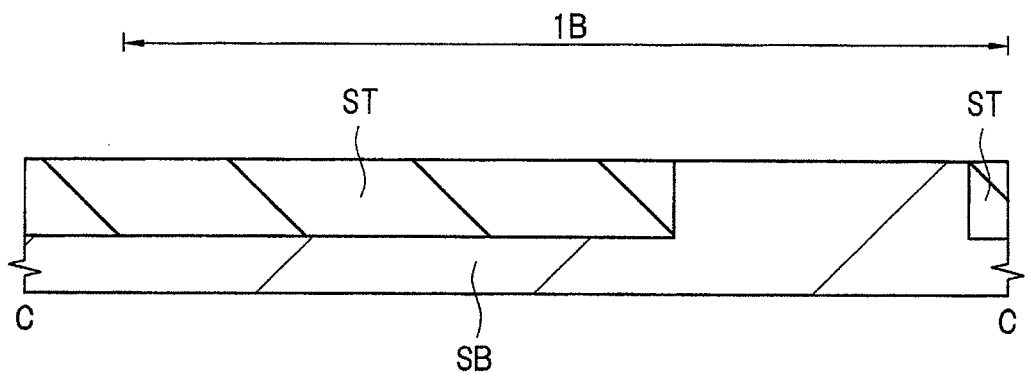
FIG. 6 is a fragmentary cross sectional view for a main portion of the semiconductor device identical with that of FIG. 4 during the manufacturing step thereof.

At first, as illustrated in FIG. 4 to FIG. 6, a semiconductor substrate (semiconductor wafer) SB comprising, for example, p-type single crystal silicon having a specific resistivity, for example, of about 1 to 10 Ωcm is provided (prepared) (step S1 in FIG. 1). Then, a device isolation region (inter-device isolation insulating region) ST for defining an active region is formed in the main surface of the semiconductor substrate SB (step S2 in FIG. 1).

The device isolation region ST comprises an insulator such as silicon oxide and can be formed, for example, by a STI (Shallow Trench Isolation) method or a LOCOS (Local Oxidization of Silicon) method. For example, after forming a trench for device isolation in the main surface of the semiconductor substrate SB, an insulation film comprising, for example, silicon oxide is filled in the trench for device isolation, thereby forming the device isolation region. More specifically, after forming the trench for device isolation in the main surface of the semiconductor substrate SB, an insulation film (for example, silicon oxide film) for forming the device isolation region is formed so as to fill the trench for device isolation. Then, by removing the insulation film (insulation film for forming the device isolation region) at the outside of the trench for device isolation, the device isolation region ST comprising the insulation film filled in the trench for device isolation can be formed.

Figure 7:
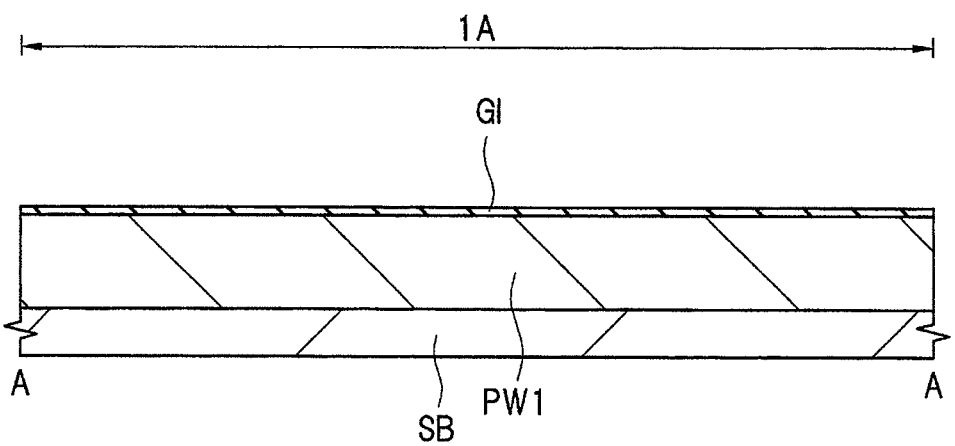
FIG. 7 is a fragmentary cross sectional view for a main portion of the semiconductor device succeeding to that of FIG. 4 during the manufacturing step thereof.
Figure 8:
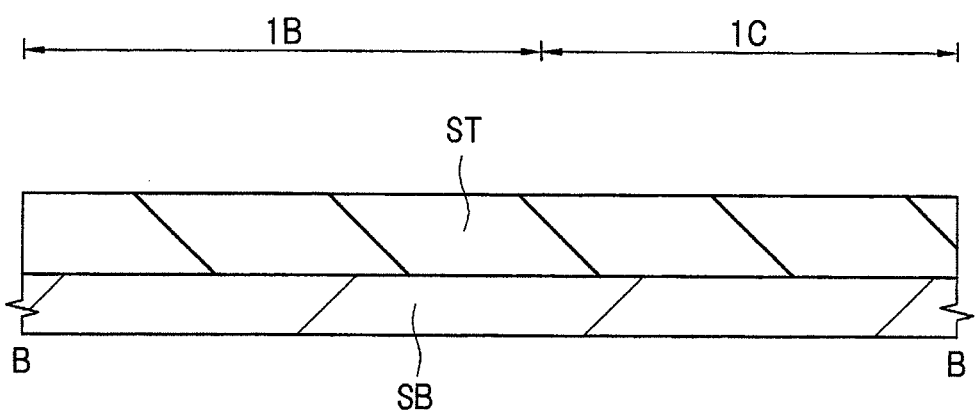
FIG. 8 is a fragmentary cross sectional view for a main portion of the semiconductor device identical with that of FIG. 7 during the manufacturing step thereof.
Figure 9:
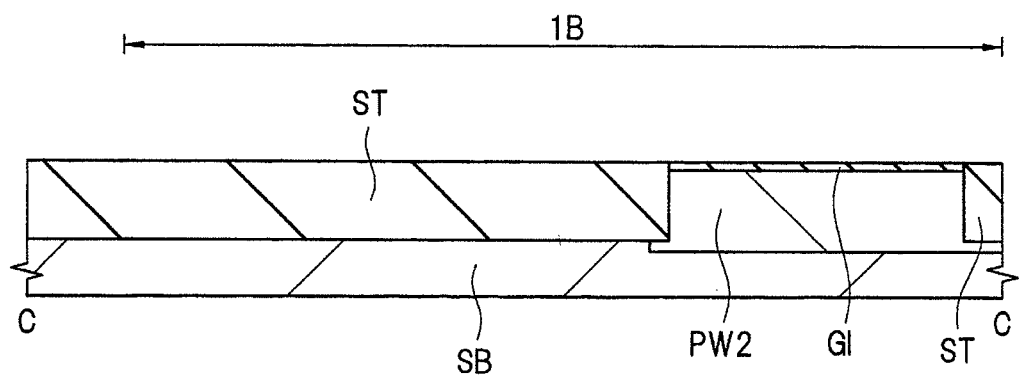
FIG. 9 is a fragmentary cross sectional view for a main portion of the semiconductor device identical with that of FIG. 7 during the manufacturing step thereof.

Then, as illustrated in FIG. 7 to FIG. 9, a p-type well PW1 is formed in the memory cell region 1A and a p-type well PW2 is formed in the peripheral circuit region 1B of the semiconductor substrate SB (step S3 in FIG. 1). The p-type wells PW1 and PW2 can be formed, for example, by ion implantation of p-type impurities, for example, boron (B) into the semiconductor substrate SB. The p-type wells PW1 and PW2 are formed for a predetermined depth from the main surface of the semiconductor substrate SB. Since the p-type well PW1 and the p-type well PW2 have an identical conduction type, they may be formed by an identical ion implantation step, or by different ion implantation steps.

Then, for controlling a threshold voltage of a control transistor formed subsequently in the memory cell region 1A, channel dope ions are implanted into the surface portion (surface layer portion) of the p-type well PW1 in the memory cell region 1A. Further, for controlling the threshold voltage of the n-channel type MISFET to be formed subsequently in the peripheral circuit region 1B, channel dope ions are implanted to the surface portion (surface layer portion) of the p-type well PW2 in the peripheral circuit region 1B.

Then, after cleaning the surface of the semiconductor substrate SB (p-type wells PW1, PW2) by cleaning with a diluted hydrofluoric acid, etc. an insulation film GI for a gate insulation film is formed over the main surface of the semiconductor substrate SB (surface of the p-type wells PW1, PW2) (step S4 in FIG. 1).

The insulation film GI can be formed, for example, of a thin silicon oxide film or silicon oxynitride film. When the insulation film GI is a silicon oxide film, the insulation film GI can be formed, for example, by a thermal oxidation method. Further, when the insulation film GI comprises a silicon oxynitride film, it can be formed by a method of forming a silicon oxide film by a high temperature short time oxidation method or a thermal oxidation method using, for example, $N_2O$, $O_2$, and $H_2$, and then applying a nitriding treatment in plasmas (plasma nitridation). The thickness of the insulation film GI to be formed can be, for example, 2 to 3 nm. When the insulation film GI is formed by the thermal oxidation method, the insulation film GI is not formed over the device isolation region ST.

In another configuration, the insulation film GI in the peripheral circuit region 1B can be formed by a step different from that of the insulation film GI in the memory cell region 1A.

Figure 10:
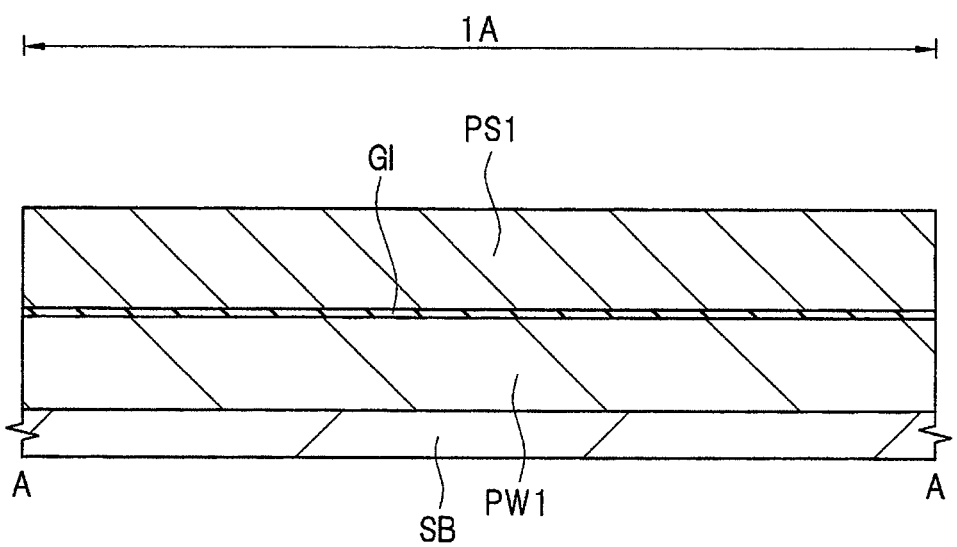
FIG. 10 is a fragmentary cross sectional view for a main portion of the semiconductor device during the manufacturing step thereof succeeding to that of FIG. 7.
Figure 11:
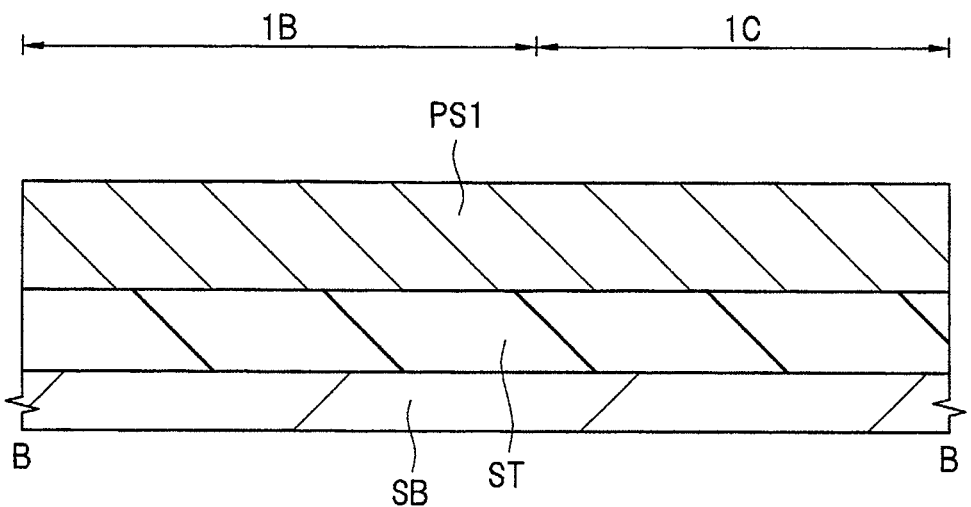
FIG. 11 is a fragmentary cross sectional view for a main portion of the semiconductor device identical with that of FIG. 10 during the manufacturing step thereof.
Figure 12:
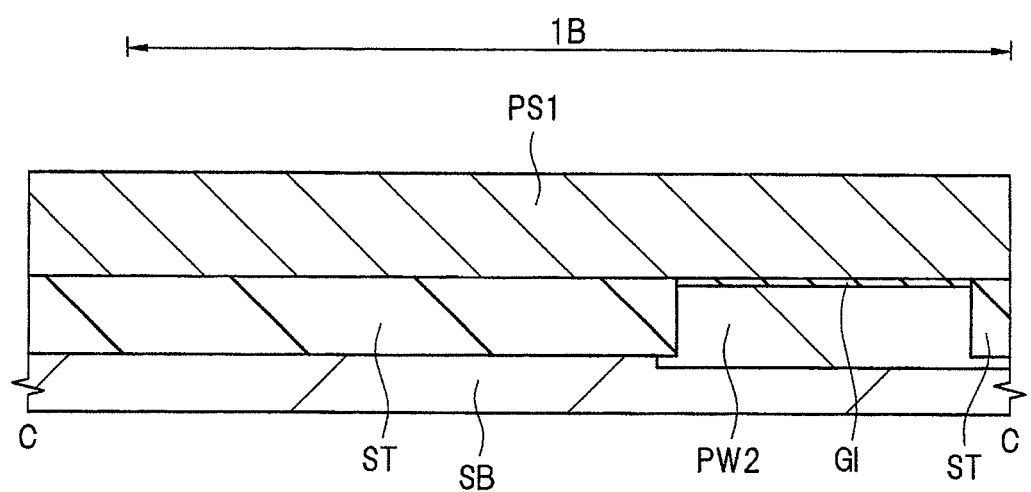
FIG. 12 is a fragmentary cross sectional view for a main portion of the semiconductor device identical with that of FIG. 10 during the manufacturing step thereof.

Then, as illustrated in FIG. 10 to FIG. 12, a silicon film PS1 is formed (deposited) as a conductive film for forming the control gate electrode CG (step S5 in FIG. 1).

The silicon film PS1 is a conductive film for the gate electrode of the control transistor, that is, a conductive film for forming the control gate electrode CG to be described later. Further, the silicon film PS1 also serves as a conductive film for forming the gate electrode (corresponding to the gate electrode GE to be described later) of the MISFET in the peripheral circuit region 1B. That is, the control gate electrode CG to be described later and the gate electrode GE to be described later are formed by the silicon film PS1.

The silicon film PS1 is formed over the entire main surface of the semiconductor substrate SB. Accordingly, the silicon film PS1 is formed over the insulation film GI in the memory cell region 1A and the peripheral circuit region 1B, as well as over the device isolation region ST.

The silicon film PS1 comprises a polycrystal silicon film (polysilicon film) and can be formed by using, for example, a CVD (Chemical Vapor Deposition) method. The deposition thickness of the silicon film PS1 can be, for example, of about 50 to 250 nm. The film can also be formed by forming the silicon film PS1 as an amorphous silicon film and then converting the amorphous silicon film into a polycrystal silicon film by a subsequent heat treatment.

After forming the silicon film PS1, a photoresist pattern (not illustrated) is formed over the silicon film PS1 by using photolithography. While the photoresist pattern is not illustrated, it is formed over the entire peripheral circuit region 1B. Then, n-type impurities are introduced into the silicon film PS1 in the memory cell region 1A by using the photoresist pattern as a mask by anion implantation method or the like thereby converting the silicon film PS1 in the memory cell region 1A into a n-type silicon film (doped polysilicon film). That is, the n-type impurities are introduced into the silicon film PS1 in the memory cell region 1A to convert the silicon film PS1 in the memory cell region 1A into the n-type silicon film which is introduced with the n-type impurities. Subsequently, the photoresist pattern is removed. When the n-type impurities are introduced into the silicon film PS1 in the memory cell region 1A by ion implantation, since the silicon film PS1 in the peripheral circuit region 1B is covered by the photoresist pattern, the impurities is not introduced therein.

Accordingly, when the silicon PS1 is formed as a non-doped (undoped) silicon film and then impurities is introduced into the silicon film PS1 is a memory cell region 1A by ion implantation, the silicon film PS1 in the peripheral circuit region 1B remains as a non-doped silicon film as it is. In this case, also the silicon film PS1a formed in a patterning step at a step S6 to be described later is a non-doped silicon film. However, since the impurities are introduced subsequently (preferably between step S11 and step S12 to be described later) into the silicon film PS1a by an ion implantation method, the gate electrode GE to be formed subsequently is formed by the silicon film introduced with the impurities. Further, since the dummy gate electrode DG1 to be formed subsequently does not function as the gate electrode of the transistor, impurities may or may not be introduced into the dummy gate electrode DG1. Accordingly, the impurities may not be introduced into the silicon film PS1 in the dummy forming region 1C.

Then, the silicon film PS1 is patterned by photolithography and etching technique to form a control gate electrode CG and a dummy electrode DG1 (step S6 in FIG. 1). The control gate electrode CG is formed in the memory cell region 1A, and the dummy gate electrode DG1 is formed in the dummy forming region 1C. The patterning step at the step S6 can be performed as described below.

Figure 13:
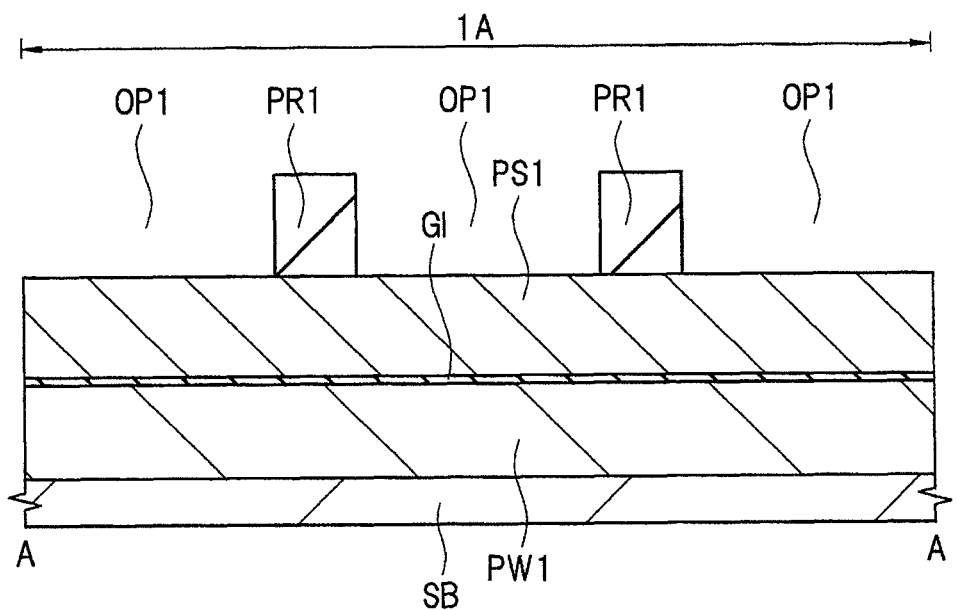
FIG. 13 is a fragmentary cross sectional view for a main portion of the semiconductor device during the manufacturing step thereof succeeding to that of FIG. 10.
Figure 14:
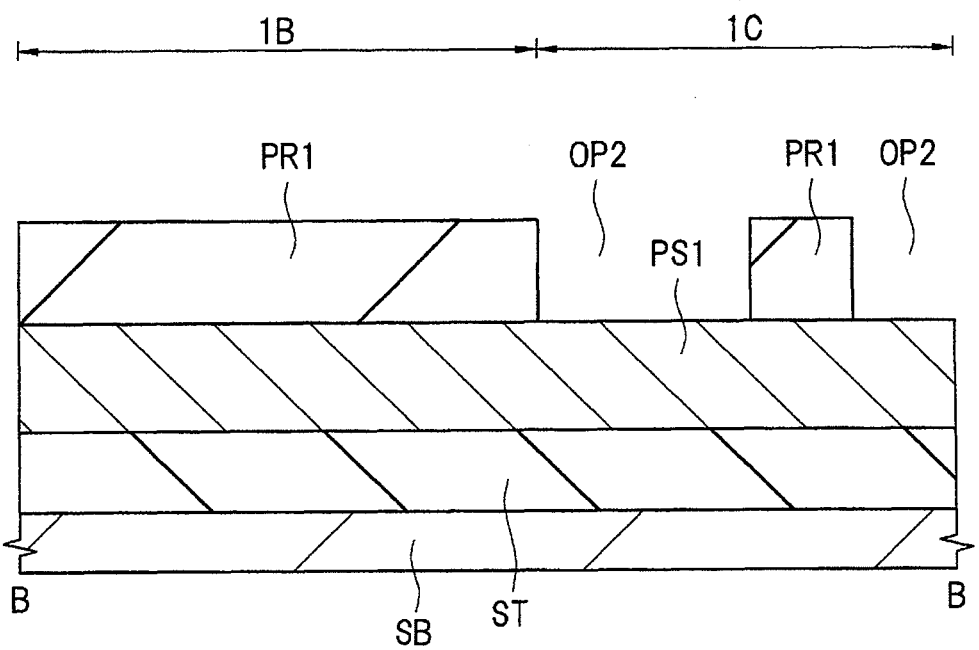
FIG. 14 is a fragmentary cross sectional view for a main portion of the semiconductor device identical with that of FIG. 13 during the manufacturing step thereof.
Figure 15:
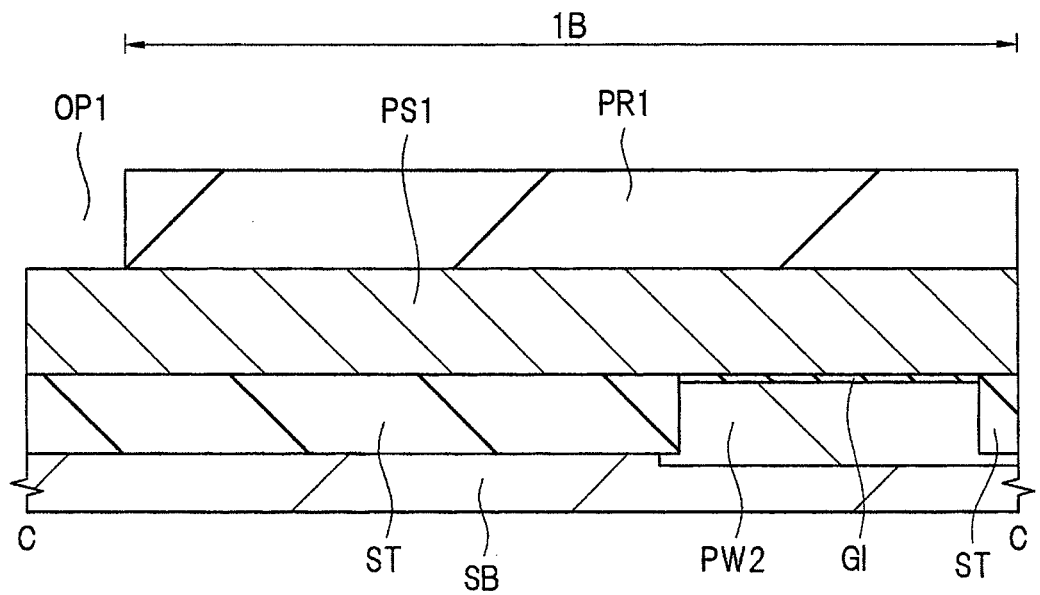
FIG. 15 is a fragmentary cross sectional view for a main portion of the semiconductor device identical with that of FIG. 13 during the manufacturing step thereof.
Figure 16:
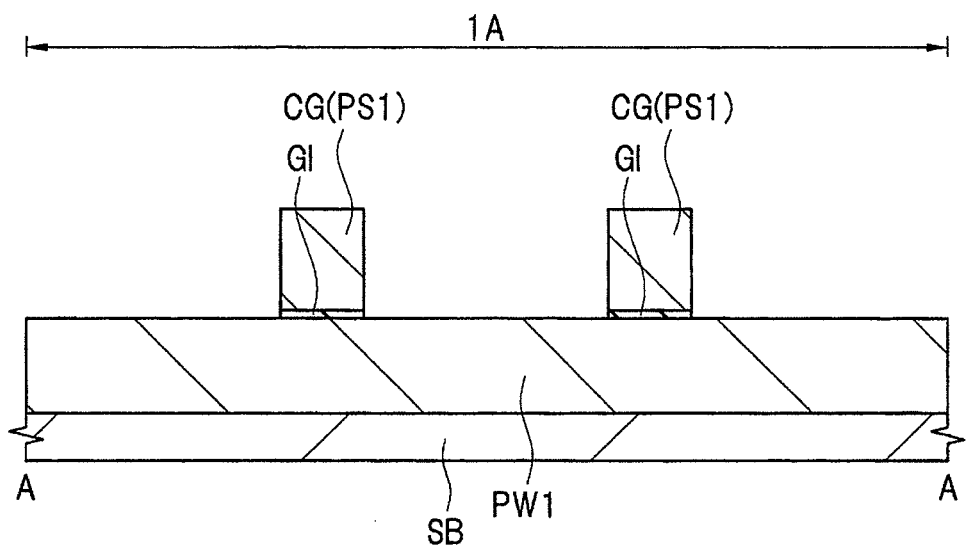
FIG. 16 is a fragmentary cross sectional view for a main portion of the semiconductor device during the manufacturing step thereof succeeding to that of FIG. 13.
Figure 17:
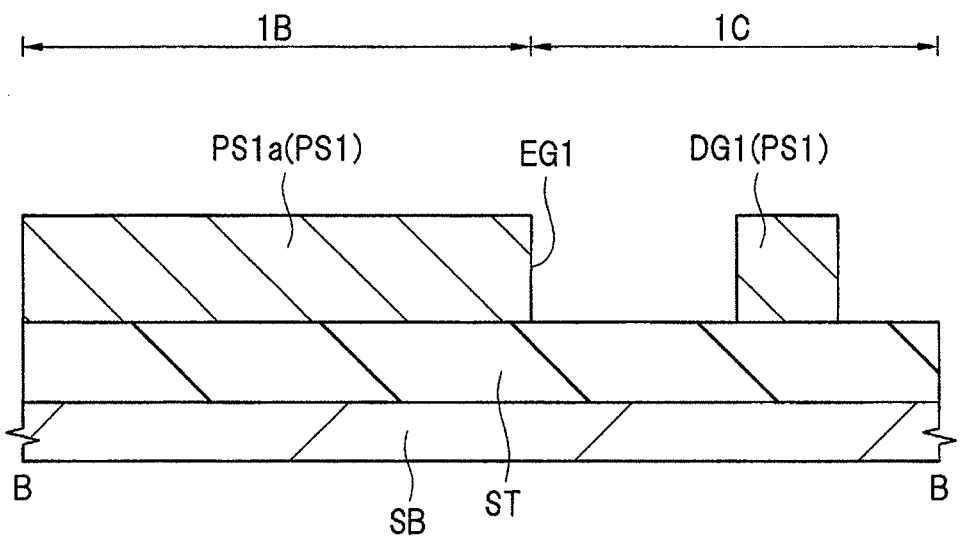
FIG. 17 is a fragmentary cross sectional view for a main portion of the semiconductor device identical with that of FIG. 16 during the manufacturing step thereof.
Figure 18:
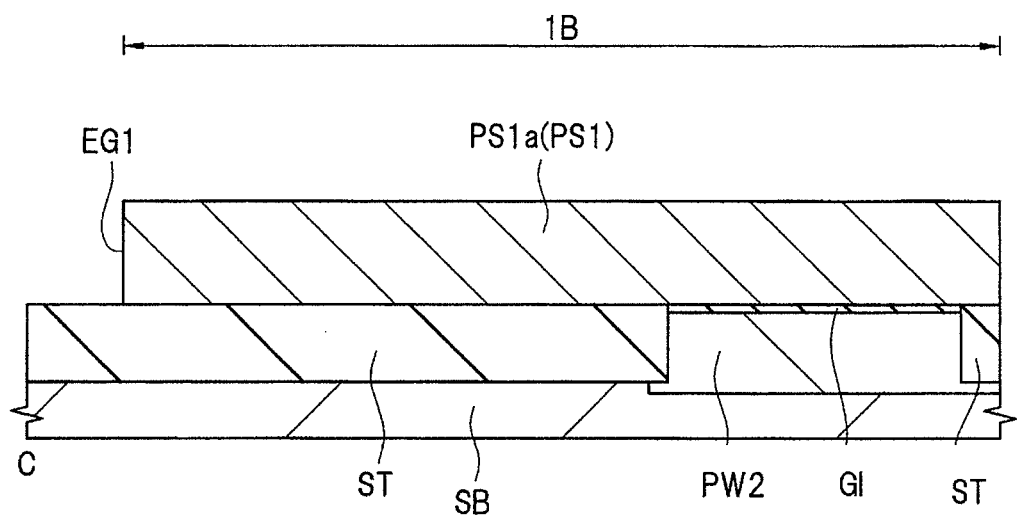
FIG. 18 is a fragmentary cross sectional view for a main portion of the semiconductor device identical with that of FIG. 16 during the manufacturing step thereof.

At first, as illustrated in FIG. 13 to FIG. 15, a photoresist pattern (resist pattern) PR1 is formed as a resist pattern over the silicon film PS1 by photolithography. Then, the silicon film PS1 is patterned by etching (preferably dry etching) by using the photoresist pattern PR1 as an etching mask. Then, the photoresist pattern PR1 is removed. Thus, a control gate electrode CG comprising the silicon film pattern PS1 and a dummy gate electrode DG1 comprising a silicon film pattern PS1 are formed as illustrated in FIG. 16 to FIG. 18.

Figure 19:
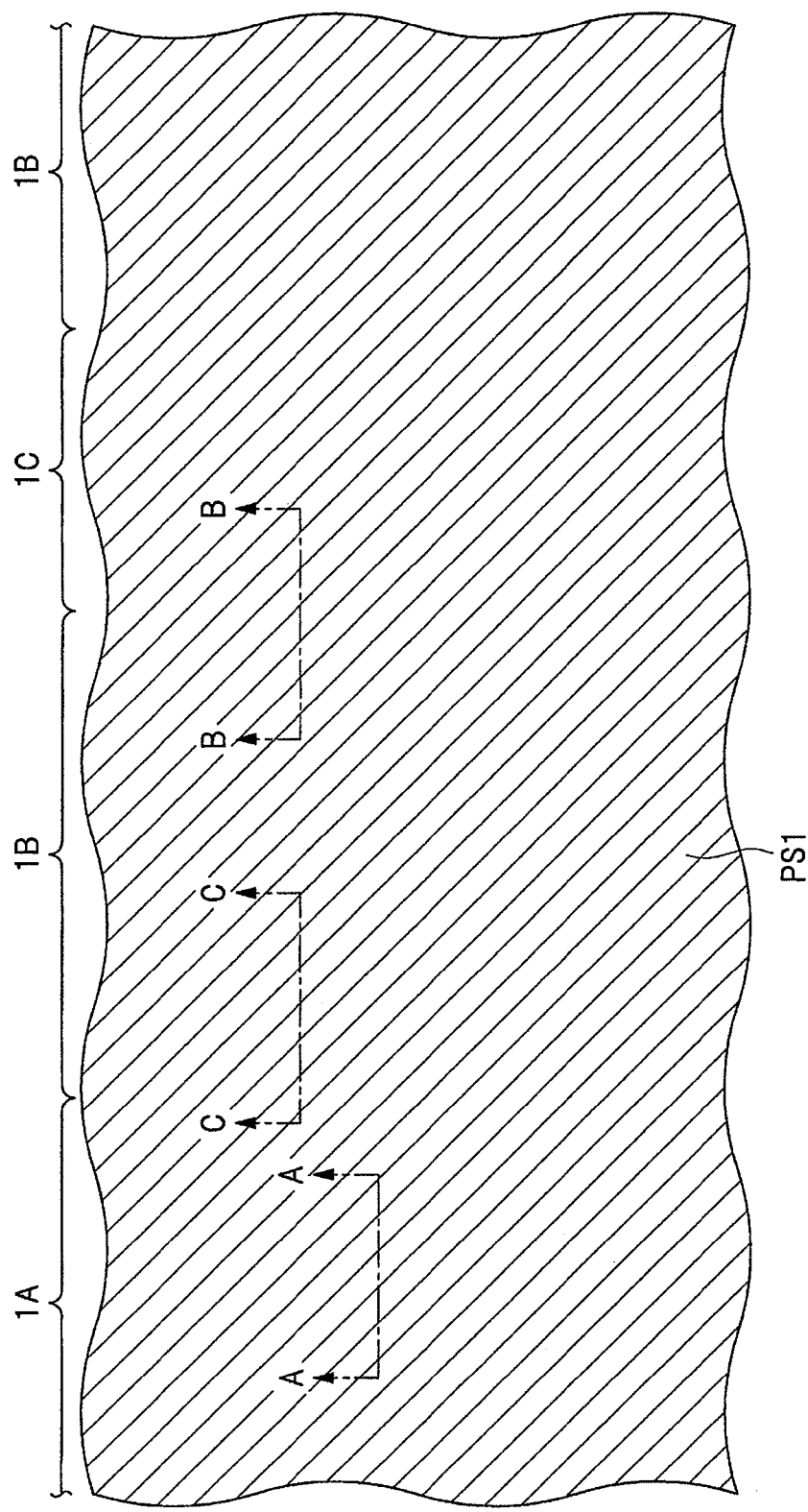
FIG. 19 is a fragmentary plan view for a main portion of the semiconductor device identical with that of FIG. 10 to FIG. 12 during the manufacturing step thereof.
Figure 20:
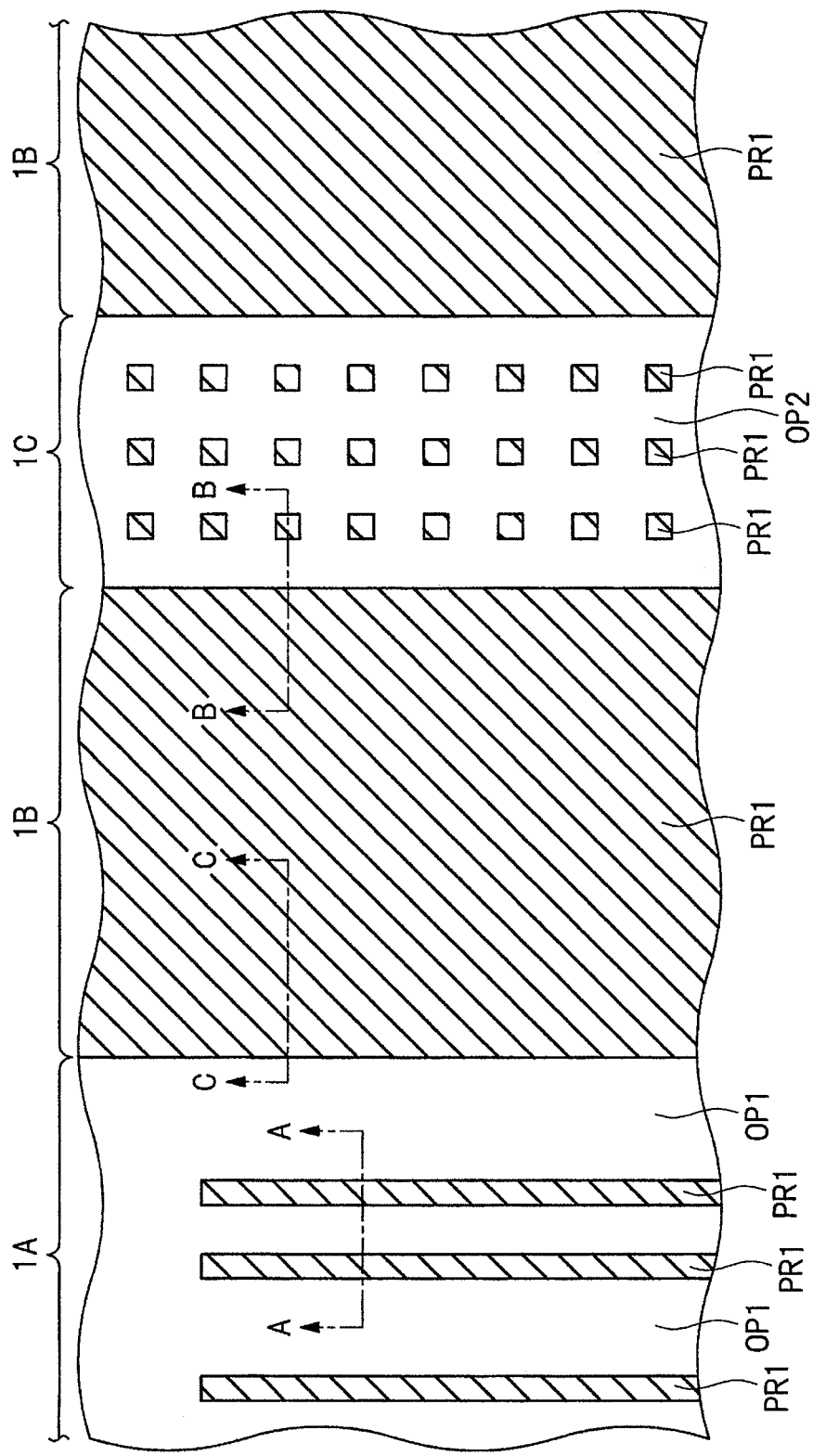
FIG. 20 is a fragmentary plan view for a main portion of the semiconductor device identical with that of FIG. 13 to FIG. 15 during the manufacturing step thereof.
Figure 21:
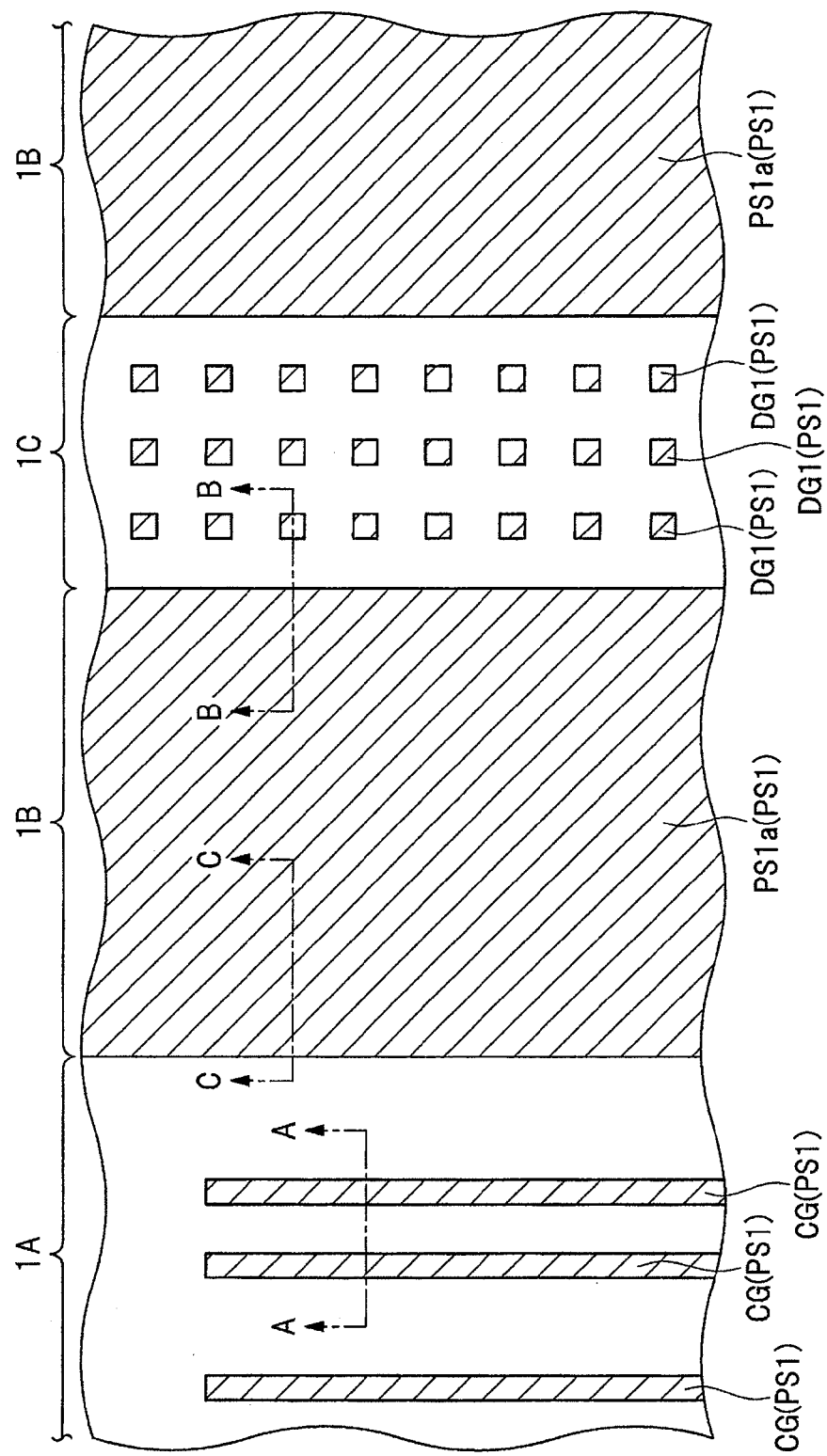
FIG. 21 is a fragmentary plan view for a main portion of the semiconductor device identical with that of FIG. 16 to FIG. 18 during the manufacturing step thereof.

FIG. 19 to FIG. 21 are plan views of different stage of steps in an identical planar region at the main surface of the semiconductor substrate SB. FIG. 19 illustrates a plan view at a stage of forming the silicon film PS1 at the step S5, FIG. 20 illustrates a plan view at a stage of forming a photoresist pattern PR1 at the step S6, and FIG. 21 illustrates a plan view at a stage of patterning the silicon film PS1 and then removing the photoresist pattern PR1 at the step S6.

The photoresist pattern PR1 has an opening OP1 for forming the control gate electrode CG in the memory cell region 1A and has an opening OP2 for forming the dummy gate electrode DG1 in a dummy forming region 1C. The opening OP1 is formed over the entire memory cell region 1A excepting a region in which the control gate electrode CG is to be formed and the opening OP2 is formed over the entire dummy forming region 1C excepting a region in which the dummy gate electrode DG1 is to be formed. The openings OP1 and OP2 are not formed in the peripheral circuit region 1B. At the step S6, the silicon film PS1 is patterned by selectively etching to remove a portion of the silicon film PS1 exposed from the openings OP1 and OP2. Accordingly, the silicon film PS1 patterned at the step S6 (hatched region in FIG. 21) has a planar shape (pattern) substantially identical with the photoresist pattern PR1 (hatched region in FIG. 20).

In the peripheral circuit region 1B, the photoresist pattern PR1 has been formed over the entire peripheral circuit region 1B. Therefore, the silicon film PS1 in the peripheral circuit region 1B has been entirely covered by the photoresist pattern PR1. Accordingly, in the peripheral circuit region 1B, the silicon film PS1 is not patterned at the step S6, and the entire silicon film PS1 remains unetched in the peripheral circuit region 1B. The silicon film PS1 remaining over the entire peripheral circuit region 1B carries a reference sign PS1*a* and is referred to as a silicon film (silicon film pattern or conductive film pattern) PS1*a*. The silicon film PS1*a* is formed over the entire peripheral circuit region 1B, but not formed in the memory cell region 1A and the dummy gate electrode DG1. The silicon film PS1*a* comprises a silicon film pattern PS1 and can be regarded also as a silicon film pattern (conductive film pattern). The silicon film PS1*a* is formed as a pattern of such a large area that covers the entire peripheral circuit region 1B.

On the other hand, in the memory cell region 1A, the photoresist pattern PR1 is formed selectively in a region in which the control gate electrode CG is to be formed and not formed in other region. Accordingly, in the memory cell region 1A, while the silicon film PS1 is covered by the photoresist pattern PR1 in the region in which the control gate electrode CG is to be formed but it not covered by the photoresist pattern PR1 and exposed in other regions. Accordingly, in the memory cell region 1A, the silicon film PS1 is patterned at the step S6 in which the control gate electrode CG is formed by the silicon film pattern PS1 and other silicon film PS1 is removed. That is, when the step S6 is performed, the silicon film PS1 other than the portion in which the control gate electrode CG is to be formed is removed in the memory cell region 1A. In the memory cell region 1A, while one or more control gate electrodes CG are formed in the memory cell region 1A, a plurality of control gate electrodes CG are actually formed in the memory cell region 1A.

In the dummy forming region 1C, the photoresist pattern PR1 is formed selectively to a region in which the dummy gate electrode DG1 is to be formed and not formed to other regions. Therefore, while the silicon film PS1 of the dummy forming region 1C has been covered by the photoresist pattern PR1, other regions has been exposed without being covered by the photoresist pattern PR1. Accordingly, at the step S6, the silicon film PS1 is patterned and the dummy gate DG1 is formed by the silicon film pattern PS1 and other portions of the silicon film PS1 are removed in the dummy forming region 1C. That is, when the step S6 is performed, the silicon film PS1 other than the portion in which the dummy gate electrode DG1 is to be formed is removed in the dummy forming region 1C. While one or more dummy gate electrode DG1 are formed in the dummy forming region 1C, a plurality of dummy gate electrodes DG1 are actually formed in the dummy forming region 1C.

At the main surface of the semiconductor substrate, the dummy forming region 1C is provided in one or more places and, more preferably, provided in a plurality of places. In each of the dummy forming regions 1C, one or more dummy gate electrodes DG1 are formed and the dummy gate electrodes DG1 are more preferably formed in plurality. The planar shape of each of the dummy gate electrodes DG1 can be, for example, in a rectangular shape.

In the memory cell region 1A, the control gate electrode CG comprising the silicon film pattern PS1 is formed and the control gate electrode CG is a gate electrode for a control transistor. In the memory cell region 1A, the insulation film GI remaining below the control gate electrode CG is a gate insulation film of the control transistor. Accordingly, in the memory cell region 1A, the control gate electrode CG comprising the silicon film PS1 is formed over the semiconductor substrate SB (p-type well PW1) by way of the insulation film GI as a gate insulation film.

In the memory cell region 1A, the insulation film GI other than the portion covered by the control gate electrode CG, that is, the insulation film GI other than the portion as the gate insulation film can be removed by dry etching performed in the patterning step or by wet etching performed after the dry etching at the step S6.

In the semiconductor substrate SB, when the device isolation region ST is formed over the entire dummy forming region 1C, the dummy gate electrode DG1 is formed over the device isolation region ST. FIG. 17 illustrates a state where the dummy gate electrode DG1 is formed over the device isolation region ST. In another configuration, it is also possible not to form the device isolation region ST partially or entirely to the dummy forming region 1C. In this case, the dummy gate electrode DG1 is formed not over the device isolation region ST but over the substrate region of the semiconductor substrate SB (Si substrate region) by way of the insulation film GI.

The side wall (side surface) EG1 of the silicon film PS1*a* is preferably situated over the device isolation region ST. Thus, the active region of the peripheral circuit region 1B (active region defined by the device isolation region ST) is covered by the silicon film PS1*a*. Thus, the substrate region of the semiconductor substrate SB (Si substrate region) in the peripheral circuit region 1B can be prevented from undergoing unnecessary etching.

As described above, the control gate electrode CG, the dummy gate electrode DG1, and the silicon film PS1a are formed at the step S6. The step S6 can be regarded as a step of forming the control gate electrode CG, the dummy gate electrode DG1, and the silicon film (silicon film pattern) PS1a by patterning the silicon film PS1.

Then, for controlling a threshold voltage of a memory transistor formed subsequently in the memory cell region 1A, channel dope ions are optionally implanted into the surface portion (surface layer portion) of the p-type well PW1 in the memory cell region 1A.

Figure 22:
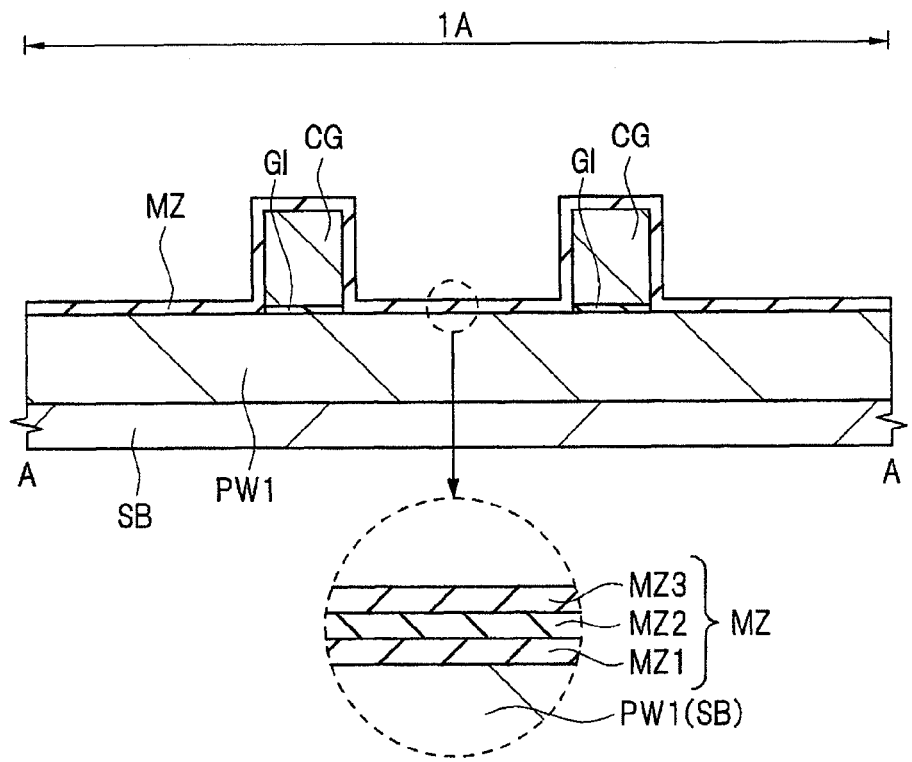
FIG. 22 is a fragmentary cross sectional view for a main portion of the semiconductor device during the manufacturing step thereof succeeding to that of FIG. 16.
Figure 23:
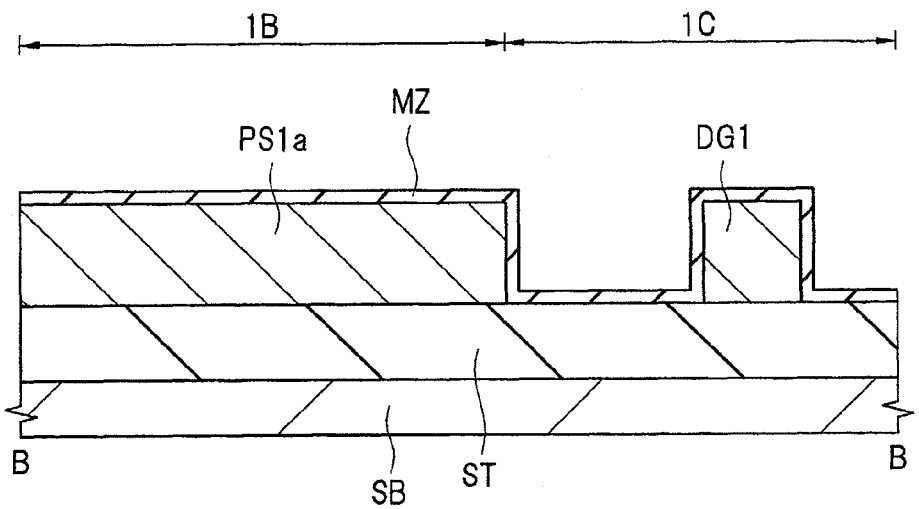
FIG. 23 is a fragmentary cross sectional view for a main portion of the semiconductor device identical with that of FIG. 22 during the manufacturing step thereof.
Figure 24:
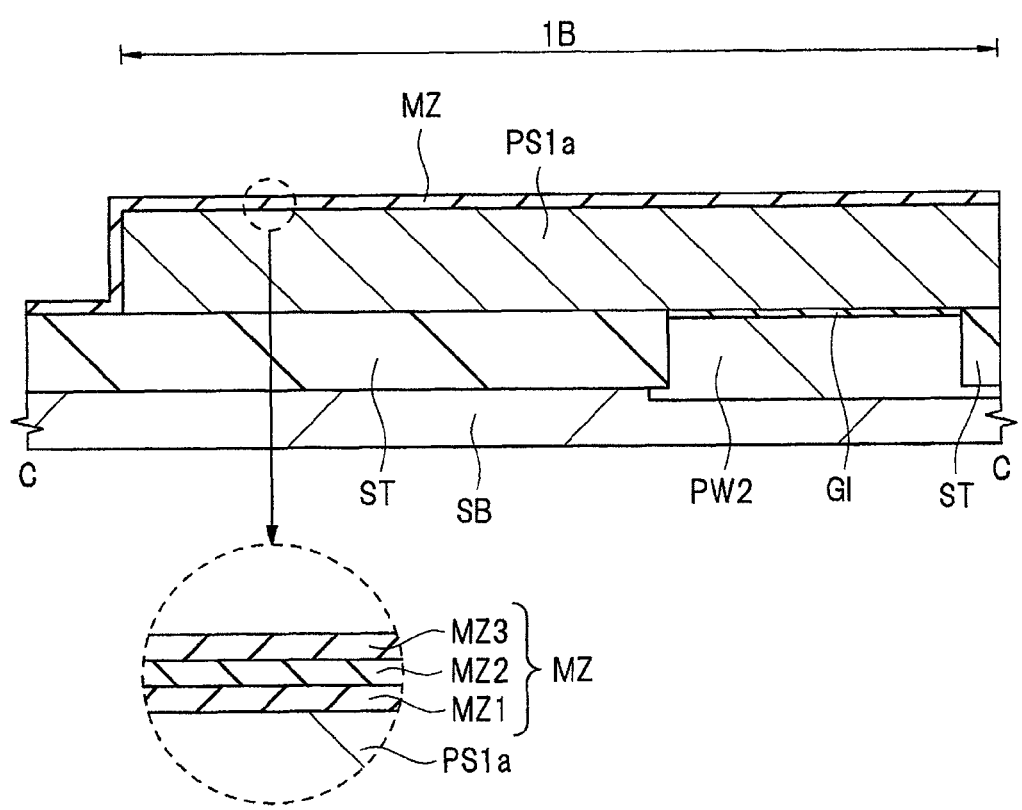
FIG. 24 is a fragmentary cross sectional view for a main portion of the semiconductor device identical with that of FIG. 22 during the manufacturing step thereof.

Then, after applying a cleaning treatment to the main surface of the semiconductor substrate SB by a washing treatment, an insulation film MZ for a gate insulation film of a memory transistor is formed over the entire main surface of the semiconductor substrate SB, that is, over the main surface (surface) of the semiconductor substrate SB and over the surface of the control gate electrode CG (upper surface and the side surface) as illustrated in FIG. 22 to FIG. 24 (step S7 in FIG. 1).

In the peripheral circuit region 1B, since the silicon film PS1a remains, the insulation film MZ is formed also over the surface of the silicon film PS1a (upper surface and side surface). Further, since the dummy gate electrode DG1 is formed in the dummy forming region 1C, the insulation film M2 is formed also on the surface (upper surface and the side surface) of the dummy gate electrode DG1. Accordingly, at a step S7, the insulation film MZ is formed over the semiconductor substrate SB so as to cover the control gate electrode CG in the memory cell region 1A, the silicon film PS1a in the peripheral circuit region 1B, and the dummy gate electrode DG1 in the dummy forming region 1C.

The insulation film MZ is an insulation film for a gate insulation film of the memory transistor and this is an insulation film having a charge accumulation portion in the inside. The insulation film MZ comprises a lamination film of a silicon oxide film (oxide film) MZ1, a silicon nitride film (nitride film) MZ2 formed on the silicon oxide film MZ1, and a silicon oxide film (oxide film) MZ3 formed on the silicon nitride film MZ2. The lamination film of the silicon oxide film MZ1, the silicon nitride film MZ2, and the silicon oxide film MZ3 can be regarded also as an ONO (oxide-nitride-oxide) film.

For easy understanding of the drawings, the insulation film MZ comprising the silicon oxide film MZ1, the silicon nitride film MZ2, and the silicon oxide film MZ3 is illustrated merely as an insulation film MZ in FIG. 22 to FIG. 24. Actually, the insulation film MZ comprises the silicon oxide film MZ1, the silicon nitride film MZ2, and the silicon oxide film MZ3 as shown in an enlarged view for a region surrounded by a dotted circle in FIG. 22 to FIG. 24.

The silicon oxide films MZ1 and MZ3 of the insulation film MZ can be formed, for example, by an oxidation treatment (thermal oxidation treatment), a CVD method, or a combination thereof. For the oxidation treatment in this step, ISSG (In Situ Steam Generation) oxidation can also be used. The silicon nitride film MZ2 of the insulation film MZ can be formed, for example, by a CVD method.

In this embodiment, the silicon nitride film MZ2 is formed as an insulation film having a trapping level (charge accumulation layer). While the silicon nitride film is suitable in view of reliability or the like, this is not restricted to the silicon nitride film but a high dielectric film having a dielectric constant higher than that of the silicon nitride film such as an aluminum oxide (alumina) film, a hafnium oxide film, or a tantalum oxide film can also be used as a charge accumulation layer or a charge accumulation portion. Further, the charge accumulation layer or the charge accumulation portion can also be formed by silicon nano-dots.

For example, for forming the insulation film MZ after forming the silicon oxide film MZ1 by a thermal oxidation method (preferably ISSG oxidation), the silicon nitride film MZ2 is deposited on the silicon oxide film MZ1 by a CVD method and, further, the silicon oxide film MZ3 is formed on, the silicon nitride film MZ2 by a CVD method, a thermal oxidation method, or both of the methods. Thus, the insulation film MZ comprising the lamination film of the silicon oxide film MZ1, the silicon nitride film MZ2, and the silicon oxide film MZ3 can be formed.

The thickness of the silicon oxide film MZ1 can be, for example, about 2 to 10 nm, the thickness of the silicon nitride film MZ2 can be, for example, about 5 to 15 nm, and the thickness of the silicon oxide film MZ3 can be, for example, about 2 to 10 nm. The last oxide film, that is, the silicon oxide film MZ3 at the uppemost layer of the insulation film MZ can be formed as a high voltage resistant film, for example, by oxidizing the upper layer portion of the nitride film (silicon nitride film MZ2 as an intermediate layer of the insulation film MZ).

The insulation film MZ functions as a gate insulation film of a memory gate electrode MG to be formed subsequently and has a charge holding (charge accumulation) function. Accordingly, the insulation film MZ has a lamination structure comprising at least three layers so that the insulation film can function as a gate insulation film having a charge holding function of the memory transistor, in which the potential barrier height of the inner layer (silicon nitride film MZ2) that functions as the charge accumulation portion is lower than the potential barrier height of the outer layer (silicon oxide films MZ1, MZ3) that function as charge blocking layer. This can be attained by forming the insulation film MZ as a lamination film having the silicon oxide film MZ1, the silicon nitride film MZ2 on the silicon oxide film MZ1, and the silicon oxide film MZ3 on the silicon nitride film MZ2 as in this embodiment.

Figure 25:
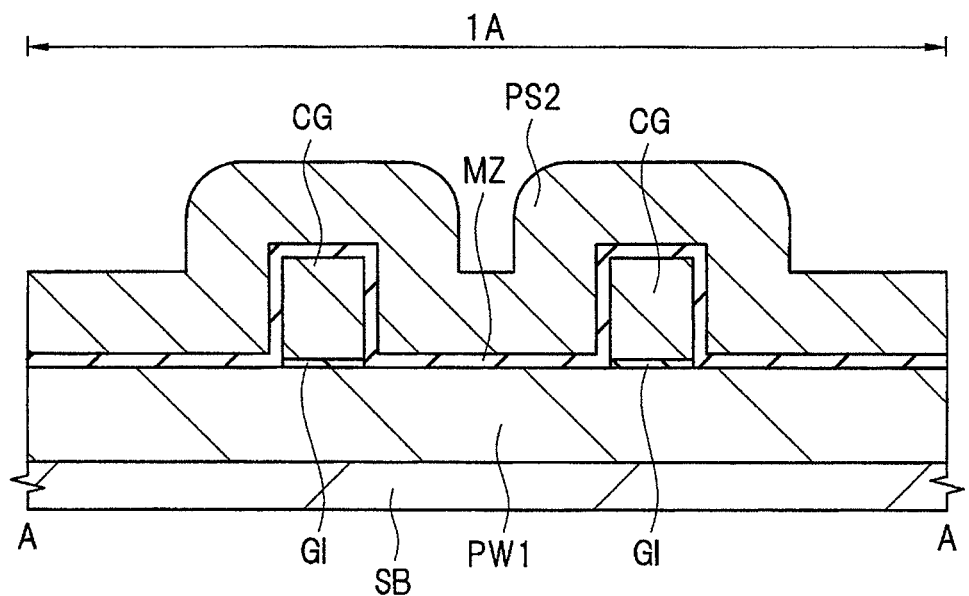
FIG. 25 is a fragmentary cross sectional view for a main portion of the semiconductor device during the manufacturing step thereof succeeding to that of FIG. 22.
Figure 26:
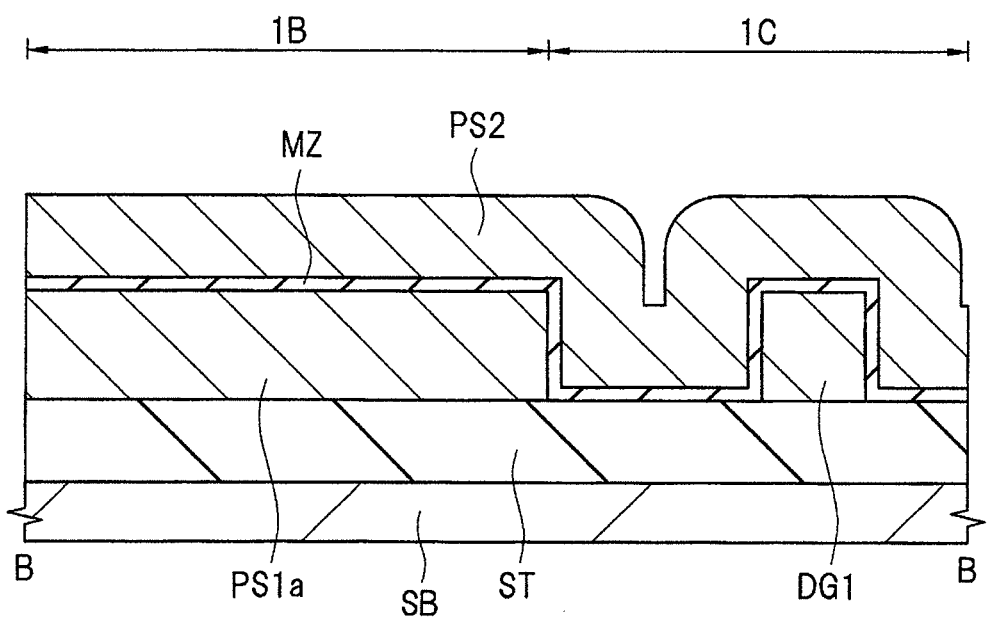
FIG. 26 is a fragmentary cross sectional view for a main portion of the semiconductor device identical with that of FIG. 25 during the manufacturing step thereof.
Figure 27:
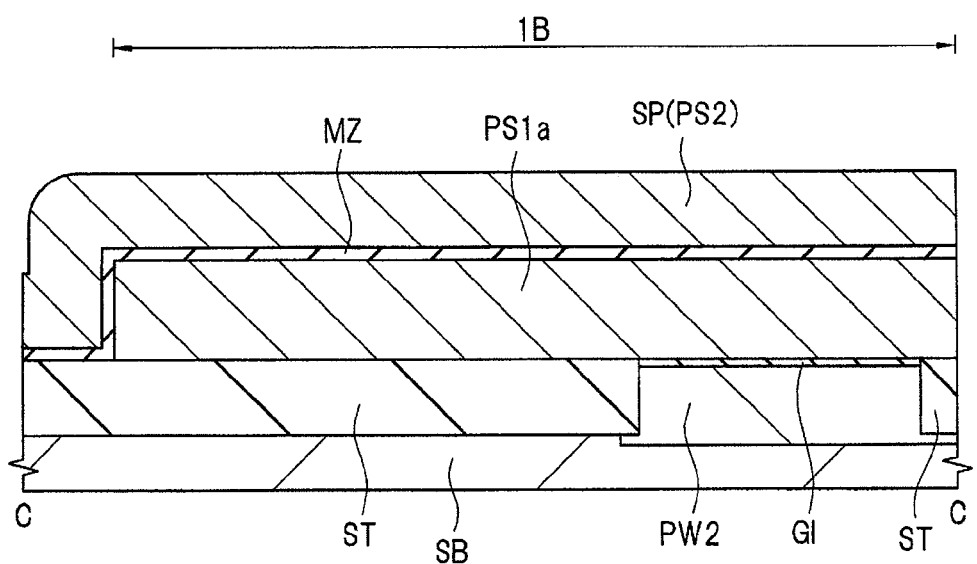
FIG. 27 is a fragmentary cross sectional view for a main portion of the semiconductor device identical with that of FIG. 25 during the manufacturing step thereof.

Then, as illustrated in FIG. 25 to FIG. 27, a silicon film PS2 is formed (deposited) as a conductive film for forming a memory gate electrode MG over the main surface (entire main surface) of the semiconductor substrate SB, that is, over the insulation film MZ (step S8 in FIG. 1). At the step S8, the silicon film PS2 is formed so as to cover the control gate electrode CG in the memory cell region 1A, cover the silicon film PS1a in the peripheral circuit region 1B, and cover the dummy gate electrode DG1 in the dummy forming region 1C.

The silicon film PS2 is a conductive film for the gate electrode of the memory transistor, that is, a conductive film for forming the memory gate electrode MG to be described later. The silicon film PS2 comprises a polycrystal silicon film and can be formed by using a CVD method or the like. The deposition thickness of the silicon film PS2 can be, for example, about 30 to 150 nm. Alternatively, after forming the silicon film PS2 as an amorphous silicon film in the film formation, the amorphous silicon film can be converted into a polycrystal silicon film by a subsequent heat treatment.

The silicon film PS2 is formed as a semiconductor film of low resistance by introducing impurities during film formation or by ion implantation of impurities after film formation (doped polysilicon film). The silicon film PS2 is an n-type silicon film preferably introduced with n-impurities such as phosphorus (P) or arsenic (As). When the n-impurities are introduced upon formation of the silicon film PS2, a silicon film PS2 introduced with the n-impurities can be formed by incorporating a doping gas (gas used for addition of n-impurities) to a gas for forming the silicon film PS2. While the n-impurities are preferably introduced to the silicon film PS2 in the memory cell region 1A, since the silicon film PS2 in the peripheral circuit region 1B and the dummy forming region 1C is removed subsequently, the n-impurities may or may not be introduced.

Figure 28:
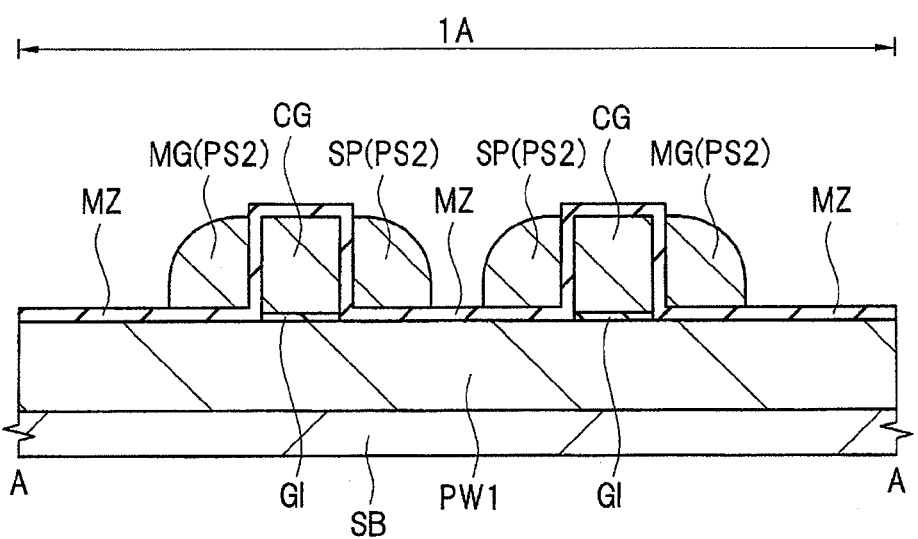
FIG. 28 is a fragmentary cross sectional view for a main portion of the semiconductor device during the manufacturing step thereof succeeding to that of FIG. 25.
Figure 29:
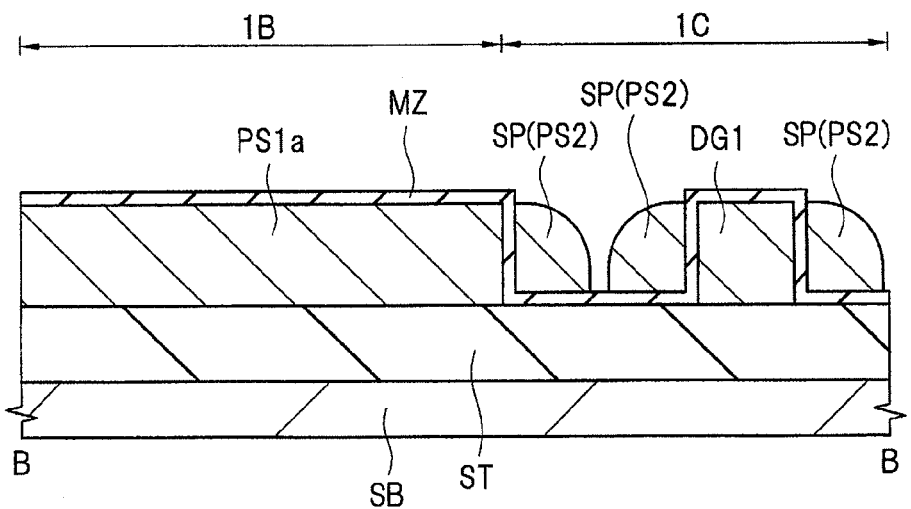
FIG. 29 is a fragmentary cross sectional view for a main portion of the semiconductor device identical with that of FIG. 28 during the manufacturing step thereof.
Figure 30:
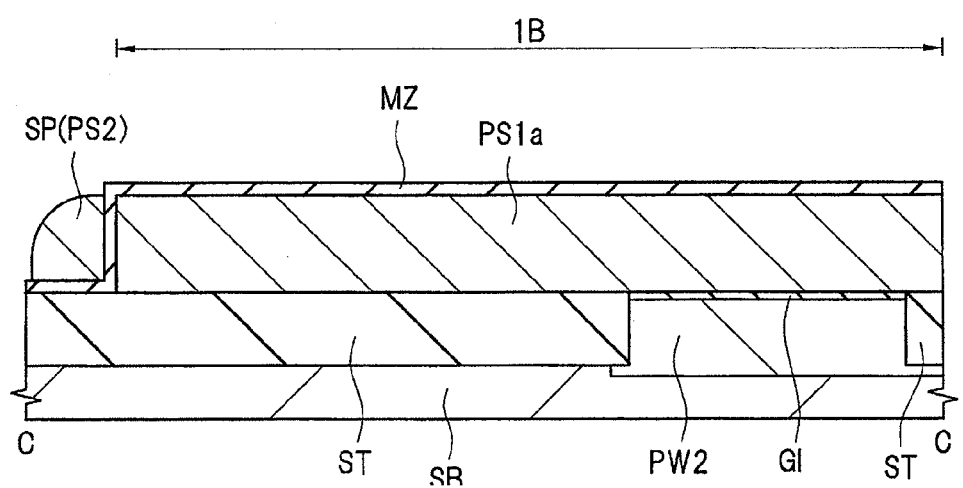
FIG. 30 is a fragmentary cross sectional view for a main portion of the semiconductor device identical with that of FIG. 28 during the manufacturing step thereof.

Then, by etching back the silicon film PS2 by an anisotropic etching technique (etching, dry etching, anisotropic etching), a memory gate electrode MG and a silicon spacer SP are formed as illustrated in FIG. 28 to FIG. 30 (step S9 in FIG. 2).

In the etching back step at the step S9, the silicon film PS2 is anisotropically etched (etched back) by so much as the deposition thickness of the silicon film PS2, thereby leaving the silicon film PS2 in the form of a side wall spacer on both side walls of the control gate electrode CG (by way of insulation film MZ) and removing the silicon film PS2 in other regions. Thus, as illustrated in FIG. 28, in the memory cell region 1A, a memory gate electrode MG is formed by the silicon film PS2 remaining in the form of the side wall spacer on one of both side walls of the control gate electrode CG by way of the insulation film MZ, and a silicon spacer SP is formed by the silicon film PS2 remaining in the form of the side wall spacer on the other of the side walls by way of the insulation film MZ. The memory gate electrode MG is formed over the insulation film MZ so as to be adjacent to the control gate electrode CG by way of the insulation film MZ.

The silicon spacer SP can be regarded also as a side wall spacer comprising an electric conductor, that is, as a conductor spacer. The memory gate electrode MG and the silicon spacer SP are formed on the side walls of the control gate electrode CG opposite to each other and have a substantially symmetrical structure with the control gate electrode CG being put therebetween. Further, the silicon spacer SP is formed each by way of the insulation film MZ also on the side wall of the silicon film PS1a remaining in the peripheral circuit region 1B and on the side wall of the dummy gate electrode DG1 formed in the dummy forming region 1C.

By performing the etching back step for the silicon film PS2 at the step S9, the insulation film MZ in a region not covered by the memory gate electrode MG and the silicon spacer SP is exposed. The insulation film MZ is interposed between the memory gate electrode MG and the semiconductor substrate SB (p-type well PW1) and between the memory gate electrode MG and the control gate electrode CG. The insulation film MZ below the memory gate electrode MG in the memory cell region 1A forms a gate insulation film of the memory transistor. A memory gate length, that is, a gate length of the memory gate electrode MG can be controlled by controlling the deposition thickness of the silicon film PS2 deposited at the step S8.

Then, the silicon spacer SP is removed (step S10 in FIG. 2).

Figure 31:
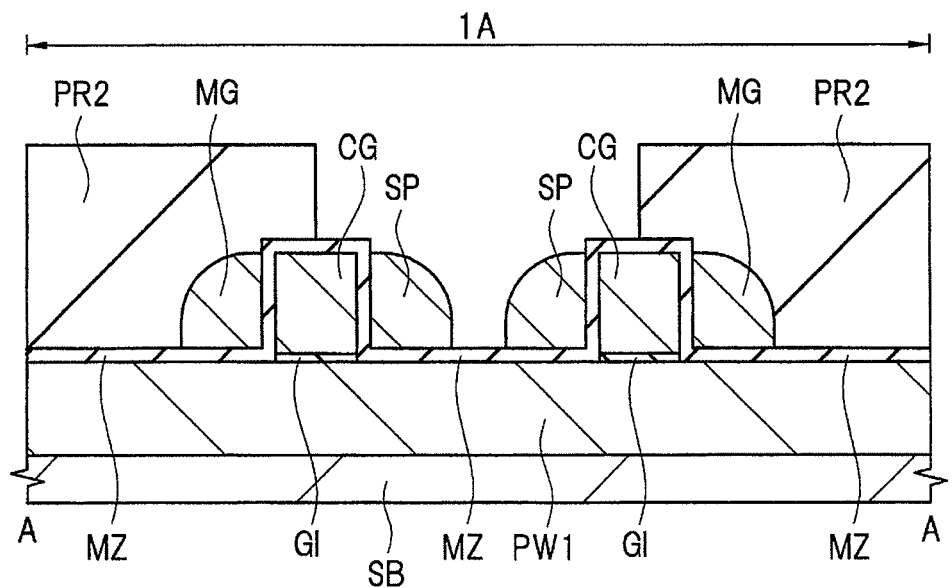
FIG. 31 is a fragmentary cross sectional view for a main portion of the semiconductor device during the manufacturing step thereof succeeding to that of FIG. 28.
Figure 32:
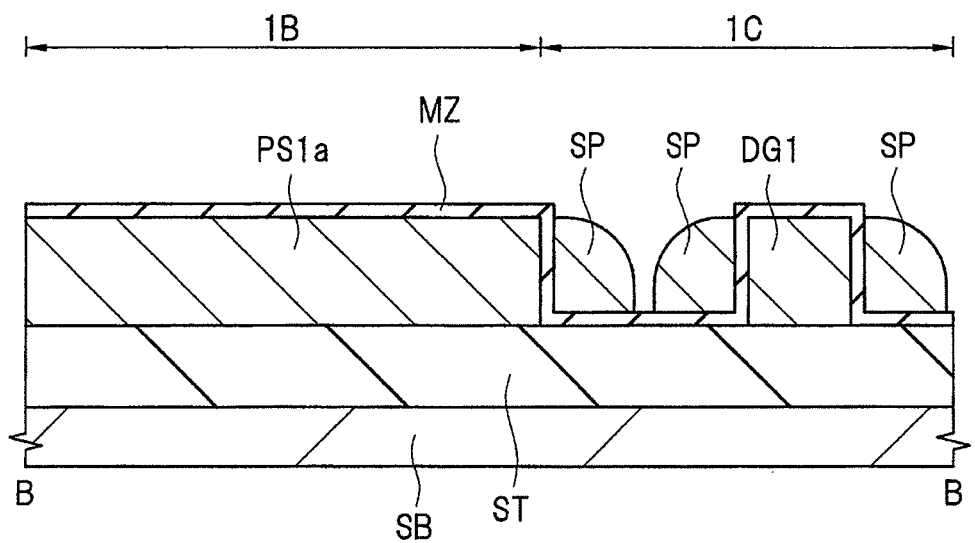
FIG. 32 is a fragmentary cross sectional view for a main portion of the semiconductor device identical with that of FIG. 31 during the manufacturing step thereof.
Figure 33:
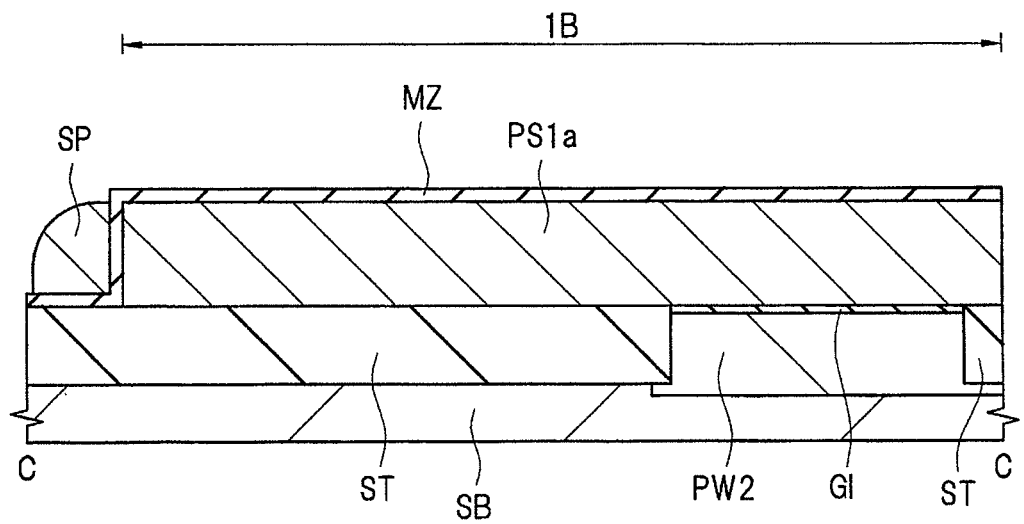
FIG. 33 is a fragmentary cross sectional view for a main portion of the semiconductor device identical with that of FIG. 31 during the manufacturing step thereof.
Figure 34:
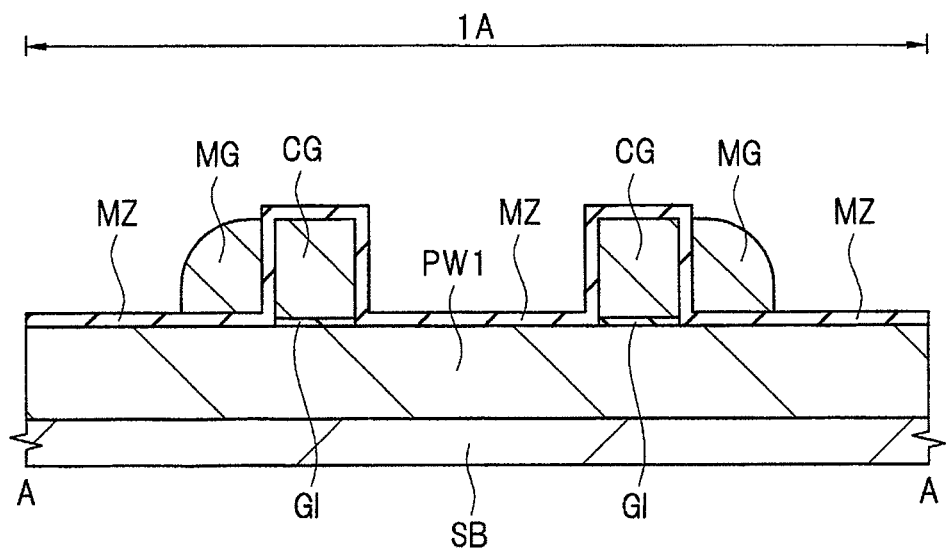
FIG. 34 is a fragmentary cross sectional view for a main portion of the semiconductor device during the manufacturing step thereof succeeding to that of FIG. 31.
Figure 35:
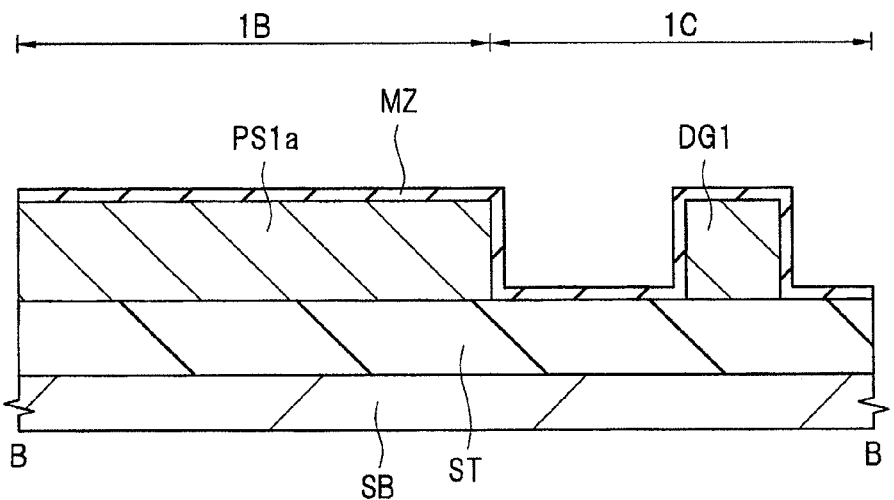
FIG. 35 is a fragmentary cross sectional view for a main portion of the semiconductor device identical with that of FIG. 34 during the manufacturing step thereof.
Figure 36:
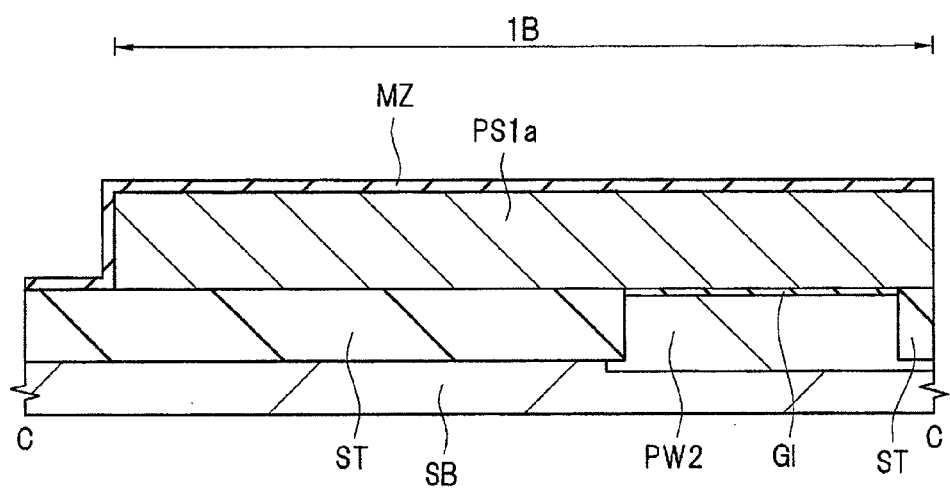
FIG. 36 is a fragmentary cross sectional view for a main portion of the semiconductor device identical with that of FIG. 34 during the manufacturing step thereof.

The removing step of the silicon spacer at step S10 can be performed, for example, as described below. That is, as illustrated in FIG. 31 to FIG. 33, a photoresist pattern (resist pattern) PR2 that covers the memory gate electrode MG and exposes the silicon spacer SP is formed over the semiconductor substrate SB by photolithography. Then, the silicon spacer SP is removed by dry etching using the photoresist pattern PR2 as an etching mask. Then, the photoresist pattern PR2 is removed. Thus, as illustrated in FIG. 34 to FIG. 36, while the silicon spacer SP is removed but the memory gate electrode MG remains unetched, since it has been covered by the photoresist pattern PR2.

Figure 37:
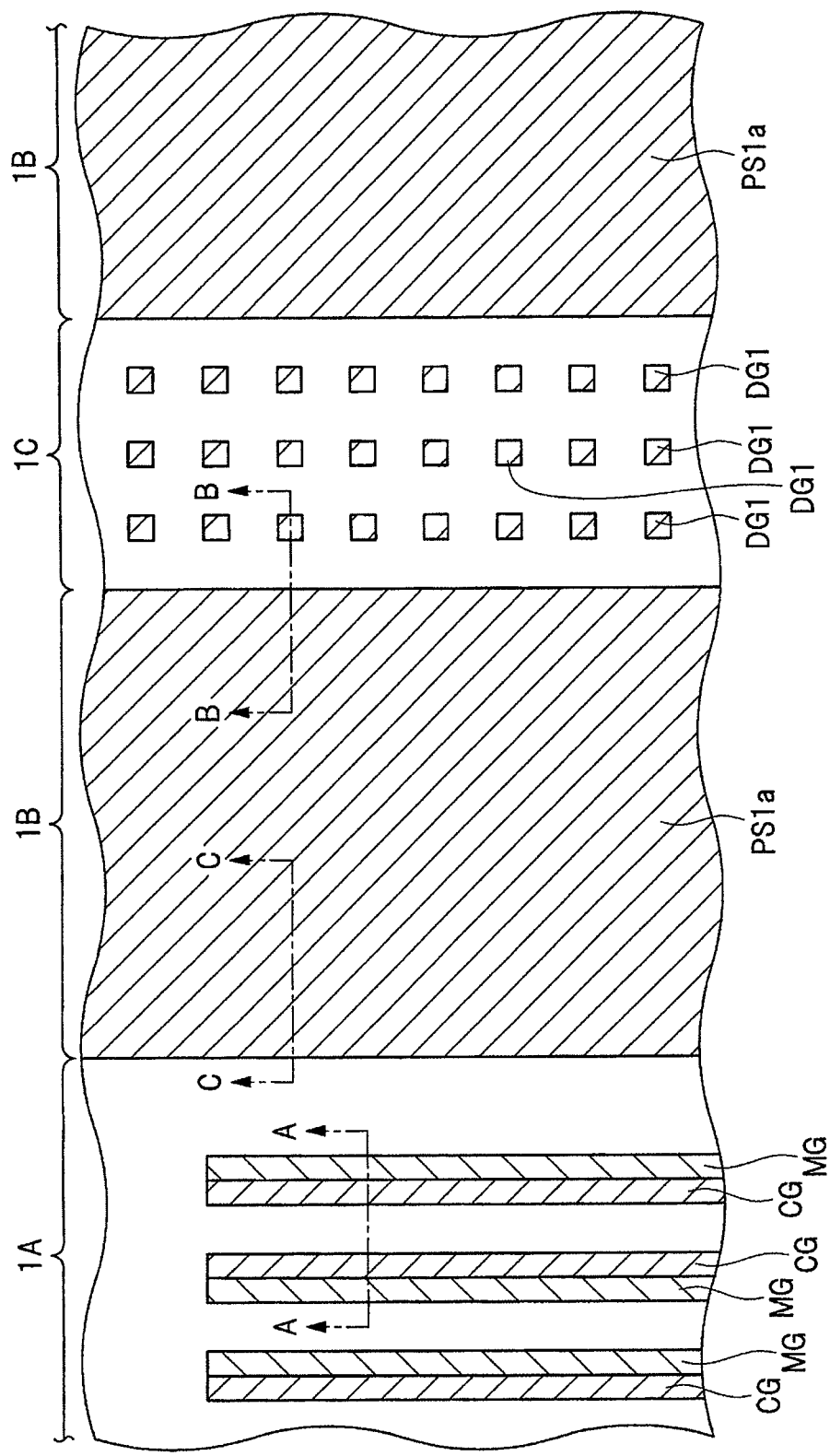
FIG. 37 is a fragmentary plan view for a main portion of the semiconductor device identical with that of FIG. 34 to FIG. 36 during the manufacturing step thereof.

FIG. 37 is a plan view illustrating a planar region identical with that in FIG. 19 to FIG. 21, and FIG. 37 illustrates a plan view at a stage of removing the silicon spacer SP at the step S10. As illustrated in FIG. 34 and FIG. 37, the memory gate electrode MG and the control gate electrode CG are adjacent to each other, that is, they are provided side by side over the main surface of the semiconductor substrate SB and extend in one direction while being adjacent to each other over the main surface of the semiconductor substrate SB. However, since the insulation film MZ is interposed between the memory gate electrode MG and the control gate electrode CG, the memory gate electrode MG and the control gate electrode CG are not in contact to each other.

Figure 38:
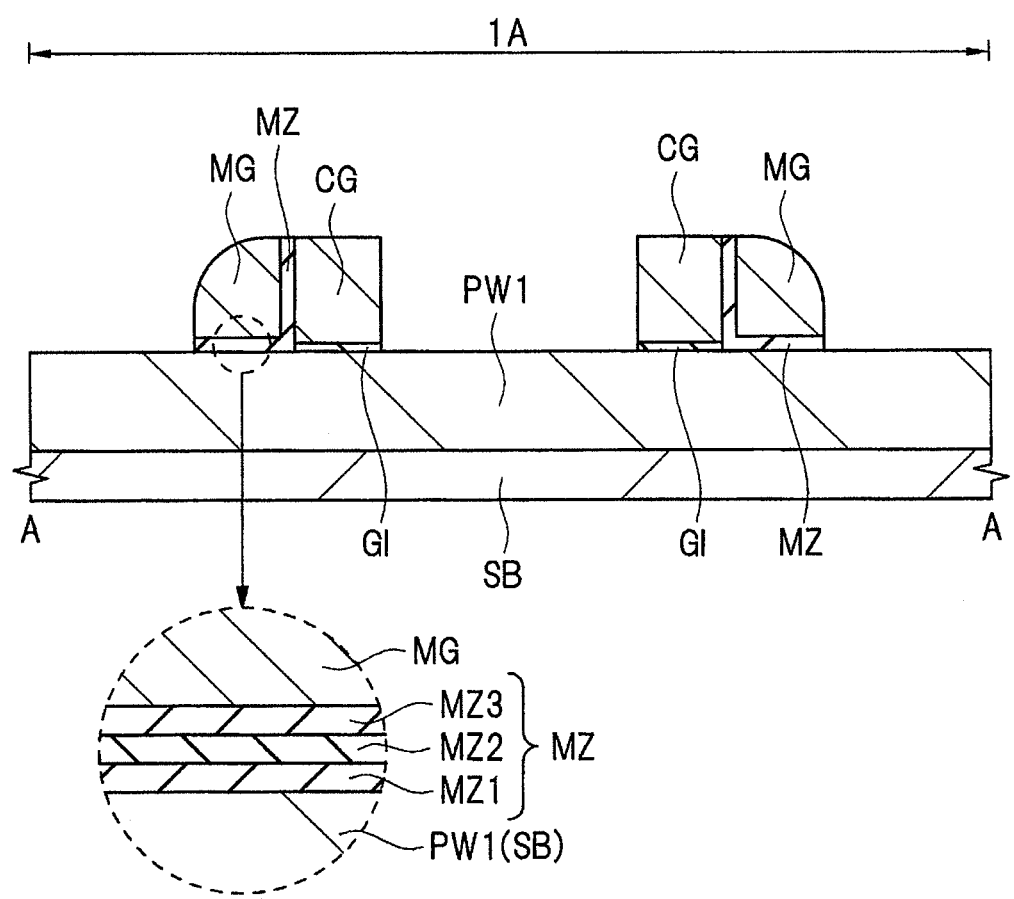
FIG. 38 is a fragmentary cross sectional view for a main portion of the semiconductor device during the manufacturing step thereof succeeding to that of FIG. 34.
Figure 39:
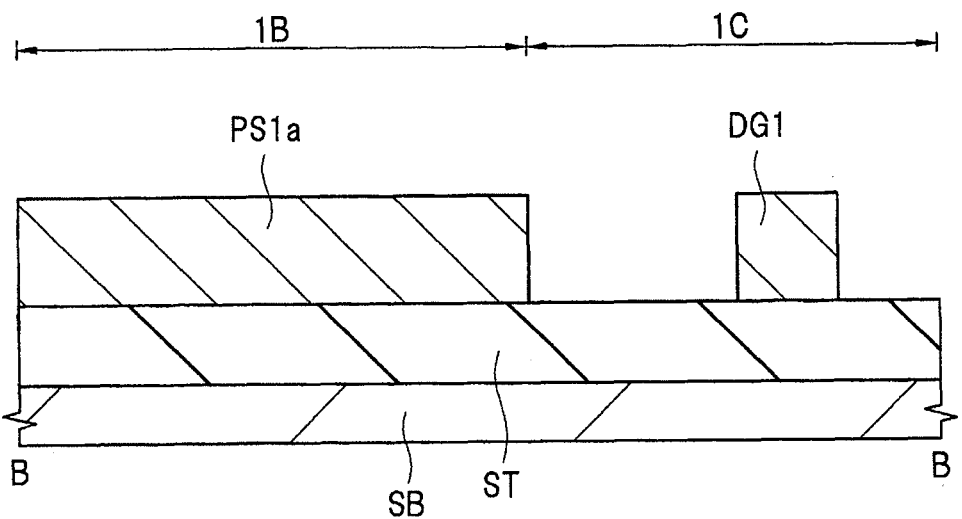
FIG. 39 is a fragmentary cross sectional view for a main portion of the semiconductor device identical with that of FIG. 38 during the manufacturing step thereof.
Figure 40:
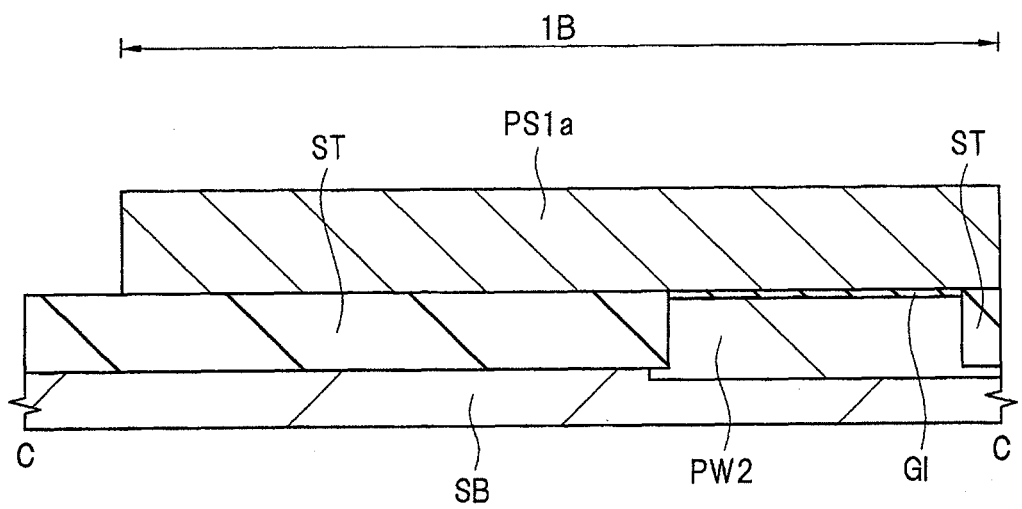
FIG. 40 is a fragmentary cross sectional view for a main portion of the semiconductor device identical with that of FIG. 38 during the manufacturing step thereof.

Then, as illustrated in FIG. 38 to FIG. 40, a portion of the insulation film MZ that is exposed without being covered by the memory gate electrode MG is removed by etching (for example, wet etching) (step S11 in FIG. 2). In this case, the insulation film MZ situated below the memory gate electrode MG and between the memory gate electrode MG and the control gate electrode CG remain without being removed and the insulation film MZ in other regions is removed. As can be seen from FIG. 38, the insulation film MZ extends continuously for both of regions, that is, a region between the memory gate electrode MG and the semiconductor substrate SB (p-type well PW1) and a region between the memory gate electrode MG and the control gate electrode CG in the memory cell region 1A.

In FIG. 38, as illustrated in an enlarged view for a region surrounded by a dotted circle, the insulation film MZ comprises a lamination film of a silicon oxide film MZ1, a silicon nitride film MZ2 thereon and a silicon oxide film MZ3 further thereon.

Then, n-type impurities are introduced into a region of the silicon film PS1a to form a n-channel type MISFET in the peripheral circuit region 1B by using ion implantation, thereby converting the region of the silicon film PS1a to form the n-type channel type MISFET into a n-type silicon film (doped polysilicon film). Upon ion implantation, a photoresist pattern (not illustrated) that exposes a region of the polysilicon PS1a to form a n-channel type MISFET in the peripheral circuit region 1B and covers a region of the p-channel type MISFET in the peripheral circuit region 1B, the entire memory cell region 1A, and the entire dummy forming region 1C may be formed and may be used as an ion implantation blocking mask. Ions may or may not be implanted into the dummy forming region 1C. Further, when a p-channel type MISFET is formed, p-type impurities are introduced by using an ion implantation method into a region of the silicon film PS1a to form the p-channel type MISFET in the peripheral circuit region 1B, thereby converting the region of the silicon film PS1a to form the p-channel type MISFET into a p-type silicon film (doped polysilicon film). Upon ion implantation, a photoresist pattern (not illustrated) that exposes a region of the silicon film PS1a to form the p-channel type MISFET in the peripheral circuit 1B and covers a region in the silicon film PS1a to form the n-channel type MISFET in the peripheral circuit region 1B, the entire memory cell region 1A, and the entire dummy forming region 1C is formed and may be used as an ion implantation blocking mask.

Impurities are introduced by ion implantation into the silicon film PS1a as described above after the step S11 (removing step for insulation film MZ) and before the step S12 (patterning step for silicon film PS1a). Therefore, the impurities may or may not be introduced into the silicon film PS1a till ion implantation, that is, the silicon film PS1a may also be a non-doped (undoped) silicon film.

Then, the silicon film PS1a is patterned by using photolithography and etching technique, thereby forming a gate electrode GE and a dummy electrode DG2 in the peripheral circuit region 1B (step S12 in FIG. 2). The patterning step at the step S12 can be performed, for example, as described below.

Figure 41:
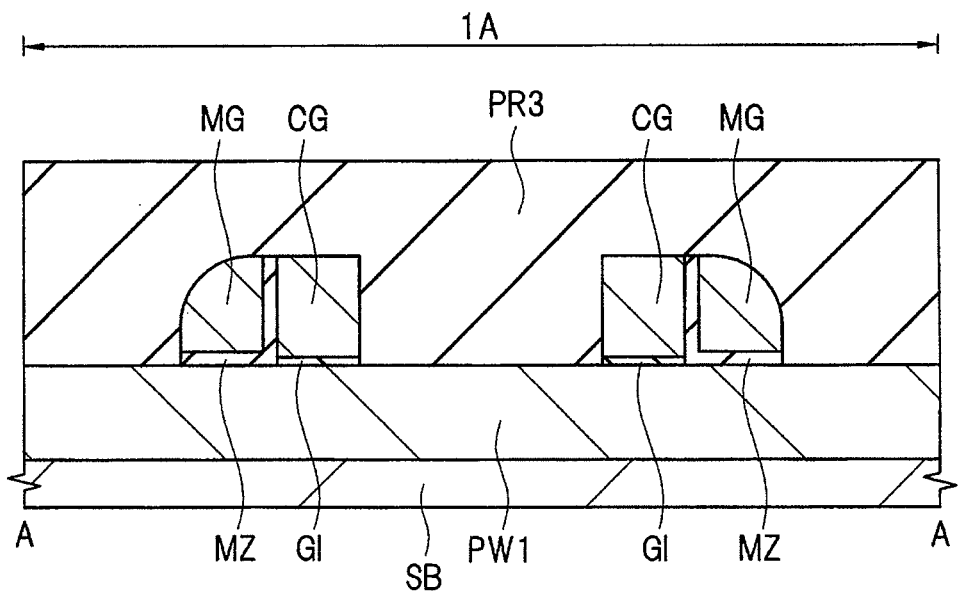
FIG. 41 is a fragmentary cross sectional view for a main portion of the semiconductor device during the manufacturing step thereof succeeding to that of FIG. 38.
Figure 42:
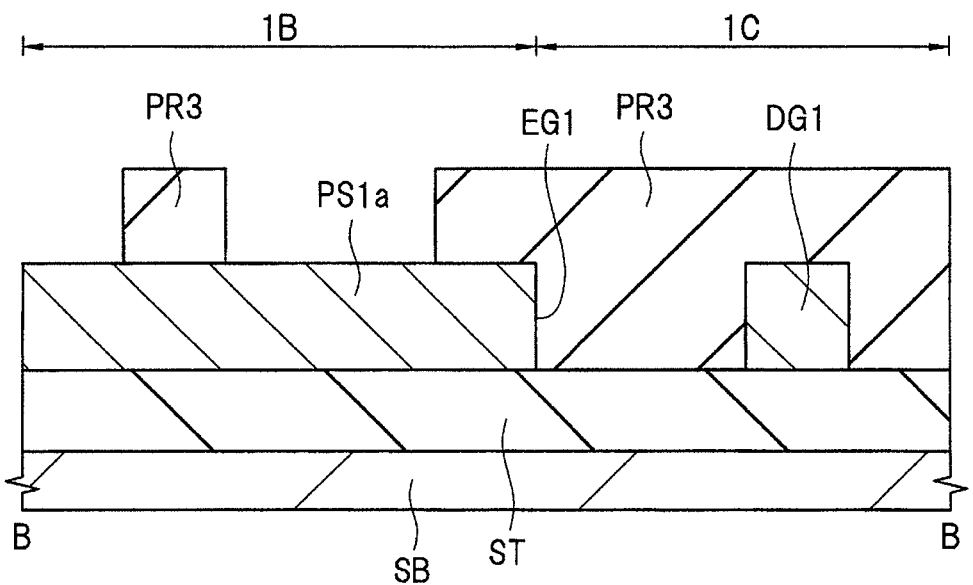
FIG. 42 is a fragmentary cross sectional view for a main portion of the semiconductor device identical with that of FIG. 41 during the manufacturing step thereof.
Figure 43:
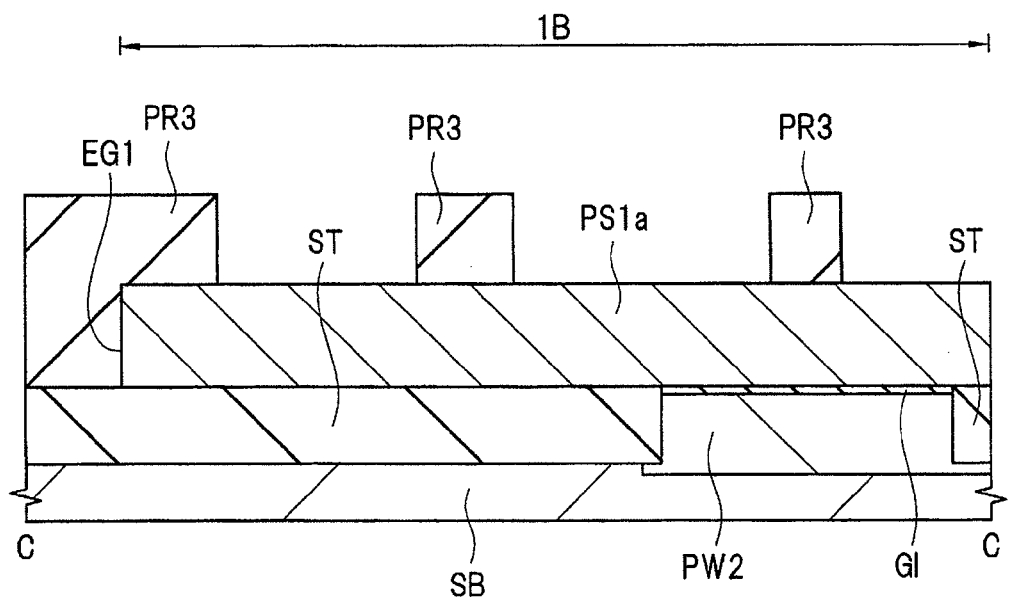
FIG. 43 is a fragmentary cross sectional view for a main portion of the semiconductor device identical with that of FIG. 41 during the manufacturing step thereof.
Figure 44:
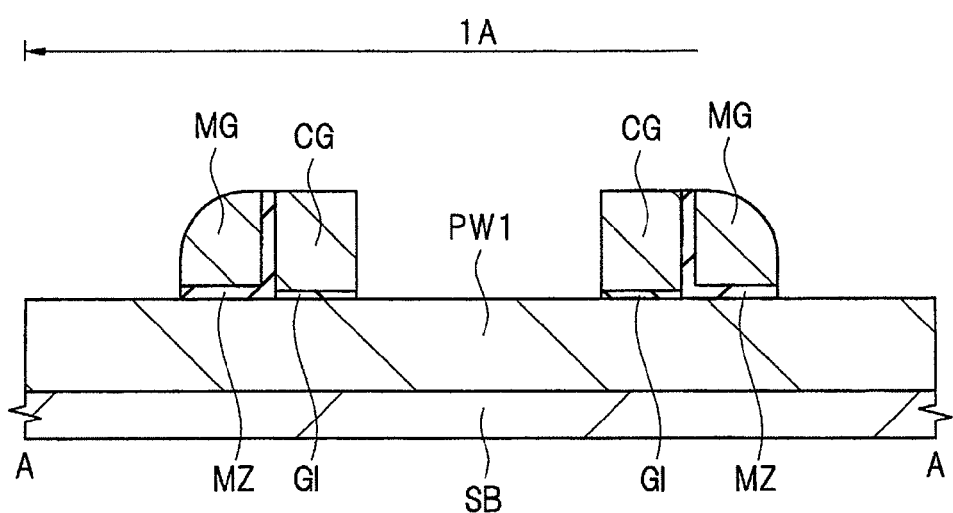
FIG. 44 is a fragmentary cross sectional view for a main portion of the semiconductor device during the manufacturing step thereof succeeding to that of FIG. 41.
Figure 45:
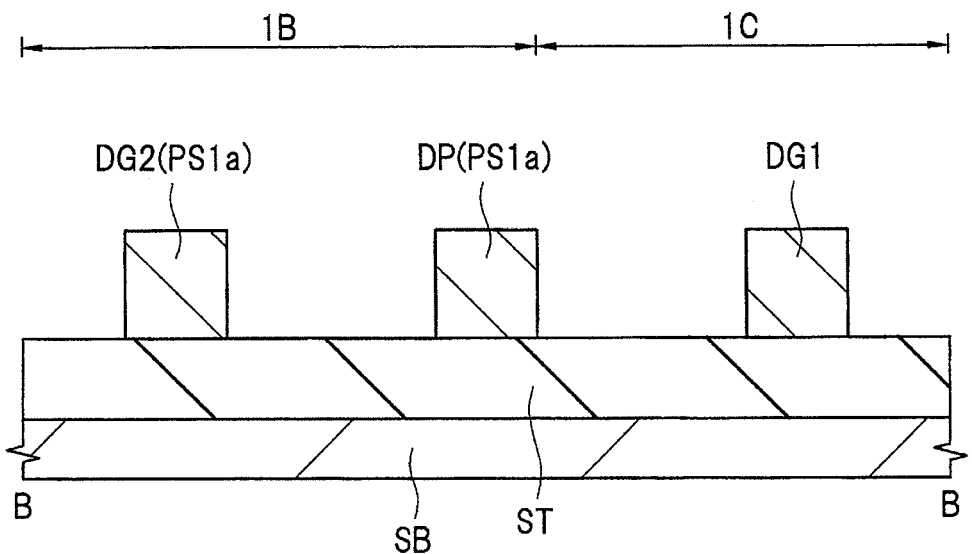
FIG. 45 is a fragmentary cross sectional view for a main portion of the semiconductor device identical with that of FIG. 44 during the manufacturing step thereof.
Figure 46:
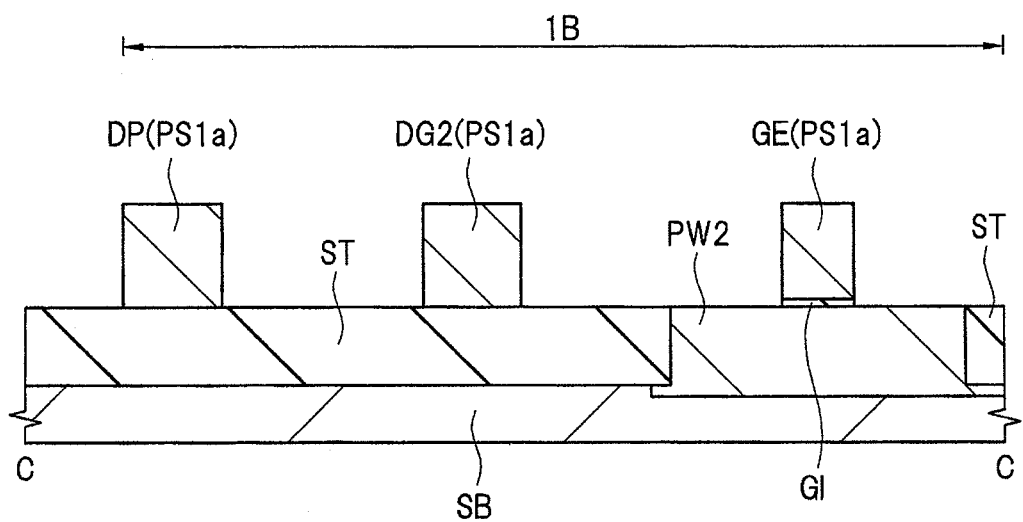
FIG. 46 is a fragmentary cross sectional view for a main portion of the semiconductor device identical with that of FIG. 44 during the manufacturing step thereof.

At first, as illustrated in FIG. 41 to FIG. 43, a photoresist pattern (resist pattern) PR3 is formed as a resist pattern over the main surface of the semiconductor substrate SB by using photolithography. Then, the silicon film PS1a is patterned by etching (preferably dry etching) by using the photoresist pattern PR3 as an etching mask. Then, the photoresist pattern PR3 is removed. Thus, as illustrated in FIG. 44 to FIG. 46, a gate electrode GE comprising a silicon film pattern PS1a and a dummy gate electrode DG2 comprising a silicon film pattern PS1a are formed. In this case, the outer periphery of the silicon film PS1a also remains to form a dummy pattern DP.

Figure 47:
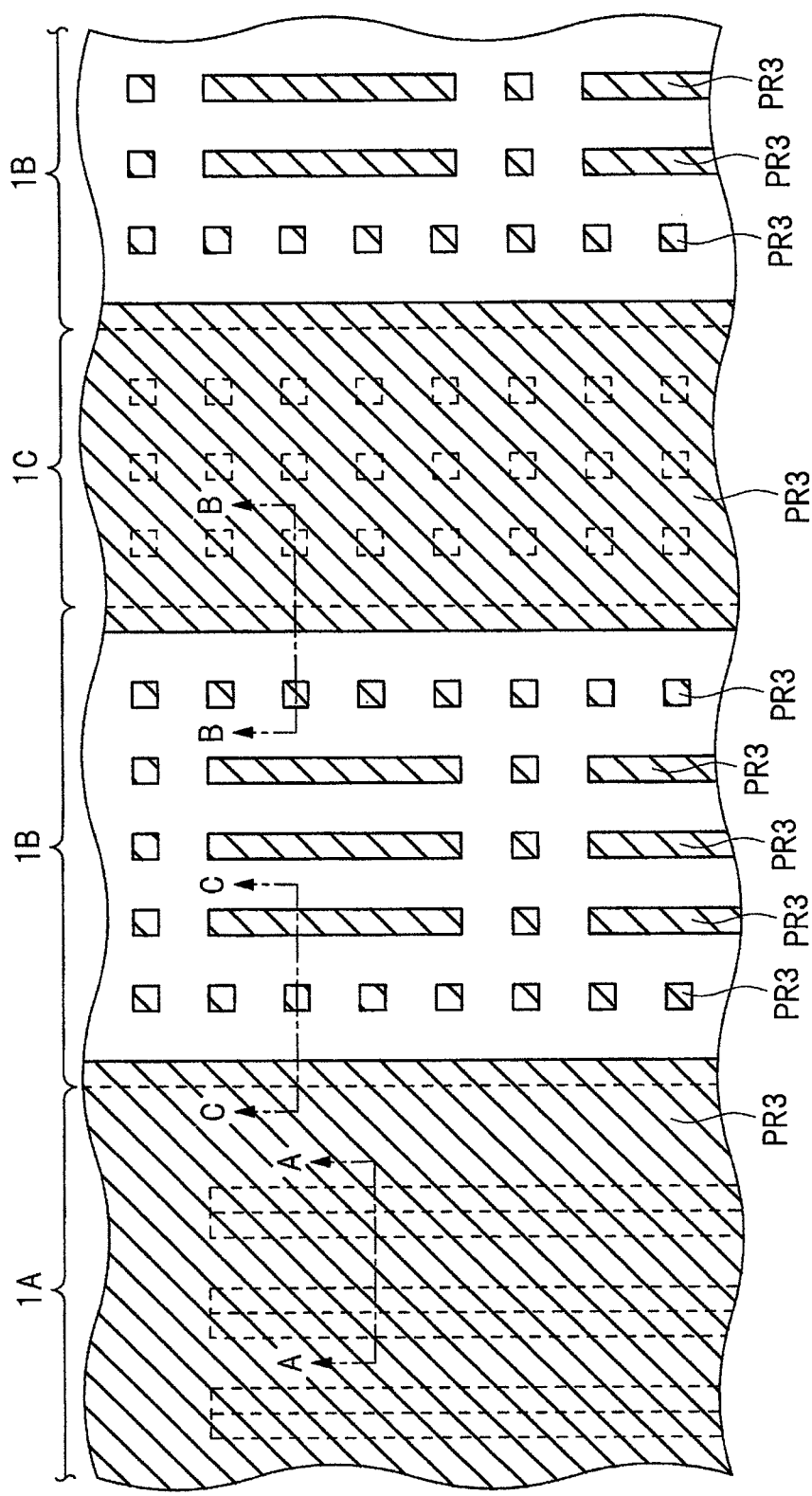
FIG. 47 is a fragmentary plan view for a main portion of the semiconductor device identical with that of FIG. 41 to FIG. 43 during the manufacturing step thereof.
Figure 48:
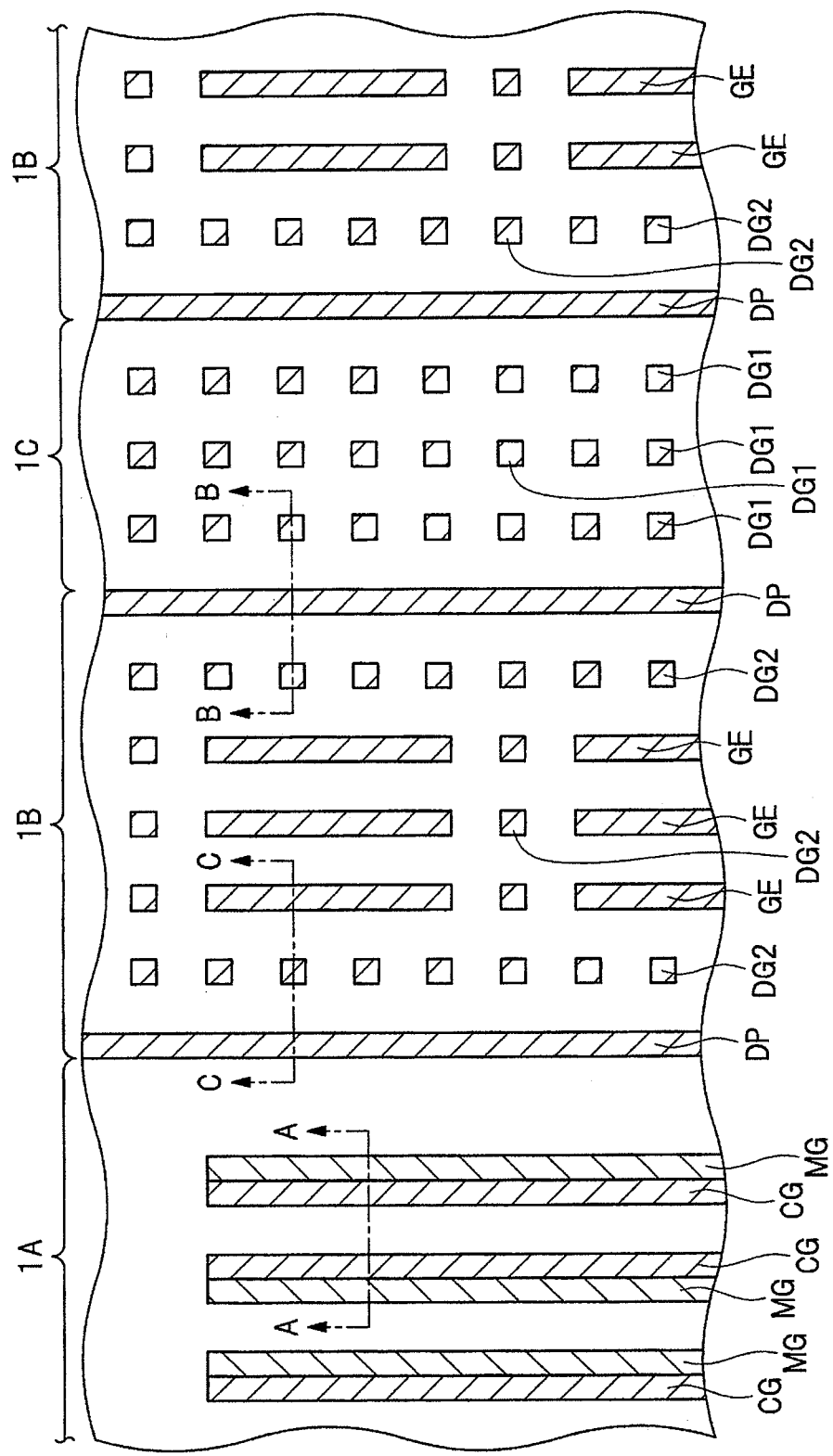
FIG. 48 is a fragmentary plan view for a main portion of the semiconductor device identical with that of FIG. 44 to FIG. 46 during the manufacturing step thereof.

FIG. 47 and FIG. 48 are plan views illustrating planar regions identical with those of FIG. 19 to FIG. 21, and FIG. 37. FIG. 47 illustrates a plan view at a stage of forming the photoresist pattern PR3 and FIG. 48 illustrates a plan view at a stage of patterning the silicon film PS1a at the step S12 and then removing the photoresist pattern PR3.

In the memory cell region 1A, the photoresist pattern PR3 was formed over the entire memory cell region 1A. Therefore, the control gate electrode CG and the memory gate electrode MG in the memory cell region 1A were entirely covered by the photoresist pattern PR3. Accordingly, the control gate electrode CG and the memory gate electrode MG are not etched, but remain in the memory cell region 1A at the step S12.

Further, in the dummy forming region 1C, the photoresist pattern PR3 was formed over the entire dummy forming region 1C. Therefore, the dummy gate electrode DG1 in the dummy forming region 1C was covered by the photoresist pattern PR3. Accordingly, the dummy gate electrode DG1 remains unetched in the dummy forming region 1C at the step S12.

On the other hand, in the peripheral circuit region 1B, the photoresist pattern PR3 is formed selectively to a region to form the gate electrode GE, a region to form the dummy gate electrode DG2 formed, and the outer periphery (outer peripheral region), and is not formed in other region than that described above. Therefore, the silicon film PS1a was covered by the photoresist pattern PR3 in a region to form the gate electrode GE, in a region in which the dummy gate electrode DG2 is to be formed, and in the outer periphery by the resist pattern PR3 but other region than those described above was exposed without being covered by the photoresist pattern PR3. Accordingly, at the step S12, the silicon film PS1a is patterned, and the gate electrode GE, the dummy gate electrode DG2, and the dummy pattern DP are formed by the silicon film pattern PS1a in the peripheral circuit region 1B, and other silicon film PS1a than that described above is removed. That is, when the step S12 is performed, the silicon film PS1a is removed from other portions, i.e., a portion to form the gate electrode GE, a portion to form the dummy gate electrode DG2, and a portion to form the dummy pattern DP. While one or more gate electrodes GE are formed in the peripheral circuit region 1B, a plurality of gate electrodes GE are formed actually in the peripheral circuit region 1B. Further, while one or more dummy gate electrode DG2 is formed in the peripheral circuit region 1B, a plurality of dummy gate electrodes DG2 are actually formed in the peripheral circuit region 1B.

Further, in the peripheral circuit region 1B, not only the MISFET but also other semiconductor device than the MISFET can also be formed in the peripheral circuit region 1B, and the constituent element of the semiconductor device can also be formed of the silicon film PS1a. In this case, it is also possible to form a photoresist pattern PR3 also in a region in which the constituent element of the semiconductor device is to be formed, and form the constituent element of the semiconductor device by the silicon film PS1a patterned at the step S12. The semiconductor device other than the MISFET includes, for example, a resistance device or a capacitance element. In a case where the semiconductor device is the resistance device, a polysilicon resistance device can be formed of a silicon film PS1a patterned at the step S12. Further, in a case where the semiconductor device is a capacitance device, the electrode of the capacitance device can be formed by the silicon film PS1a patterned at the step S12. For example, an upper electrode of the capacitance device can be formed of the silicon film PS1a patterned at the step S12, the insulation film GI is used for a capacitance dielectric film, and a lower electrode of the capacitance device can be formed of an impurity diffusion layer formed in the semiconductor substrate SB.

In the peripheral circuit region 1B, a gate electrode GE comprising a silicon film pattern PS1a is formed and the gate electrode GE is a gate electrode for MISFET. In the peripheral circuit 1B, the insulation film GI remaining below the gate electrode GE forms a gate insulation film of the MISFET. Accordingly, in the peripheral circuit region 1B, the gate electrode GE comprising the silicon film PS1a (accordingly, silicon film PS1) is formed over the semiconductor substrate SB (p-type well PW2) by way of the insulation film GI as the gate insulation film.

In the peripheral circuit region 1B, the insulation film GI other than the portion covered by the gate electrode GE, that is, the insulation film GI other than the portion as the gate insulation film tan be removed by dry etching or by wet etching after the dry etching performed by the patterning step at the step S12.

In the semiconductor substrate SB, when a device isolation region ST is formed in a region to form the dummy gate electrode DG2, the dummy gate electrode DG2 is formed over the device isolation region ST. FIG. 45 and FIG. 46 illustrate a case in which the dummy gate electrode DG2 is formed over the device isolation region ST. As another configuration, it is also possible to form the dummy gate electrode DG2 in a region in which the device isolation region ST is not formed. In this case, the dummy gate electrode DG2 is not formed over the device isolation region ST but formed over the substrate region (Si substrate region) of the semiconductor substrate SB by way of the insulation film GI.

The photoresist pattern PR3 is preferably formed so as to cover the side wall (side surface) EG1 of the silicon film PS1a. That is, the outer periphery of the silicon film PS1a is preferably covered by the photoresist pattern PR3 in a plan view, thereby covering the side wall (side surface) of the silicon film PS1a by the photoresist pattern PR3. Thus, since the outer periphery of the silicon film PS1a is covered by the photoresist pattern PR3 and, accordingly, remains unetched in the patterning at the step S12 to form a dummy pattern DP. That is, the dummy pattern DP is a remaining outer periphery of the silicon film PS1a. As described above, the side wall (side surface) EG1 of the silicon film PS1a is preferably situated over the device isolation region ST and, in this case, the dummy pattern DP is also situated over the device isolation region ST. In such a case, the dummy pattern DP is also situated over the device isolation region ST. Etching may be performed also in a state where the photoresist pattern PR3 does not cover the side wall (side surface) EG1 of the silicon film PS1a. In such a case, however, it may be considered that the surface of the semiconductor substrate SB adjacent to the side wall of the silicon film PS1a (device isolation region ST in this embodiment) is scraped by etching to lower the height of the etched portion or generate unexpected particles to deteriorate the reliability in the subsequent steps. For avoiding such disadvantage, it is preferred that the photoresist pattern PR3 covers the side wall (side surface) of the silicon film PS1a to leave the dummy pattern DP.

The dummy gate electrode DG1 and the dummy gate electrode DG2 have, for example, a rectangular planar shape. On the other hand, since the dummy pattern DP is a remaining outer periphery of the silicon film PS1a, it is in a continuously extending pattern. That is, while the dummy pattern DP is a linear pattern, it has no end in the extending direction but has a continuous pattern surrounding (turning around) a certain region (planar shape) in a plan view.

"In a plan view" means a state when observing the semiconductor substrate SB at a plane parallel to the main surface.

"Outer periphery" of the silicon film PS1a corresponds to a region (portion) along the boundary between a region where the silicon film PS1a is formed and a region where the silicon film PS1a is not formed in a plan view. That is, "outer periphery" of the silicon film PS1a corresponds to a region along the side wall (side surface) of the silicon film PS1a and a region adjacent to the side wall (side surface) of the silicon film PS1a in the plan view.

In a case where the dummy forming region 1C is surrounded by the peripheral circuit region 1B, since the silicon film PS1a is not formed in the dummy forming region 1C but formed so as to surround the dummy forming region 1C, the silicon film PS1a is in a planar shape having an opening that opens the dummy forming region 1C. Further, the planar shape of the silicon film PS1a sometimes has an opening that opens the entire memory cell region 1A. In such a case, also the region along the opening (opening that opens the entire dummy forming region 1C or the opening that opens the entire memory cell region 1A) in the silicon film PS1a is also included in the "outer periphery" of the silicon film PS1a. When the silicon film PS1a has an opening (opening that opens the entire dummy forming region 1C and opening that opens the entire memory cell region 1A), also the inner wall (side wall) of the opening is the side wall (side surface) EG1 of the silicon film PS1a. When the photoresist pattern PR3 is formed, the opening is preferably covered by the photoresist pattern PR3.

As described above, the gate electrode GE, the dummy electrode DG2, and the dummy pattern DP are formed at the step S12.

Thus, there is provided a state, as illustrated in FIG. 44 to FIG. 46, in which the control gate electrode CG is formed by way of the insulation film GI over the semiconductor substrate SB and the memory gate electrode MG is formed by way of the insulation film MZ over the semiconductor substrate SB in the memory cell region 1A, and the gate electrode GE is formed by way of the insulation film GI over the semiconductor substrate SB in the peripheral circuit region 1B. In this case, the dummy gate electrode DG1 is formed in the dummy forming region 1C and the dummy gate electrode DG2 and the dummy pattern DP are also formed in the peripheral circuit region 1B.

Figure 49:
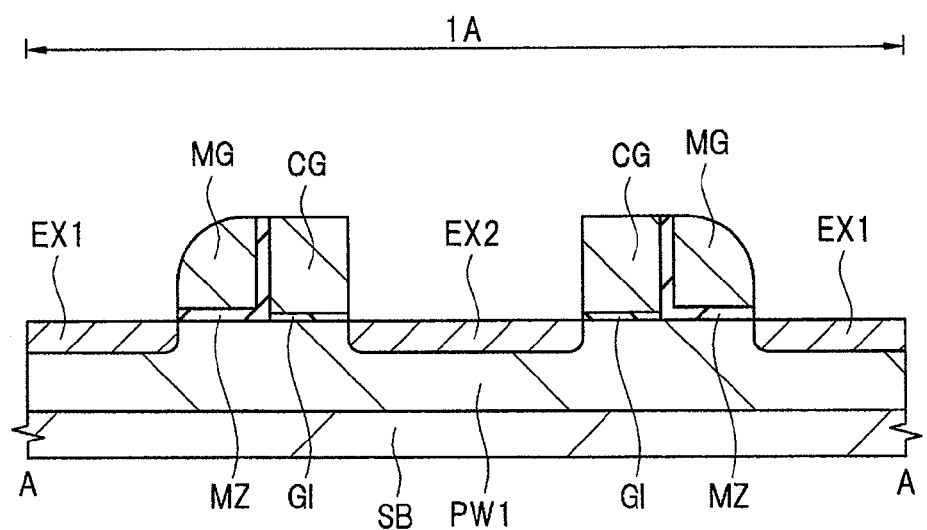
FIG. 49 is a fragmentary cross sectional view for a main portion of the semiconductor device during the manufacturing step thereof succeeding to that of FIG. 44.
Figure 50:
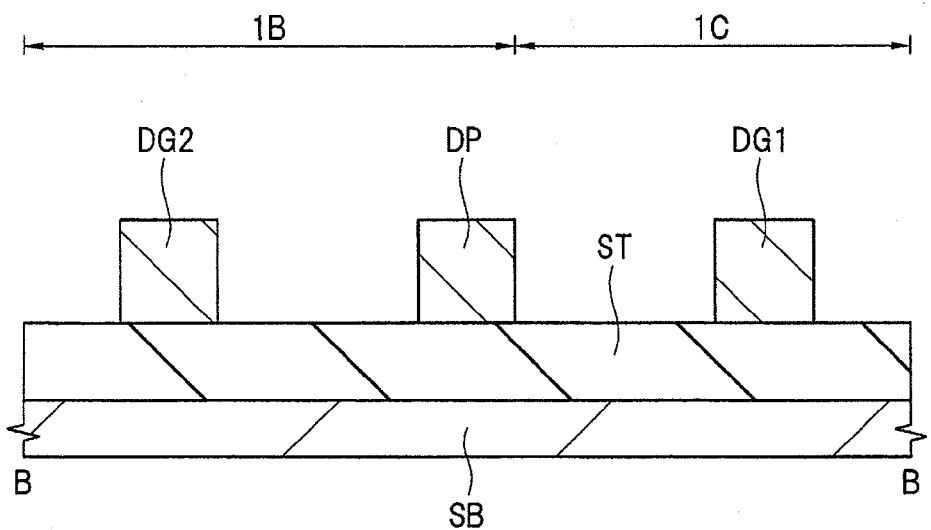
FIG. 50 is a fragmentary cross sectional view for a main portion of the semiconductor device identical with that of FIG. 49 during the manufacturing step thereof.
Figure 51:
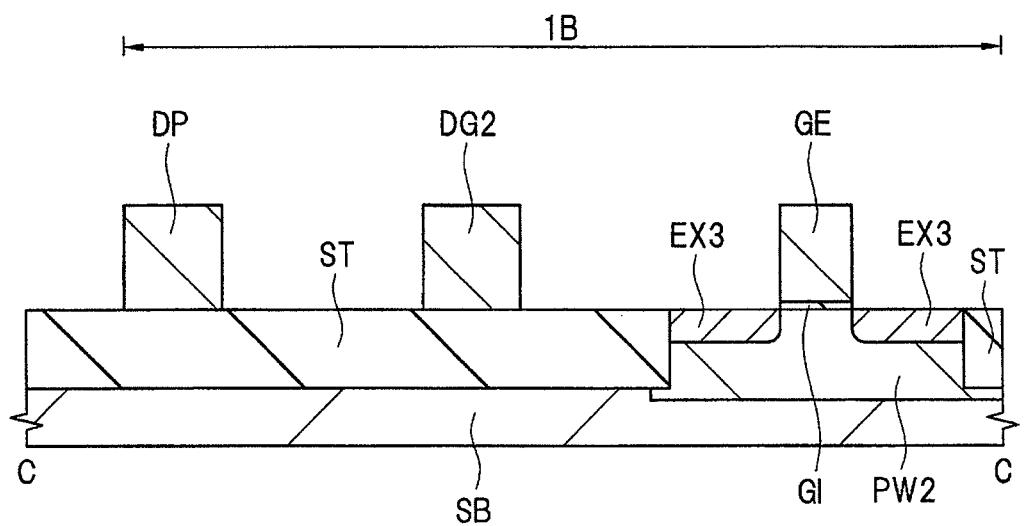
FIG. 51 is a fragmentary cross sectional view for a main portion of the semiconductor device identical with that of FIG. 49 during the manufacturing step thereof.

Then, as illustrated in FIG. 49 to FIG. 51, n⁻-type semiconductor regions (impurity diffusion layer) EX1, EX2 and EX3 are formed by using ion implantation, etc. (step S13 in FIG. 2).

At the step S13, the n⁻-type semiconductor regions EX1, EX2, and EX3 can be formed by introducing n-type impurities, for example, arsenic (As) or phosphorus (P) by an ion implantation method into the semiconductor substrate SB (p-type wells PW1, PW2) by using the control gate electrode CG, the memory electrode MG, and the gate electrode GE as a mask (ion implantation blocking mask). Since the memory gate electrode MG functions as a mask (ion implantation blocking mask) in the memory cell region 1A, the n⁻-type semiconductor region EX1 is formed in self-alignment to the side wall of the memory gate electrode MG (side wall opposite to the side adjacent to the control gate electrode CG by way of the insulation film MZ). Further, since the control gate electrode CG functions as a mask (ion implantation blocking mask) in the memory cell region 1A, the n⁻-type semiconductor region EX2 is formed in self-alignment to the side wall of the control gate electrode CG (side wall on the side opposite to the side adjacent to the memory gate electrode MG by way of the insulation film MZ). Further, since the gate electrode GE functions as a mask (ion implantation blocking mask) in the peripheral circuit region 1B, the n⁻-type semiconductor region EX3 is formed in self-alignment to both side walls of the gate electrode GE. The n⁻-type semiconductor region EX1 and the n⁻-type semiconductor region EX2 can function as a portion of a source-drain region (source or drain region) of the memory cell formed in the memory cell region 1A, and the n⁻-type semiconductor region EX3 can function as a portion of the source-drain region of the MISFET (source or drain region) formed in the peripheral circuit 1B. While the n⁻-type semiconductor region EX1, the n⁻-type semiconductor region EX2, and the n⁻-type semiconductor region EX3 can be formed by an identical ion implantation step, they can be formed also by different ion implantation steps.

Figure 52:
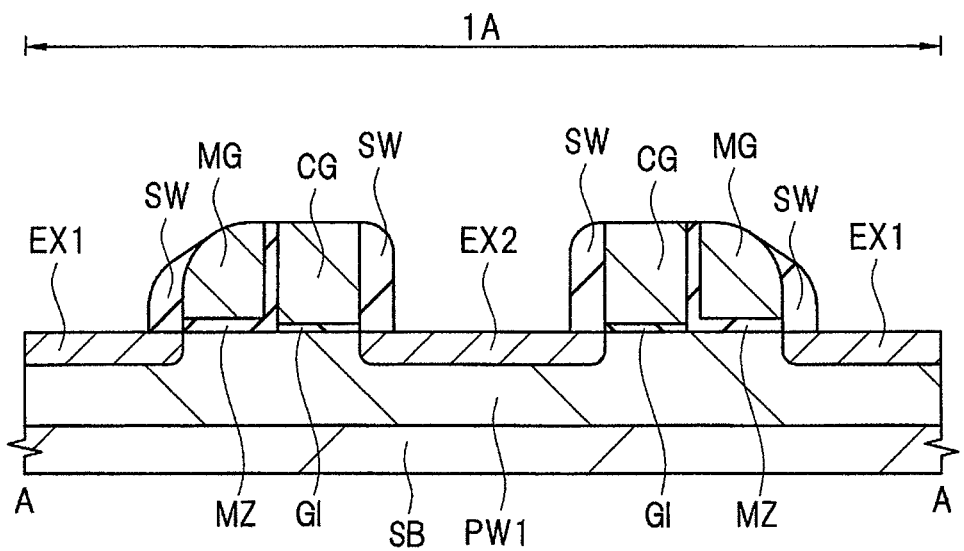
FIG. 52 is a fragmentary cross sectional view for a main portion of the semiconductor device during the manufacturing step thereof succeeding to that of FIG. 49.
Figure 53:
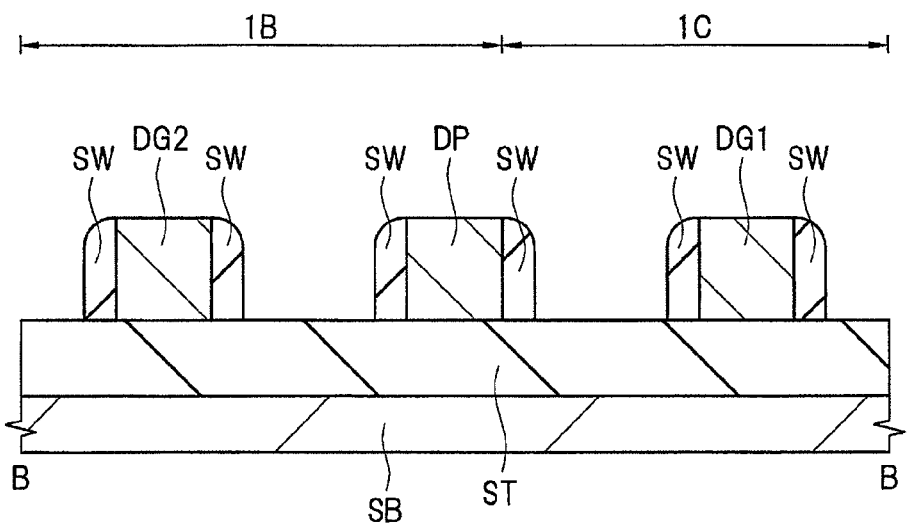
FIG. 53 is a fragmentary cross sectional view for a main portion of the semiconductor device identical with that of FIG. 52 during the manufacturing step thereof.
Figure 54:
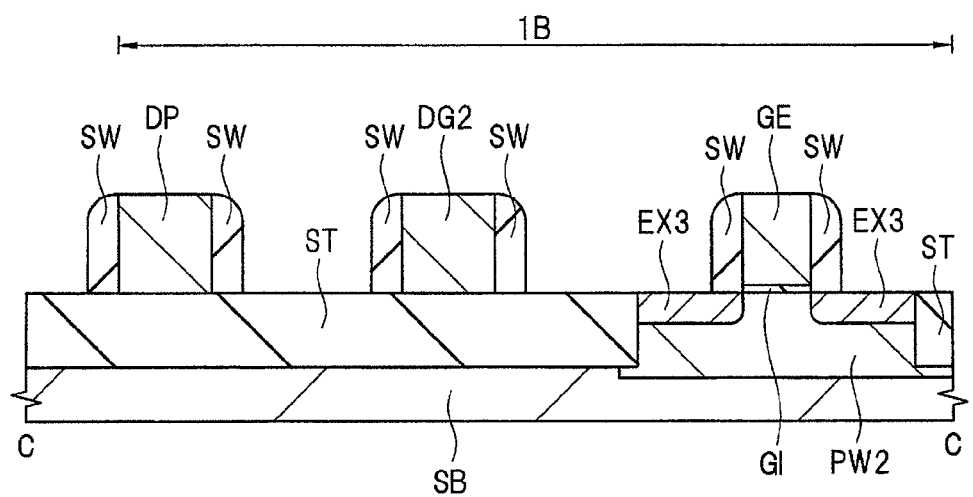
FIG. 54 is a fragmentary cross sectional view for a main portion of the semiconductor device identical with that of FIG. 52 during the manufacturing step thereof.

Then, as illustrated in FIG. 52 to FIG. 54, side wall spacers SW each comprising an insulation film are formed as side wall insulation films on the side wall of the control gate electrode CG and the memory gate electrode MG (side wall on the side opposite to the side adjacent to each other by way of the insulation film MZ), on the side wall of the gate electrode GE, on the side wall of the dummy gate electrode DG1, on the side wall of the dummy gate electrode DG2, and on the side wall of the dummy pattern DP (step S14 in FIG. 12). The side wall spacer (side wall, side wall insulation film) SW can be regarded as a side wall insulation film.

The side wall spacer SW forming step at the step S14 can be performed, for example, as described below. At first, the insulation film for forming the side wall spacer SW is formed (deposited) over the entire main surface of the semiconductor substrate. The insulation film for forming the side wall spacer SW comprises, for example, a silicon oxide film, silicon nitride film, or a lamination film thereof and can be formed by using CVD, etc. The insulation film for forming the side wall spacer SW is formed over the semiconductor substrate SB so as to cover the memory gate electrode MG, the control gate electrode CG, the gate electrode GE, the dummy gate electrodes DG1 and DG2, and the dummy pattern DP. Then, the insulation film for forming the side wall spacer SW is etched back by an anisotropic etching technique (etching, dry etching, anisotropic etching). Thus, the insulation film for forming the side wall spacer SW remains selectively on the side walls of the control gate electrode CG and the memory gate electrode MG (side walls opposite to the sides adjacent to each other by way of the insulation film MZ), on the side wall of the gate electrode GE, on the side wall of the dummy gate electrode DG1, on the side wall of the dummy gate electrode DG2, and on the side wall of the dummy pattern DP, to form the side wall spacers SW.

Figure 55:
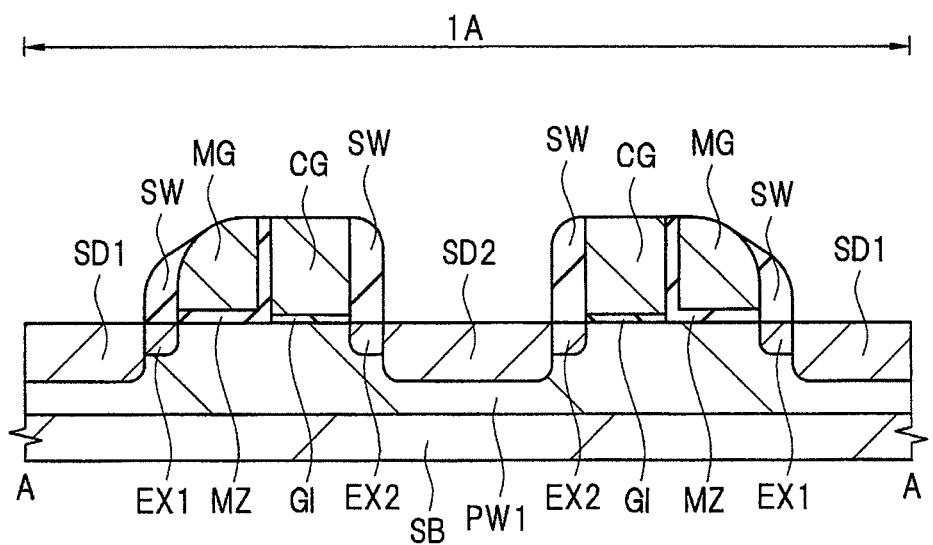
FIG. 55 is a fragmentary cross sectional view for a main portion of the semiconductor device during the manufacturing step thereof succeeding to that of FIG. 52.
Figure 56:
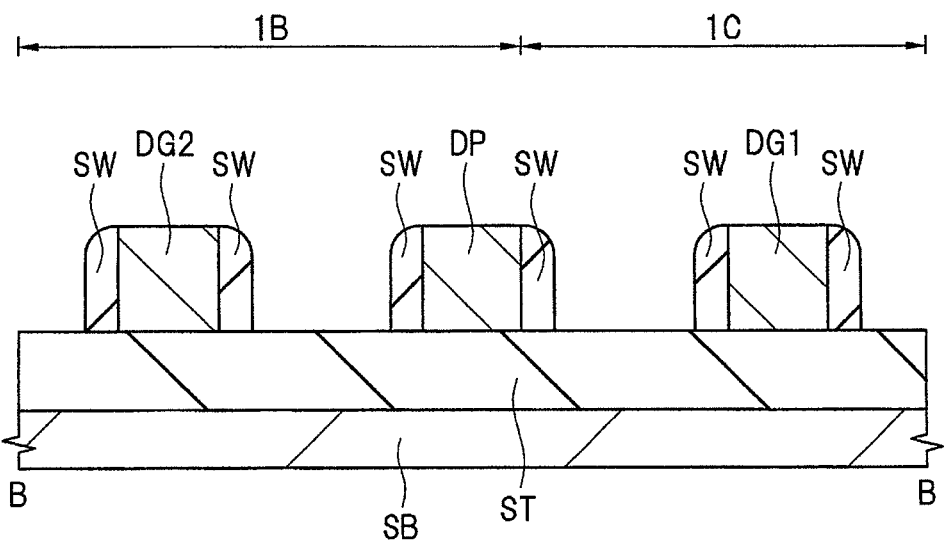
FIG. 56 is a fragmentary cross sectional view for a main portion of the semiconductor device identical with that of FIG. 55 during the manufacturing step thereof.
Figure 57:
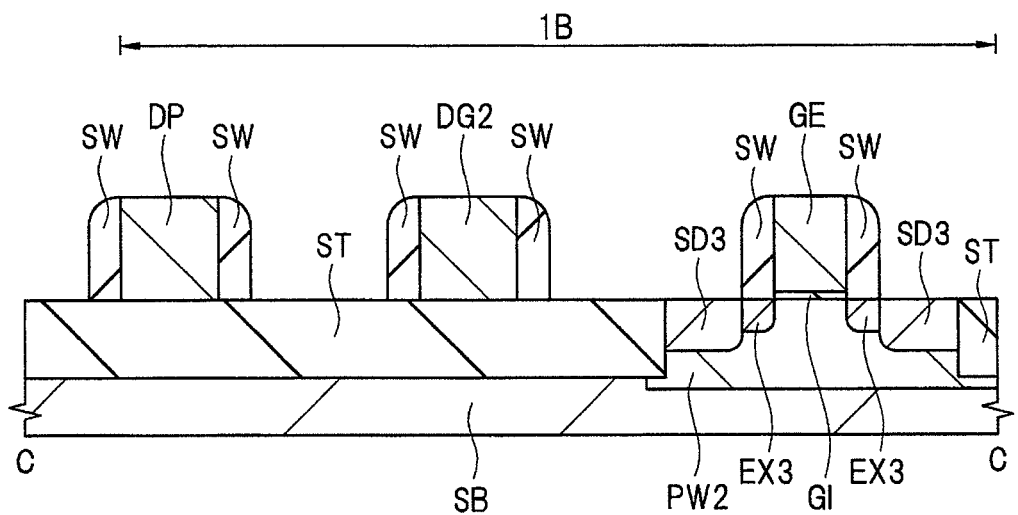
FIG. 57 is a fragmentary cross sectional view for a main portion of the semiconductor device identical with that of FIG. 55 during the manufacturing step thereof.

Then, as illustrated in FIG. 55 to FIG. 57, n⁺-type semiconductor regions (impurity diffusion layers) SD1, SD2, and SD3 are formed by using an ion implantation method, etc. (step S15 in FIG. 2).

At a step S15, the n⁺-type semiconductor regions SD1, SD2, and SD3 can be formed by introducing n-type impurities, for example, arsenic (As) or phosphorus (P) by an ion implantation method into the semiconductor substrate SB (p-type wells PW1 and PW2) by using the control gate electrode CG, the memory gate electrode MG, the gate electrode GE, and the side wall spacers SW on the side wall thereof as a mask (ion implantation blocking mask). In this case, since the memory gate electrode MG and the side wall spacer SW on the side wall of the memory gate electrode MG function as a mask (ion implantation blocking mask) in the memory cell region 1A, the $n^+$-type semiconductor region SD1 is formed in self-alignment to the side wall spacer SW on the side wall of the memory gate electrode MG. Further, since the control gate electrode CG and the side wall spacer SW on the side wall thereof function as a mask (ion implantation blocking mask) in the memory cell region 1A, the $n^+$-type semiconductor region SD2 is formed in self-alignment to the side wall spacer SW on the side wall of the control gate electrode CG. Further, since the gate electrode GE and the side wall spacer SW on the side wall thereof function as a mask (ion implantation blocking mask) in the peripheral circuit region 1B, the $n^+$-type semiconductor region SD3 is formed in self-alignment to the side wall spacer SW on both side walls of the gate electrode GE. Thus, a LDD (Lightly Doped Drain) structure is formed. The $n^+$-type semiconductor region SD1, the $n^+$-type semiconductor region SD2, and the $n^+$-type semiconductor region SD3 may be formed of an identical ion implantation step, but they can be formed also by different ion implanting steps. Alternatively, the $n^+$-type semiconductor region SD1 and the $n^+$-type semiconductor region SD2 can be formed in an identical ion implantation and the $n^+$-type semiconductor SD3 can be formed by other ion implantation.

As described above, a n-type semiconductor that functions as a source region of the memory transistor is formed by the $n^-$-type semiconductor region EX1 and the $n^+$-type semiconductor region SD1 at a higher impurity concentration, and a n-type semiconductor region that functions as a drain region of the control transistor is formed by the $n^-$-type semiconductor EX2 and the $n^+$-type semiconductor region SD2 at a higher impurity concentration. Further, a n-type semiconductor region that functions as a source-drain region of the MISFET in the peripheral circuit region 1B is formed by the $n^-$-type semiconductor region EX3 and the $n^+$-type semiconductor region SD3 at a higher impurity concentration. The $n^+$-type semiconductor region SD1 has higher impurity concentration and deeper junction depth than those of the $n^-$-type semiconductor region EX1, the $n^+$-type semiconductor region SD2 has higher impurity concentration and deeper junction depth than those of the $n^-$-type semiconductor region EX2, and the $n^+$-type semiconductor region SD3 has a higher impurity concentration and a deeper junction depth than those of the $n^-$-type semiconductor region EX3.

Then, activation annealing, is performed which is a heat treatment for activating the impurities introduced into the semiconductor regions for source and drain ($n^-$-type semiconductor regions EX1, EX2, and EX3 and $n^+$-type semiconductor region SD1, SD2, and SD3) (step S16 in FIG. 2).

As described above, the memory cell of the non-volatile memory is formed in the memory cell region 1A, and the MISFET (n-channel type MISFET in this embodiment) is formed in the peripheral circuit region 1B.

Figure 58:
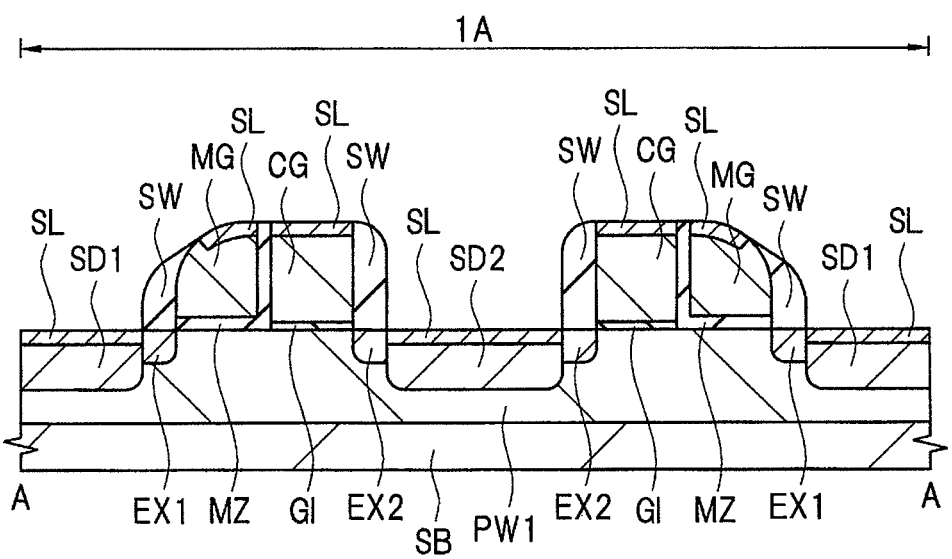
FIG. 58 is a fragmentary cross sectional view for a main portion of the semiconductor device during the manufacturing step thereof succeeding to that of FIG. 55.
Figure 59:
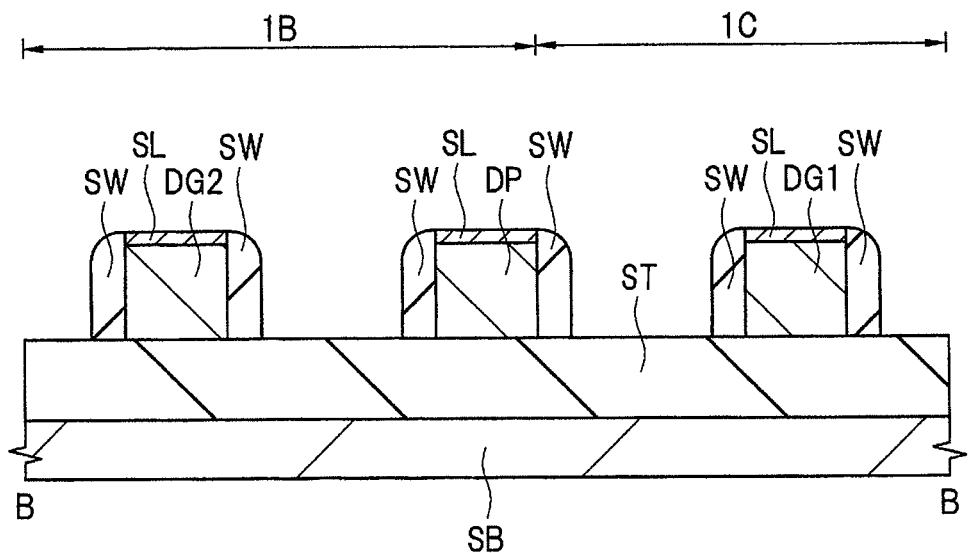
FIG. 59 is a fragmentary cross sectional view for a main portion of the semiconductor device identical with that of FIG. 58 during the manufacturing step thereof.
Figure 60:
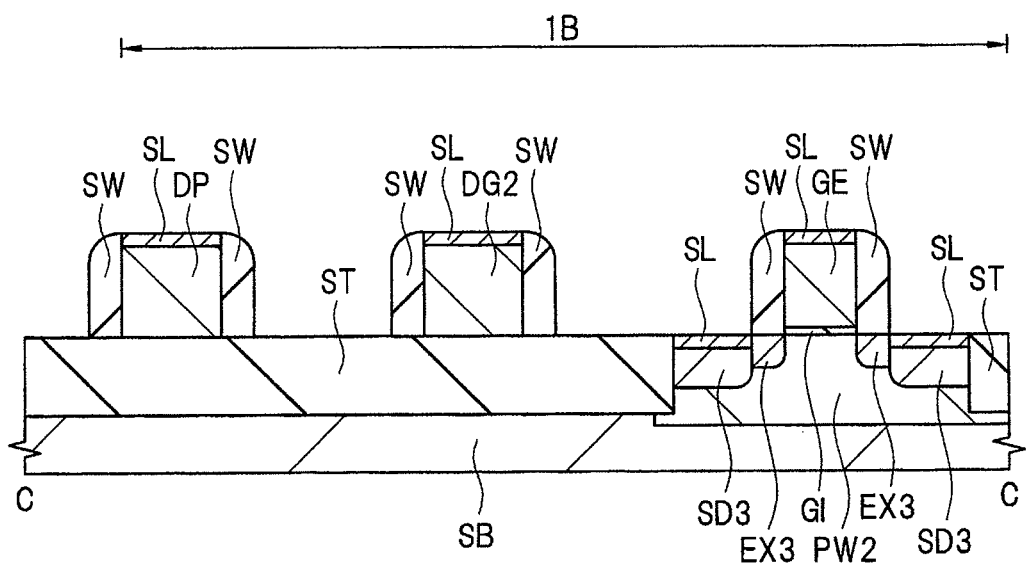
FIG. 60 is a fragmentary cross sectional view for a main portion of the semiconductor device identical with that of FIG. 58 during the manufacturing step thereof.

Then, as illustrated in FIG. 58 to FIG. 60, a metal silicide layer SL is formed (step S17 in FIG. 3). The metal silicide layer SL can be formed as described below.

At first, a metal film for forming the metal silicide layer SL is formed over the entire main surface of the semiconductor substrate SB including each of the upper surfaces (surfaces) of the $n^+$-type semiconductor regions SD1, SD2, and SD3, the control gate electrode CG, the memory gate electrode MG, and the gate electrode GE. The metal film for forming the metal silicide layer SL is formed so as to cover the $n^+$-type semiconductor regions SD1, SD2, and SD3, the control gate electrode CG, the memory gate electrode MG, the gate electrode GE, the dummy electrodes DG1 and DG2, the dummy pattern DP, and the side wall spacers SW. The metal film for forming the metal silicide layer SL comprises, for example, a cobalt (Co) film, a nickel (Ni) film, or a nickel-platinum alloy film, and can be formed by using a sputtering method, etc. Then, by applying a heat treatment to the semiconductor substrate SB, each of the upper layer portions (surface layer portions) of the $n^+$-type semiconductor region SD1, SD2, and SD3, the control gate electrode CG, the memory gate electrode MG, and the gate electrode GE is reacted with the metal film for forming the metal silicide layer SL. The metal silicide layer SL is formed to each of the upper portions (upper surfaces, surfaces, upper layer portions) of the $n^+$-type semiconductor regions SD1, SD2, and the SD3, the control gate electrode CG, the memory gate electrode MG, and the gate electrode GE. The metal silicide layer SL can be, for example, a cobalt silicide layer, nickel silicide layer, or a platinum-added nickel silicide layer (nickel silicide layer containing platinum). Then, an unreacted metal film (metal film for forming metal silicide layer SL) is removed, for example, by wet etching, etc. FIG. 58 to FIG. 60 illustrate cross sectional views at the stage. Further, after removing the unreacted metal film (metal film for forming the metal silicide layer SL), a heat treatment may be applied further.

As described above, by performing a so-called salicide (self-aligned salicide) process, the metal silicide layer can be formed to each of the upper portions of the $n^+$-type semiconductor regions SD1, SD2, and SD3, the control gate electrode CG, the memory gate electrode MG, and the gate electrode GE, thereby lowering the resistance of the source and drain and each of the gate electrodes (CG, MG, GE).

The metal silicide layer SL may or may not be formed over the dummy gate electrode DG1, the dummy gate electrode DG2, and the dummy pattern DP. When the metal film for forming the metal silicide layer SL described above is formed in a state where the dummy gate electrode DG1, the dummy gate electrodes DG2, and the dummy patter DP have an exposed portion, the metal silicide layer SL is formed also to the exposed portion. That is, when the metal film for forming the metal silicide layer SL is formed in a state of exposing the upper surfaces of the dummy gate electrode DG1, the dummy gate electrode DG2, and the dummy pattern DP, the metal silicide layer SL described above is formed also on the upper surfaces thereof. However, since the dummy gate electrode DG1, the dummy gate electrode DG2, and the dummy pattern DP not intended to function as the gate electrode, the metal silicide layer SL may not be formed for lowering the resistance. Accordingly, it is possible not to form the metal silicide layer SL over the dummy gate electrode DG1, the dummy gate electrode DG2, and the dummy pattern DP by forming the metal film for forming the metal silicide layer SL described above after covering the dummy gate electrode DG1, the dummy gate electrode DG2, and the dummy pattern DP by the insulation film. Further, the dummy gate electrode DG1, the dummy gate electrode DG2, and the dummy pattern DP having the metal silicide layer SL formed thereon and those not having the metal silicide layer thereon SL can be present together.

Figure 61:
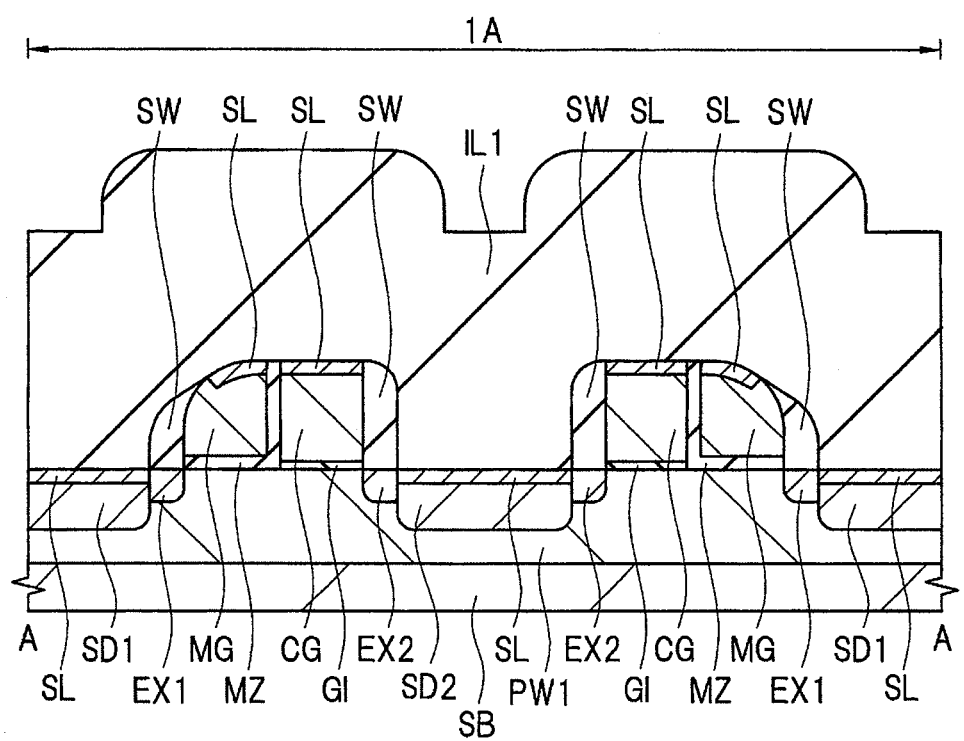
FIG. 61 is a fragmentary cross sectional view for a main portion of the semiconductor device during the manufacturing step thereof succeeding to that of FIG. 58.
Figure 62:
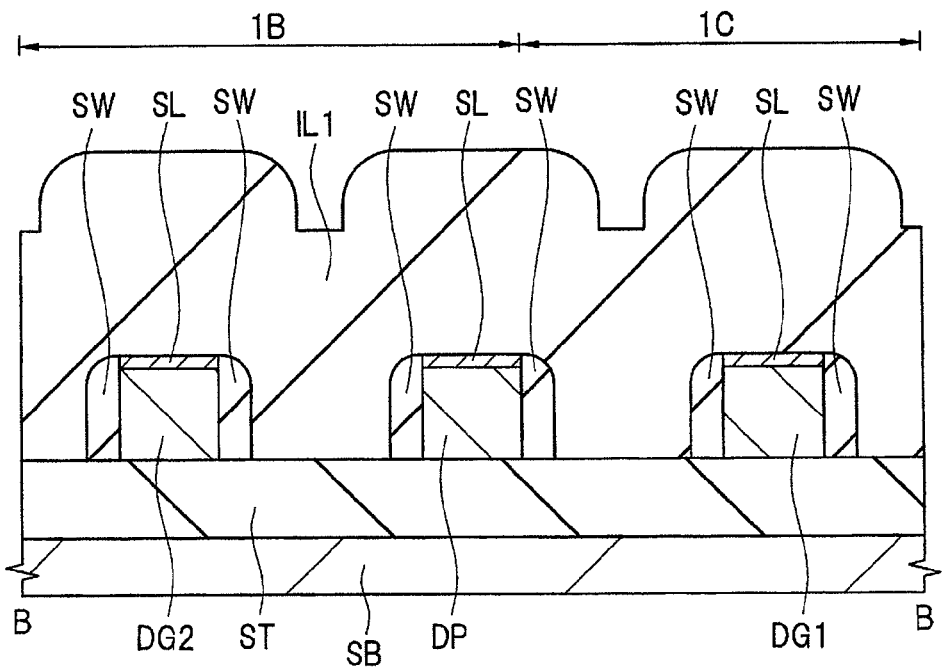
FIG. 62 is a fragmentary cross sectional view for a main portion of the semiconductor device identical with that of FIG. 61 during the manufacturing step thereof.
Figure 63:
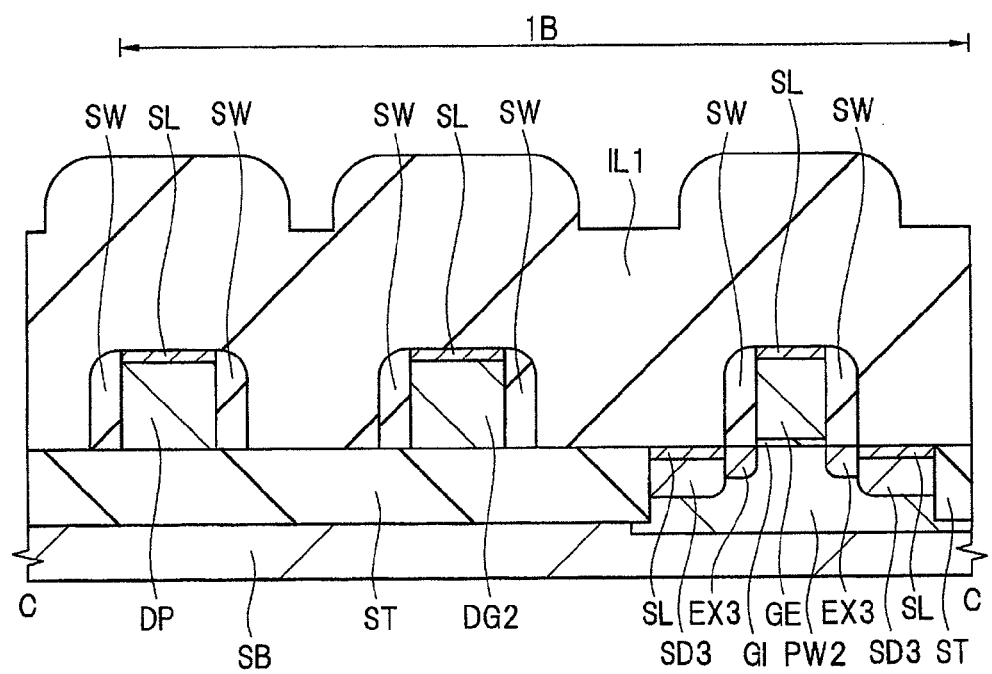
FIG. 63 is a fragmentary cross sectional view for a main portion of the semiconductor device identical with that of FIG. 61 during the manufacturing step thereof.

Then, as illustrated in FIG. 61 to FIG. 63, an interlayer insulation film (insulation film) IL1 is formed (deposited) as an insulation film over the entire main surface of the semiconductor substrate SB so as to cover the control gate electrode CG, the memory gate electrode MG, the gate electrode GE, the dummy gate electrodes DG1 and DG2, the dummy pattern DP, and the side wall spacers SW (step S18 in FIG. 3).

The interlayer insulation film IL1 comprises a single film of a silicon oxide film or a lamination film of a silicon nitride film and a silicon oxide film formed on the silicon nitride film to a thickness larger than that of the silicon nitride film, or the like and can be formed, for example, by using CVD.

Figure 64:
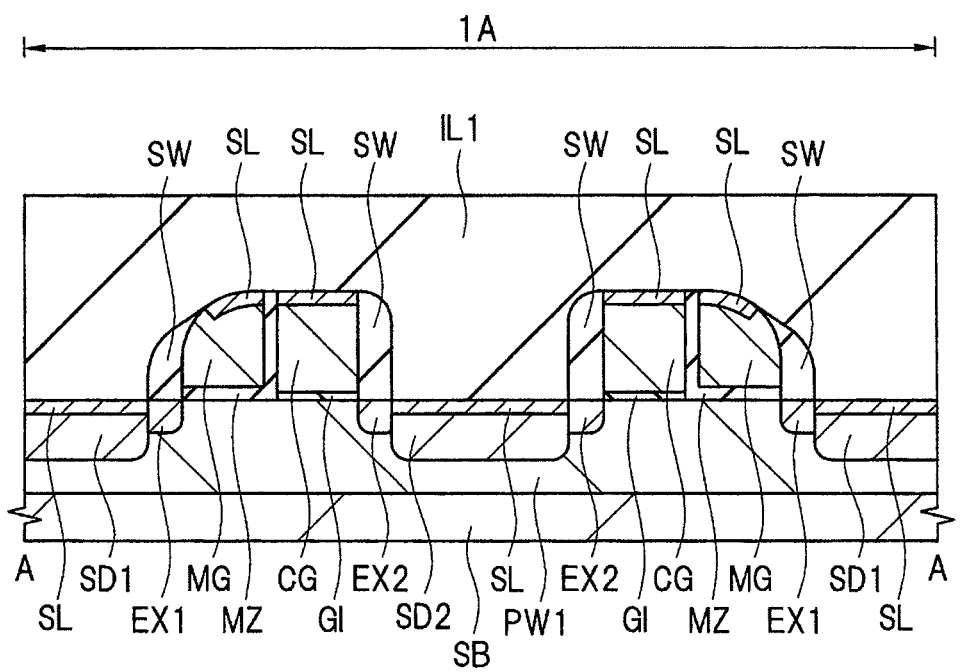
FIG. 64 is a fragmentary cross sectional view for a main portion of the semiconductor device during the manufacturing step thereof succeeding to that of FIG. 61.
Figure 65:
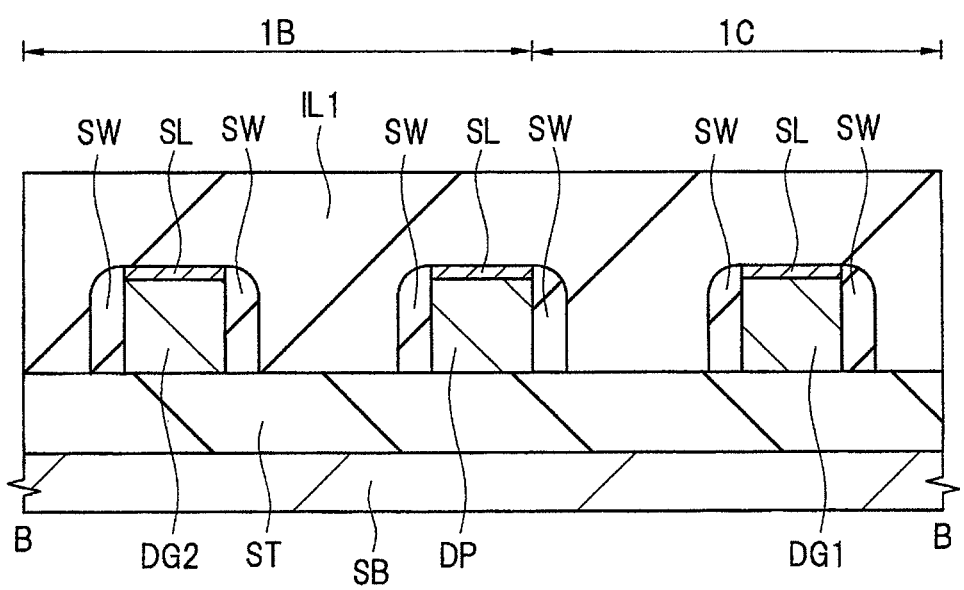
FIG. 65 is a fragmentary cross sectional view for a main portion of the semiconductor device identical with that of FIG. 64 during the manufacturing step thereof.
Figure 66:
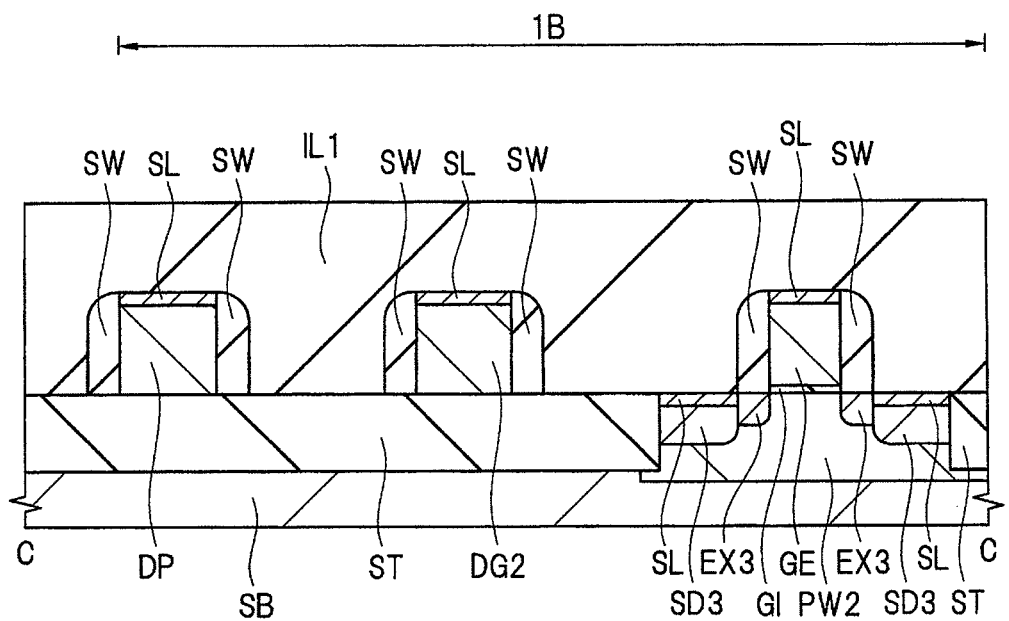
FIG. 66 is a fragmentary cross sectional view for a main portion of the semiconductor device identical with that of FIG. 64 during the manufacturing step thereof.

Then, as illustrated in FIG. 64 to FIG. 66, the upper surface of the interlayer insulation film IL1 is polished by using, for example, a CMP (Chemical Mechanical Polishing) method (step S19 in FIG. 3). Thus, the upper surface of the interlayer insulation film IL1 can, be planarized further.

At a stage of depositing the interlayer insulation film IL1 at the step S18, unevenness or step is formed at the upper surface of the interlayer insulation film IL1 that reflects the control gate electrode CG, the memory gate electrode MG, the gate electrode GE, the dummy gate electrodes DG1 and DG2, the dummy pattern DP, and the side wall spacers SW. By polishing the upper surface of the interlayer insulation film IL1 at the step S19, for example, by the CMP method, the upper surface of the interlayer insulation film IL1 can be planarized.

Figure 67:
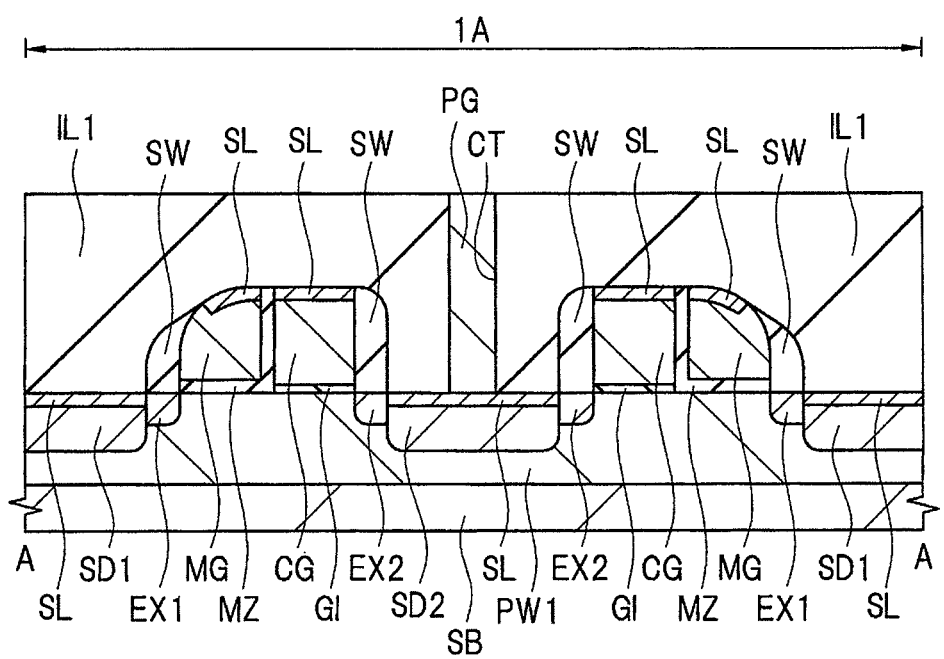
FIG. 67 is a fragmentary cross sectional view for a main portion of the semiconductor device during the manufacturing step thereof succeeding to that of FIG. 64.
Figure 68:
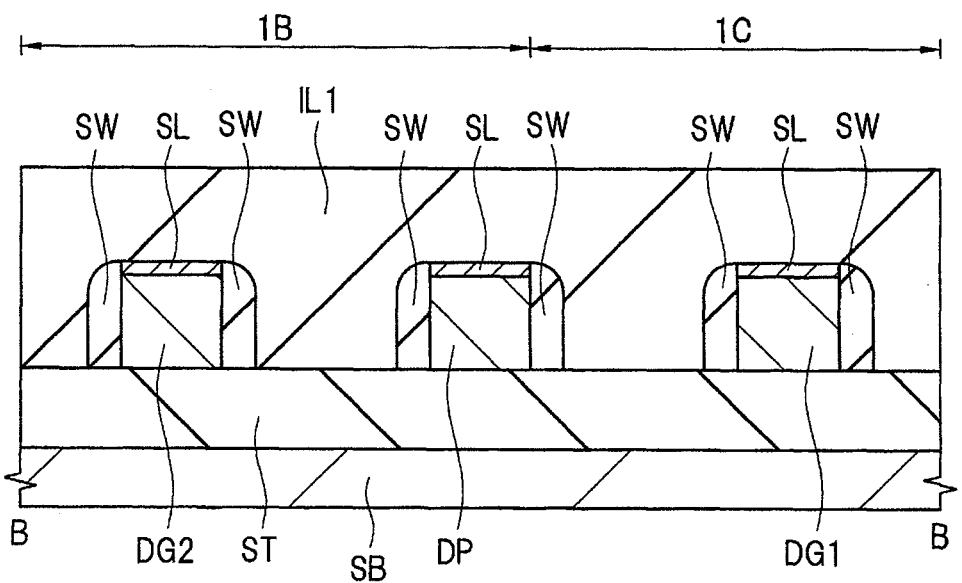
FIG. 68 is a fragmentary cross sectional view for a main portion of the semiconductor device identical with that of FIG. 67 during the manufacturing step thereof.
Figure 69:
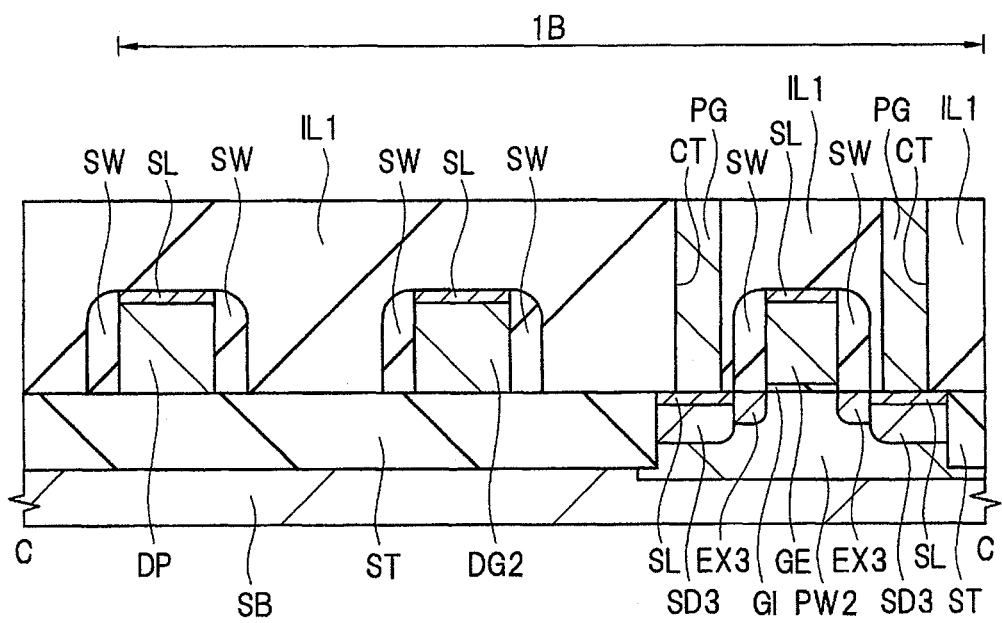
FIG. 69 is a fragmentary cross sectional view for a main portion of the semiconductor device identical with that of FIG. 67 during the manufacturing step thereof.

Then, as illustrated in FIG. 67 to FIG. 69, contact holes (openings, through holes) CT are formed in the interlayer insulation film IL1 by using photolithography and etching technique (step S20 in FIG. 3).

At the step S20, after forming a photoresist pattern (not illustrated) over the interlayer insulation film IL1 by using photolithography, etc., the interlayer insulation film IL1 is etched (preferably dry etched) by using the photoresist pattern as an etching mask to form the contact holes CT in the interlayer insulation film IL1. The contact hole CT is formed so as to penetrate the interlayer insulation film IL1.

Then, a conductive plug PG comprising tungsten (W) or the like is formed as a conductor portion used for connection in the contact hole CT (step S21 in FIG. 3).

For forming the plug PG, a barrier conductor film (for example, a titanium film, titanium nitride film, or a lamination film thereof) is formed over the insulation film IL1 including the inside (bottom and side wall) of the contact hole CT. Then, after forming a main conductor film comprising a tungsten film, etc. over the barrier conductor film so as to fill the contact hole CT, the plug PG can be faulted by removing unnecessary main conductor film and the barrier conductor film at the outside of the contact hole CT by CMP, etching back, or the like. Thus, the plug PG comprising the main conductor film buried and left in the contact hole CT and the barrier conductor film is formed. Plug PG is buried in the contact hole CT. For the sake of simplifying the drawing, the barrier conductor film and the main conductor film (tungsten film) constituting the plug PG are shown integrally in FIG. 67 to FIG. 69.

Contact holes CT and plugs PG buried therein are formed, for example, over the n$^+$-type semiconductor regions SD1, SD2, and SD3, the control gate electrode CG, the memory gate electrode MG, the gate electrode GE, etc. At the bottom of the contact hole CT, a portion of the main surface of the semiconductor substrate SB, for example, the n$^+$-type semiconductor regions SD1, SD2, and SD3 (metal silicide layer SL on the surface thereof), a portion of the control gate electrode CG (metal silicide layer SL on the surface thereof), a portion of the memory gate electrode MG (metal silicide layer SL on the surface thereof), or a portion of the gate electrode GE (metal silicide layer SL on the surface thereof) etc. are exposed. The cross sectional view of FIG. 67 illustrates a cross section in which a portion of the n$^+$-type semiconductor regions SD2 (metal silicide layer SL thereof) is exposed at the bottom of the contact hole CT and electrically connected with the plug PG that fills the contact hole. CT. The cross sectional view of FIG. 69 illustrates a cross section in which a portion of the n$^+$-type semiconductor regions SD3 (metal silicide layer SL1 over the surface thereof) is exposed at the bottom of the contact hole CT and electrically connected with the plug PG that fills the contact hole CT.

Then, an interconnect (interconnect layer) M1 as an interconnect at the first layer is formed over the insulation film IL7 in which the plug PG is buried (step S22 in FIG. 3). Description is to be made to a case of forming the interconnect M1 by using a damascene technique (single damascene technique in this embodiment).

Figure 70:
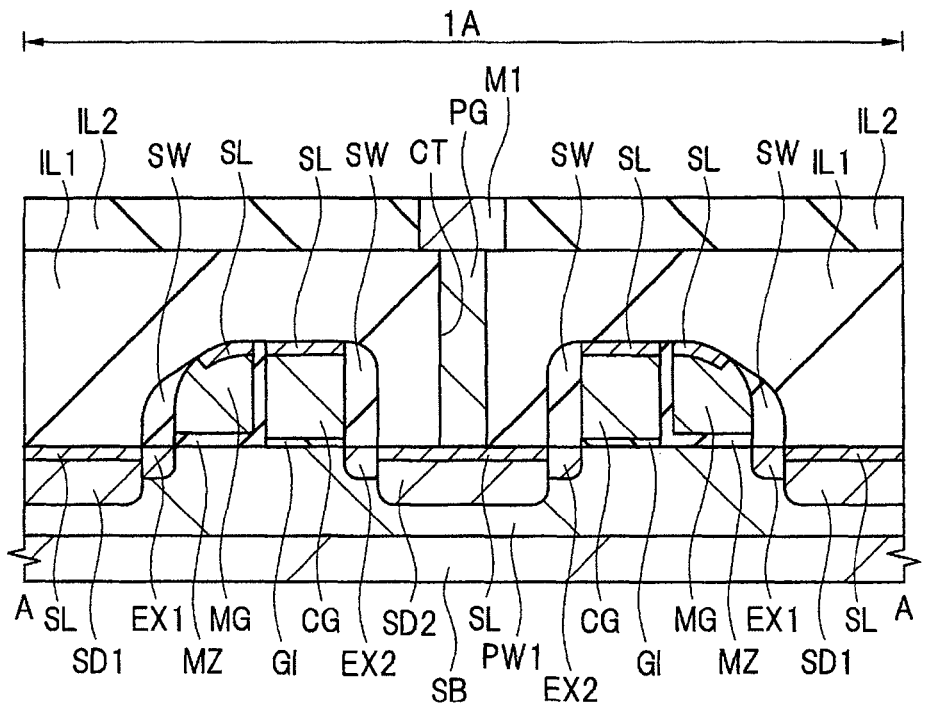
FIG. 70 is a fragmentary cross sectional view for a main portion of the semiconductor device during the manufacturing step thereof succeeding to that of FIG. 67.
Figure 71:
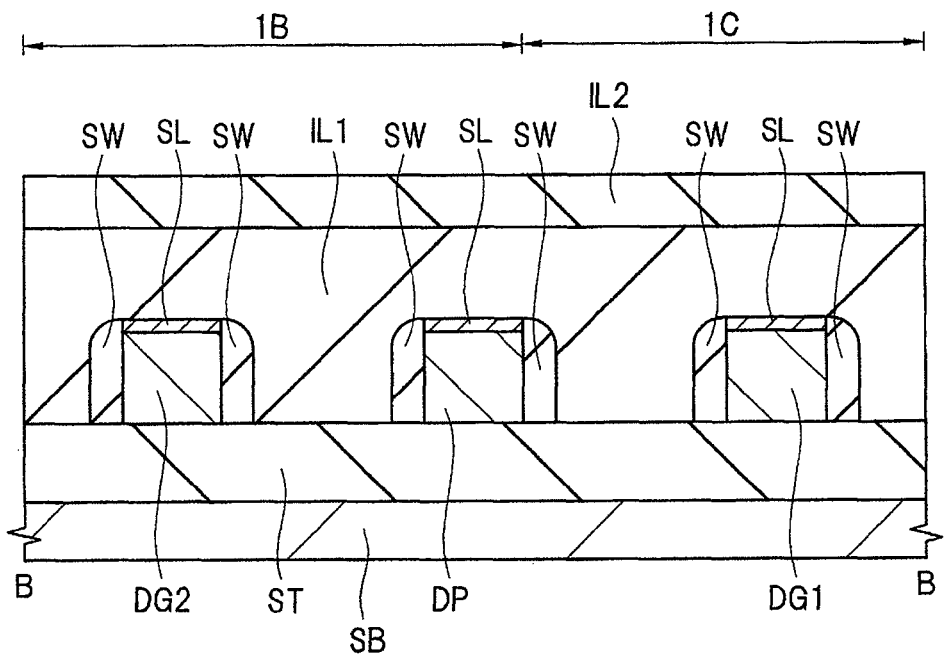
FIG. 71 is a fragmentary cross sectional view for a main portion of the semiconductor device identical with that of FIG. 70 during the manufacturing step thereof.

At first, as illustrated in FIG. 70 to FIG. 72, an insulation film IL2 is formed over the insulation film IL1 in which the plug PG is buried. The insulation film IL2 can be formed of a lamination film comprising a plurality of insulation films. Then, after forming an interconnect trench (trench used for interconnect) in a predetermined region of the insulation film IL2 by dry etching using a photoresist pattern as an etching mask (not illustrated), a barrier conductor film (for example, a titanium nitride film, a tantalum film, a tantalum nitride film, etc.) is formed over the insulation film IL2 including the portion over the bottom and the side wall of the interconnect trench. Then, a copper seed layer is formed over the barrier conductor film by CVD, sputtering, etc., and a copper plating film is further formed on the seed layer by using electroplating to fill the inside of the interconnect trench with the copper plating film. Then, the main conductor film (copper plating film and the seed layer) and the barrier conductor film in the regions other than the interconnect trench are removed by CMP to form the interconnect M1 at the first layer comprising copper filled in the trench groove as a main conductor material. For the sake of simplifying the drawing, the interconnect M1 is illustrated as an integrated lamination layer of a barrier conductor film, a seed layer, and a copper plating film in FIG. 70 to FIG. 72.

The interconnect M1 is electrically connected by way of the plug PG to the source region (n$^+$-type semiconductor region SD1) of the memory transistor, the drain region (n$^+$-type semiconductor region SD2) of the control transistor, the source-drain region (n$^+$-type semiconductor region SD3) of the MISFET in the peripheral circuit region 1B, the control gate electrode CG, the memory gate electrode MG, the gate electrode GE, etc. Then, interconnects at and after the second layer are formed by a dual damascene method, etc., but they are not illustrated and described herein. Further, the interconnect M1 and the interconnects in upper layers can be formed not only by the damascene interconnect but also by patterning a conductor film used for the interconnect, for example, as a tungsten interconnect or an aluminum interconnect.

The semiconductor device of this embodiment is manufactured as described above.

<Structure of Semiconductor Device>

The structure of the semiconductor device of this embodiment is to be described.

At first, the structure of the memory cell of the non-volatile memory in the semiconductor device of this embodiment is to be described with reference to FIG. 73 and FIG. 74.

Figure 73:
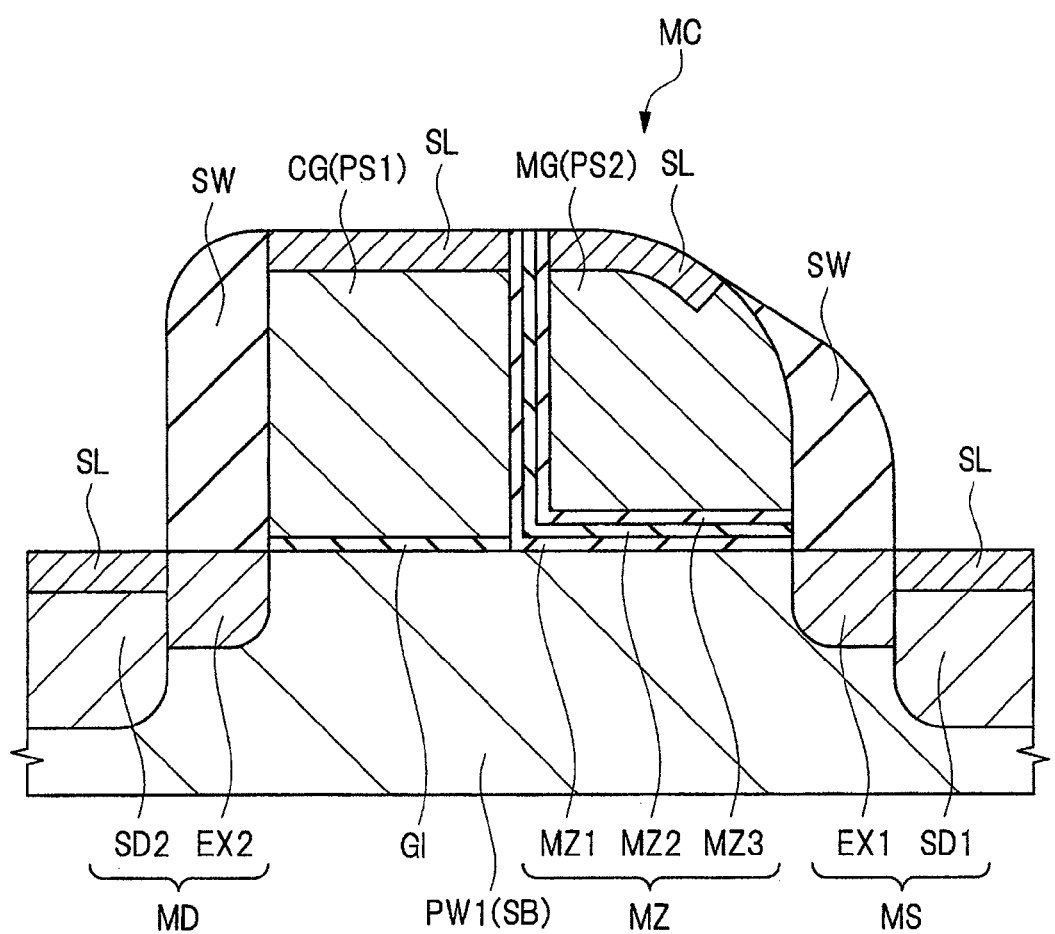
FIG. 73 is a fragmentary cross sectional view for a main portion of the semiconductor device as a preferred embodiment.

FIG. 73 is a fragmentary cross sectional view for a main portion of the semiconductor device of this embodiment, which illustrates a fragmentary cross sectional view for a main portion of the memory cell region 1A. FIG. 74 is an equivalent circuit diagram of the memory cell. While FIG. 70 illustrates a region forming two memory cells having the n$^+$-type semiconductor region SD2 in common, FIG. 73 and FIG. 74 illustrate one of the memory cells. For simplifying the drawing, the insulation film IL1, the insulation film IL2, the contact hole CT, the plug PG, and the interconnect M1 in the structure shown in FIG. 70 are not illustrated in the drawing.

As illustrated in FIG. 73, a memory cell MC of a non-volatile memory comprising the memory transistor and the control transistor is formed over the semiconductor substrate SB in the memory cell region 1A. A plurality of memory cells MC are actually formed in an array to the semiconductor substrate SB in the memory cell regions 1A.

Figures 74, 75:
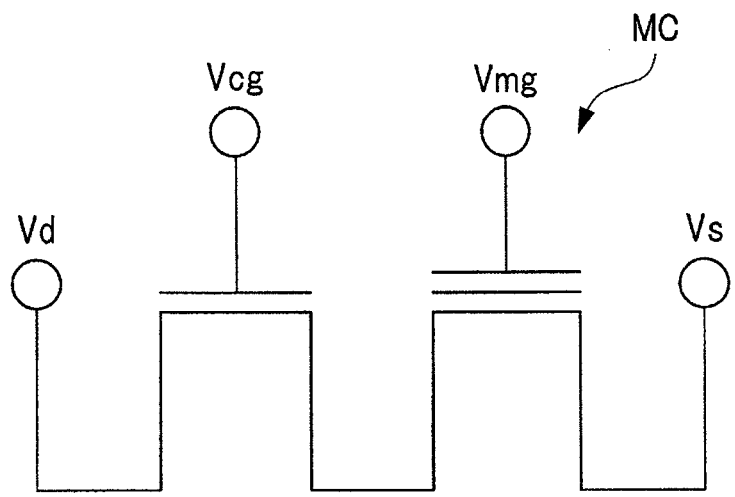
FIG. 74 is an equivalent circuit diagram of a memory cell.
FIG. 75 is a table showing examples of conditions for application of voltages to respective portions of a selection memory cell for "write", "erase" and "read"

As illustrated in FIG. 73 and FIG. 74, the memory cell MC of the non-volatile memory in the semiconductor device of this embodiment is a split gate type memory cell in which two MISFETs, i.e., a control transistor having a control gate electrode CG and a memory transistor having a memory gate electrode MG are connected.

The MISFET having the gate insulation film including a charge accumulation portion (charge accumulation layer) and the memory gate electrode MG is referred to as a memory transistor, and the MISFET having the gate insulation film and the control gate electrode CG is referred to as a control transistor. Accordingly, the memory gate electrode MG is a gate electrode of the memory transistor and the control gate electrode CG is a gate electrode of the control transistor, and the control gate electrode CG and the memory gate electrode MG are gate electrodes forming the memory cell of the non-volatile memory.

Since the control transistor is a transistor for selecting memory cells, it can be regarded as a selection transistor. Accordingly, the control gate electrode CG can also be regarded as a selection gate electrode. The memory cell transistor is a memory transistor.

The configuration of the memory cell MC is to be described specifically.

As illustrated in FIG. 73, the memory cell MC of the non-volatile memory has n-type semiconductor regions MS and MD for source and drain formed in a p-type well PW1 of the semiconductor substrate SB, the control gate electrode CG formed over the semiconductor substrate SB (p-type well PW1) and the memory gate electrode MG formed over the semiconductor substrate SB (p-type well PW1) and adjacent to the control gate electrode CG. Then, the memory cell MC of the non-volatile memory further has an insulation film (gate insulation film) GI formed between the control gate electrode CG and the semiconductor substrate SB (p-type well PW1), and an insulation film MZ formed between the memory gate electrode MG and the semiconductor substrate SB (p-type well PW1) and between the memory electrode MG and the control gate electrode CG.

The control gate electrode CG and the memory gate electrode MG extend along the main surface of the semiconductor substrate SB and arranged side by side in a state where the insulation film MZ is interposed between the opposing side surfaces of them. The control gate electrode CG and the memory gate electrode MG are formed over the semiconductor substrate SB (p-type well PW1) between the semiconductor region MD and the semiconductor region MS by way of the insulation film GI or the insulation film MZ, in which the memory gate electrode MG is situated on the side of the semiconductor region MS and the control gate electrode CG is situated on the side of the semiconductor region MD. The control gate electrode CG is formed by way of the insulation film GI and the memory gate electrode MG is formed by way of the insulation film MZ over the semiconductor substrate SB.

The control gate electrode CG and the memory gate electrode MG are adjacent to each other with the insulation film MZ being interposed therebetween. The insulation film MZ extends for both regions, that is, a region between the memory gate electrode MG and the semiconductor substrate SB (p-type well PW1) and a region between the memory gate electrode MG and the control gate electrode CG.

The insulation film GI formed between the control gate electrode CG and the semiconductor substrate SB (p-type well PW1), that is, the insulation film GI below the control gate electrode CG functions as a gate insulation film of the control transistor. Further, the insulation film MZ between the memory gate electrode MG and the semiconductor substrate SB (p-type well PW1), that is, the insulation film MZ below the memory gate electrode MG functions as a gate insulation film (gate insulation film having a charge accumulation portion in the inside) of the memory transistor. The insulation film MZ between the memory gate electrode MG and the semiconductor substrate SB (p-type well PW1) functions as the gate insulation film of the memory transistor. The insulation film MZ between the memory gate electrode MG and the control gate electrode CG functions as an insulation film for insulating (electrically separating) the memory gate electrode MG and the control gate electrode CG from each other.

In the insulation film MZ, a silicon nitride film MZ2 is an insulation film that accumulates charges and functions as a charge accumulation layer (charge accumulation portion). That is, the silicon nitride film MZ2 is a trapping insulation film formed in the insulation film MZ. Therefore, the insulation film MZ can be regarded as an insulation film having a charge accumulation portion in the inside (silicon nitride film MZ2 in this embodiment).

A silicon oxide film MZ3 and a silicon oxide film MZ1 situated above and below the silicon nitride film MZ2 can function as a charge blocking layer or charge confining layer. In the insulation film MZ between the memory gate electrode MG and the semiconductor substrate SB, charges can be accumulated in the silicon nitride film MZ2 by providing a structure of sandwiching the silicon nitride film MZ2 between the silicon oxide film MZ3 and the silicon oxide film MZ1.

The semiconductor region MS and the semiconductor region MD are semiconductor regions for the source and the drain. That is, the semiconductor region MS is a semiconductor region that functions as one of the source region or the drain region and the semiconductor region MD is a semiconductor region that functions as the other of the source region or the drain region. In this embodiment, the semiconductor region MS is a semiconductor region that functions as the source region and the semiconductor region MD is a semiconductor region that functions as the drain region. The semiconductor regions MS and MD each comprise a semiconductor region in which n-type impurities are introduced and have a LDD structure respectively. That is, the semiconductor region MS as the source has a n$^-$-type semiconductor region EX1 (extension region) and a n$^+$-type semiconductor region SD1 (source region) having an impurity concentration higher than that of the n$^-$-type semiconductor region EX1. Further, the semiconductor region MD as the drain has a n-type semiconductor region EX2 (extension region) and a n$^+$-type semiconductor region SD2 (drain region) having an impurity concentration higher than that of the n$^-$-type semiconductor region EX2.

The semiconductor region MS is a semiconductor region used for the source or the drain and formed in the semiconductor substrate. SB at a position adjacent to the memory gate electrode MG in the longitudinal direction of the gate (longitudinal direction of the memory gate electrode MG). Further, the semiconductor region MD is a semiconductor region for the source or the drain and formed in the semiconductor substrate SB at a position adjacent to the control gate electrode CG in the longitudinal direction of the gate (longitudinal direction of the gate of the control gate electrode CG).

A side wall spacer SW comprising an insulator (insulation film) is formed to the side walls on the side of the memory gate electrode MG and the control gate electrode CG not adjacent to each other.

The n⁻-type semiconductor region EX1 of the source portion is formed in self-alignment to the memory gate electrode MG, and the n⁺-type semiconductor region SD1 is formed in self-alignment to the side wall spacer SW on the side wall of the memory gate electrode MG. Therefore, in the manufactured semiconductor device, the n⁻-type semiconductor region EX1 at a low concentration is formed below the side wall spacer SW on the side wall of the memory gate electrode MG, and the n⁺-type semiconductor region SD1 at a high concentration is formed to the outside of the n⁻-type semiconductor region EX1 at a low concentration. Accordingly, the n⁻-type semiconductor region EX1 at the low concentration is formed so as to be adjacent to the channel region of the memory transistor and the n⁺-type semiconductor region SD1 at the high concentration is formed so as to be adjacent to the n⁻-type semiconductor region EX1 at the low concentration and is spaced from the channel region of the memory transistor by so much as the n⁻-type semiconductor region EX1.

The n⁻-type semiconductor region EX2 for the drain portion is formed in self-alignment to the control gate electrode CG, and the n⁺-type semiconductor region SD2 is formed in self-alignment to the side wall spacer SW on the side wall of the control gate electrode CG. Therefore, in the manufactured semiconductor device, the n⁻-type semiconductor region EX2 at the low concentration is formed below the side wall spacer SW on the side wall of the control gate electrode CG, and the n⁺-type semiconductor region SD2 at the high concentration is formed to the outside of the n⁻-type semiconductor region EX2 at the low concentration. Accordingly, the n⁻-type semiconductor region EX2 at the low concentration is formed so as to be adjacent to the channel region of the control transistor, and the n⁺-type semiconductor region SD2 at the high concentration is formed so as to be adjacent to the n⁻-type semiconductor region EX2 at the low concentration and spaced from the channel region of the control transistor by so much as the n⁻-type semiconductor region EX2.

A channel region of the memory transistor is formed below the insulation film MZ below the memory gate electrode MD, while a channel region of the control transistor is formed below the insulation film GI below the control gate electrode CG.

A metal silicide layer SL1 is formed over the n⁺-type semiconductor regions SD1, SD2, and SD3, over the memory gate electrode MG, and over the control gate electrode CG by a salicide technique, etc.

Although not illustrated in FIG. 73, the interlayer insulation film IL1 is formed as an insulation film above the semiconductor substrate SB so as to cover the control gate electrode CG, the memory gate electrode MG, and the side wall spacer SW as illustrated in FIG. 70. Then, the contact hole CT is formed in the interlayer insulation film IL1 and the plug PG is buried in the contact hole CT. The insulation film IL2 and the interconnect M1 are formed over the interlayer insulation film IL1 in which the plug PG is buried.

In the semiconductor substrate in this embodiment, a MISFET having a gate electrode GE is formed in the peripheral circuit region 1B as illustrated in FIG. 72. The gate electrode GE is formed of the silicone film PS1 used for forming the control gate electrode CG. Therefore, the gate electrode GE is formed of a conductive film coplanar with the control gate electrode CG (silicon film PS1 in this embodiment). The gate electrode GE is formed to the semiconductor substrate SB (p-type well PW2) by way of the gate insulation film (insulation film GI in this embodiment). The source-drain region of the MISFET having the gate electrode GE is formed of the n⁻-type semiconductor region EX3 and the n⁻-type semiconductor region SD3 at an impurity concentration higher than that of the n⁻-type semiconductor region EX3, and the insulation film GI below the gate electrode GE functions as the gate insulation film of the MISFET.

In the semiconductor device of this embodiment, a dummy gate electrode DG2 is also formed in the peripheral circuit region 1B as illustrated in FIG. 72. The dummy gate electrode DG2 is formed of a conductive film (silicone film PSa in this embodiment coplanar with the gate electrode GE. That is, the dummy gate electrode DG2 and the gate electrode GE are formed by patterning an identical conductive film (silicon film PS1a in this embodiment). That is, the gate electrode GE and the dummy gate electrode DG2 are formed by using the silicon film PS1 used for forming the control gate electrode CG. Accordingly, not only the gate electrode GE but also the dummy gate electrode DG2 are formed of a conductive film (silicon film PS1) coplanar with the control gate electrode CG. That is, the control gate electrode CG, the gate electrode GE, and the dummy gate electrode DG2 are formed of a coplanar conductive film (silicon film PS1 in this embodiment).

The dummy gate electrode DG2 is formed by using a conductive film (silicon film PS1a in this embodiment) coplanar with the gate electrode GE at an identical step but this does not function as a gate electrode of a transistor but is a dummy (pseudo) gate electrode. That is, the dummy gate electrode DG2 does not function as a constituent element of the semiconductor device. Therefore, the dummy gate electrode DG2 is put to a floating potential. The dummy gate electrode DG2 is formed over the device isolation region ST or the substrate region of the semiconductor substrate ST (Si substrate region). When it is formed over the substrate region (Si substrate region), an insulation film (insulation film GI in this embodiment) is interposed between the dummy gate electrode DG2 and the substrate region (Si substrate region).

Further, in the semiconductor device of this embodiment, as illustrated in FIG. 71, the dummy gate electrode DG1 is formed in the dummy forming region 1C. The dummy gate electrode DG1 is formed of a conductive film (silicon film PS1 in this embodiment) coplanar with the control gate electrode CG (silicon film PS1 in this embodiment). That is, the control gate electrode CG and the dummy gate electrode DG1 are formed by patterning an identical conductive film (silicon film PS1).

Therefore, the control gate electrode CG, the gate electrode GE, the dummy gate electrode DG2, and the dummy gate electrode DG1 are formed of a coplanar conductive film (silicon film PS1 in this embodiment). That is, each of the control gate electrode CG, the gate electrode GE, the dummy gate electrode DG2, the dummy gate electrode DG1 is formed of the silicon film PS1 (silicon film pattern PS1).

While the dummy gate electrode DG1 is formed by using a conductive film (silicon film PS1 in this embodiment) coplanar with the control gate electrode CG in an identical step, the dummy gate electrode DG1 does not function as a gate electrode of a transistor but this is a dummy (pseudo) gate electrode. That is, the dummy gate electrode DG1 does not function as a constituent element of the semiconductor device. Therefore, the dummy gate electrode DG1 is put to a floating potential. While the dummy gate electrode DG1 is formed over the device isolation region ST or over the substrate region (Si substrate region) of the semiconductor substrate SB, when it is formed over the device isolation region ST or over the substrate region (Si substrate region) of the semiconductor substrate SB, when it is formed over the device isolation region ST or over the substrate region (Si substrate region) of the semiconductor substrate SB, when it is formed over the substrate region (Si substrate region), an insulation film (insulation film GI in this embodiment) is interposed between the dummy gate electrode DG1 and the substrate region (Si substrate region).

In this embodiment, when the gate electrode GE and the dummy gate electrode DG2 are formed by patterning the silicon film PS1a at the step 12, the dummy pattern DP is formed by leaving the outer periphery of the silicon film PS1a. Accordingly, in the semiconductor device of this embodiment, the dummy pattern DP is also formed over the semiconductor substrate SB.

The dummy pattern DP is formed by using a conductive film (silicon film PS1a in this embodiment) coplanar with the gate electrode GE but it does not function as the gate electrode of the transistor. That is, the dummy pattern DP does not function as a constituent element of the semiconductor device. Accordingly, the dummy pattern DP is put to a floating potential. The dummy pattern DP can be regarded also as a dummy (pseudo) of the gate electrode, that is, a dummy gate electrode.

The dummy pattern DP is formed of a conductive film (silicon film PS1a in this embodiment) coplanar with the gate electrode GE and the gate electrode DG2. That is, the dummy pattern DP, the dummy gate electrode DG2, and the gate electrode GE are formed by patterning the identical conductive film (silicon film PS1a). That is, the dummy pattern DP, the gate electrode GE, and the dummy gate electrode DG2 are formed by using the silicon film PS1 used for forming the control gate electrode CG. Accordingly, not only the gate electrode GE, the dummy gate electrode DG2, and the dummy gate electrode DG1 but also the dummy pattern DP is formed of the conductive film (silicon film PS1 in this embodiment) coplanar with the control gate electrode CG. That is, the control gate electrode CG, the gate electrode GE, the dummy gate electrode DG2, the dummy gate electrode DG1, and the dummy pattern DP are formed of a coplanar conductive film (silicon film PS1 in this embodiment).

The dummy pattern DP is formed over the device isolation region ST or the substrate region (Si substrate region) of the semiconductor substrate SB and, more preferably, formed over the device isolation region ST. When the dummy pattern DP is formed over the substrate region (Si substrate region), an insulation film (insulation film GI in this embodiment) is interposed between the dummy gate electrode DG2 and the substrate region (Si substrate region).

<Operation of Non-Volatile Memory>

Then, an example of operation of the non-volatile memory is to be described with reference to FIG. 75.

FIG. 75 is a table showing examples of conditions for applying voltages to respective portions of a selection memory cell upon "write", "erase", and "read" in this embodiment. The table in FIG. 75 describes a voltage Vmg applied to the memory gate electrode MG, a voltage Vs applied to the source region (semiconductor region MS), a voltage Vcg applied to the control gate electrode CG, a voltage Vd applied the drain region (semiconductor region MD), and a voltage Vb applied to the p-type well PW1 of the memory cell as illustrated in FIG. 73 and FIG. 74. Those shown in the table of FIG. 75 are preferred examples of the voltage application condition. They are not restrictive but may be optionally changed variously. Further, in this embodiment, injection of electrons to the silicon nitride film MZ2 which is the charge accumulation layer (charge accumulation portion) in the insulation film MZ of the memory transistor is defined as "write" and injection of holes (positive holes) thereto is defined as "erase".

For the writing method, a writing method of writing by hot electron injection due to source side injection referred to as an SSI (Source Side Injection) method can be used (hot electron injecting writing method). Writing is performed, for example, by applying the voltage as shown in the column for "write" in FIG. 75 to each of portions of the selection memory cell to conduct writing and injecting electrons into the silicon nitride film MZ2 in the insulation film MZ of the selection memory cell. In this case, the hot electrons are generated in the channel region (between the source and the drain) below the two gate electrodes (memory gate electrodes MG and control gate electrode CG), and the hot electrons are injected into the silicon nitride film MZ2 as the charge accumulation layer (charge accumulation portion) in the insulation film MZ below the memory gate electrode (MG). The injected hot electrons (electrons) are trapped at the trapping level in the silicon nitride film MZ2 in the insulation film MZ and, as a result, the threshold voltage of the memory transistor is increased. That is, the memory transistor is put to a writing state.

For the erasing method, an erasing method erasing by hot hole injection due to BTBT (Band-To-Band Tunneling Phenomenon) referred to as a BTBT method can be used (hot hole injection erasing method). That is, erasing is performed by injecting holes (positive holes) generated by BTBT (Band-To-Band Tunneling Phenomenon) into the charge accumulation portion (silicon nitride film MZ2 in the insulation film MZ). For example, the voltage shown in the column "erase" in FIG. 75 is applied to each the portions of the selection memory cell for performing erasing, and holes (positive holes) are generated by the BTBT phenomenon, accelerated under electric field thereby injecting holes into the silicon nitride film MZ2 in the insulation film MZ of the selection memory cell and, as a result, the threshold voltage of the memory transistor is decreased. That is, the memory transistor is put to an erasing state.

Upon reading, the voltage, for example, shown in the column "read" in FIG. 75 is applied to each of the portions of the selection memory cell to be read. The writing state and the erasing state can be discriminated by defining the voltage V mg applied to the memory gate electrode MG upon reading to a value between the threshold voltage of the memory transistor in the writing state and the threshold voltage of the memory transistor in the erasing state.

<Main Feature and Advantageous Effect>

Main features and advantageous effects of this embodiment are to be described.

The manufacturing step of this embodiment is a step of manufacturing the semiconductor device comprising the memory cell of the non-volatile memory formed in the memory cell region 1A (first region) of the semiconductor substrate SB and the MISFET formed in the peripheral circuit region 1B (second region) of the semiconductor substrate SB. That is, in the manufacturing step of this embodiment, the memory cell of the non-volatile memory and the MISFET in the peripheral circuit are formed in one identical semiconductor substrate SB.

In the manufacturing step of this embodiment, the silicon film PS1 is formed as a first film which is a film used in common for the control gate electrode CG (first gate electrode) of the non-volatile memory and for the gate electrode GE of the MISFET (third gate electrode) over the main surface of the semiconductor substrate SB. Then, by patterning the silicon film PS1 (first film), the control gate electrode CG (first gage electrode) is formed in the memory cell region 1A (first region), the dummy gate electrode DG1 (first dummy gate electrode) is formed in the dummy forming region 1C (third region), and the silicon film PS1a (first film pattern) is formed in the peripheral circuit region 1B (second region). Then, the memory gate electrode MG (second gate electrode) adjacent to the control gate electrode CG (first gate electrode) of the non-volatile memory is formed. Subsequently, by patterning the silicon film silicon film PS1a (first film pattern), the gate electrode GE (third gate electrode) of the MISFET and the dummy gate electrode DG2 (second dummy gate electrode) are formed in the peripheral circuit region 1B (second region).

As one of the main features of the manufacturing step of this embodiment, the gate electrode (control gate electrode CG in this embodiment) of the non-volatile memory and the gate electrode (gate electrode GE in this embodiment) of the MISFET in the peripheral circuit are formed by using the first film (silicon film PS1 in this embodiment) as a common film. When the gate electrode (control gate electrode CG) of the non-volatile memory is formed by patterning the first film (silicon film PS1), the dummy gate electrode DG1 is also formed together. That is, the control gate electrode CG and the dummy gate electrode DG1 are formed simultaneously in the identical step by using the identical film (silicon film PS1 in this embodiment). This is to be referred to as a first feature.

In the other of the main features of the this embodiment when the gate electrode (control gate electrode CG) of the non-volatile memory and the dummy gate electrode DG1 are formed by patterning the first film (silicon film PS1), is also formed the first film pattern (silicon film PS1a in this embodiment). Subsequently, when the gate electrode (gate electrode GE in this embodiment) of the MISFET is formed by patterning the first film pattern (silicon film PS1a), the dummy gate electrode DG2 is also formed together. That is, the gate electrode GE and the dummy gate electrode DG2 are formed by using the identical film (silicon film PS1a in this embodiment) in the identical step. This is to be referred to as the second feature.

The technical subject as the background of adopting this embodiment is to be described and the importance of the feature and the second feature is to be explained.

Manufacture of the semiconductor device includes a step of polishing the interlayer insulation film. The polishing step at the step S19 corresponds to the step in this embodiment. After forming a protrusion pattern such as the gate electrode to the main surface of the semiconductor substrate, when the interlayer insulation film is formed so as to cover the protrusion pattern, the protrusion or step is formed in accordance with the underlying protrusion pattern at the upper surface of the interlayer insulation film. Accordingly, the upper surface of the interlayer insulation film is planarized by polishing the upper surface of the interlayer insulation film by a CMP method or the like. Thus, a contact hole and a plug to fill the contact hole can be formed effectively to the interlayer insulation film. For example, when photolithography is performed in a state where the unevenness is present at the surface, this causes resolution failure in the exposure step. Since the planarity at the surface of the interlayer insulation film can be improved by polishing the upper surface of the interlayer insulation film, it is possible to effectively perform the photolithographic step for forming the contact hole and the succeeding photolithographic step (photolithographic step for forming an interconnect trench, etc.) can be applied effectively.

However, in the semiconductor device, semiconductor elements are not always distributed uniformly over the entire main surface of the semiconductor substrate. That is, when the entire main surface of the semiconductor substrate is observed, not only the region in which the semiconductor elements such as transistors are present but also a region in which the semiconductor elements are not formed are present. Accordingly, in a region of the main surface of the semiconductor substrate where the protrusion pattern such as of the gate electrodes is not formed since the semiconductor devices are not formed, when the upper surface of the interlayer insulation film is polished after forming the interlayer insulation film, there may be a possibility of causing defects such as dishing. This deteriorates the planarity at the upper surface of the interlayer insulation film after the polishing.

Then, at the main surface of the semiconductor substrate, dummy gage electrodes (dummy gate electrodes DG1 and DG2 in this embodiment) are provided as a protrusion pattern to a place where the semiconductor device is not formed. Thus, defects (dishing, etc.) in the polishing step can be suppressed or prevented compared with a case of not providing the dummy gate electrode, and the planarity at the upper surface of the interlayer insulation film IL1 can be improved after polishing the interlayer insulation film IL1.

In this embodiment, the control gate electrode CG, the memory gate electrode MG, and the gate electrode GE that function as the gate electrodes of the transistor are formed on the main surface of the semiconductor substrate SB. That is, the control gate electrode CG for the non-volatile memory, the memory gate electrode MG, and the gate electrode GE for the MISFET of the peripheral circuit that function as the gate electrodes are formed on the main surface of the semiconductor substrate SB. Further, in addition to the gate electrodes (CG, MG, GE) of the transistor, the dummy gate electrodes DG1 and DG2 are also formed on the main surface of the semiconductor substrate SB. The dummy gate electrodes DG1 and DG2 do not function as the gate electrode of the transistor and do not function as the constituent elements of the semiconductor device. However, since the dummy gate electrodes DG1, DG2 are also formed in addition to the gate electrodes (CG, MG, GE) of the transistor over the main surface of the semiconductor substrate SB, defects (dishing, etc.) in the polishing step can be suppressed or prevented thereby capable of improving the planarity at the upper surface of the inter layer insulation film IL1 after polishing the interlayer insulation film IL1.

That is, in this embodiment, since the protrusion pattern such as the dummy gate electrodes DG1 and DG2 can be provided also to a portion where the semiconductor elements are not formed due to the formation of the dummy gate electrodes DG1 and DG2, defect in the polishing step (such as dishing) can be suppressed or prevented compared with a case of not providing the dummy gate electrodes DG1 and DG2. Accordingly, the planarity at the upper surface of the interlayer insulation film IL1 after polishing the interlayer insulation film IL1 can be polished.

As described above, in this embodiment, dummy gate electrodes DG1 and DG2 are adopted in order to obtain the effect of suppressing or preventing the defect (such as dishing) accompanying the polishing step of the interlayer insulation film IL1.

Further, when a semiconductor device in which the non-volatile memory and the peripheral circuit are hybridized is manufactured, when the gate electrode of the MISFET in the peripheral circuit is formed by using a film in common with the gate electrode of the non-volatile memory, the number of manufacturing steps of the semiconductor device can be decreased.

Then, in this embodiment, the control gate electrode CG used for the non-volatile memory and the gate electrode GE used for the MISFET in the peripheral circuit are formed by using a first film (silicon film PS1 in this embodiment) as a common film. Thus, the number of manufacturing steps of the semiconductor device can be decreased. Further, the manufacturing cost of the semiconductor device can be decreased. Then, while the dummy gate electrode is formed also by using the first film as the common film (silicon film PS1 in this embodiment), and the dummy gate electrode DG1 and the dummy gate electrode DG2 which are formed at different stages are used as the dummy gate electrode in this embodiment. The reason is to be explained below while referring to a further technical subject.

The semiconductor device in which the non-volatile memory and the peripheral circuit are hybridized has a region in which the non-volatile memory is formed (non-volatile memory forming region) and a region in which the peripheral circuit is formed. The memory capacity of the non-volatile memory mounted to the semiconductor device is designed in accordance with the application use of the semiconductor device. In the semiconductor device, as the memory capacity of the non-volatile memory to be mounted is larger, the area of the non-volatile memory forming region is increased. On the other hand, as the memory capacity of the non-capacity of the non-volatile memory mounted is smaller, the area of the non-volatile memory forming region is decreased. Accordingly, the ratio of the area of the non-volatile memory forming region in the entire area of the semiconductor device is different depending on the kind of the semiconductor device, etc.

In the manufacturing step of the semiconductor device, when the conductive film for forming the gate electrode (hereinafter referred to as a gate forming film) is patterned by etching using a resist pattern (for example, photoresist pattern), the state of etching the gate forming film depends on the area of the gate forming film to be etched. The area to be etched corresponds to the area of the region to be etched in the film as a target of the etching. Accordingly, when the gate forming layer is etched by using the resist pattern, the area of the gate forming film to be etched corresponds to the area of the gate forming film exposed from the opening of the resist pattern. For example, the etching rate of the gate forming film is different between case where the area of the gate forming film to be etched is large and a case where it is small. In addition, the fluctuation amount of the etching rate depending on the area of the gate forming film to be etched tends to be increased as the area of the gate forming layer to be etched is smaller. A thin insulation film for gate insulation is present below the gate forming film and a substrate region of a semiconductor substrate is present therebelow. Accordingly, overetching upon patterning the gate forming film by etching may possibly damage the underlying semiconductor substrate to deteriorate the reliability of the transistor to be formed. Therefore, it is desired that the state of etching the gate forming film (for example, etching rate) does not fluctuate as much as possible.

Then, in this embodiment, the first feature described above is adopted. That is, in this embodiment, when the control gate electrode CG is formed by patterning the silicon film PS1, the dummy gate electrode DG1 is also formed together.

Different from this embodiment, it is assumed such a case that the dummy gate electrode DG1 is not formed when the control gate electrode CG and the silicon film PS1a are formed by patterning the silicon film PS1 at the step S6, and the case is to be referred to as a first comparative embodiment. In this first comparative embodiment, the silicon film PS1 is left not only in the peripheral circuit 1B but also in the entire dummy forming region 1C. Accordingly, the silicon film PS1a is formed over the entire peripheral circuit 1B and over the entire dummy forming region 1C. In this case, if it is intended to form the dummy gate electrode in the dummy forming region 1C, since the dummy gate electrode is formed in the dummy forming region 1C when the silicon film PS1a is patterned to form the gate electrode GE at the step S12, not the dummy gate electrode DG1 but the dummy gate electrode DG2 is formed in the dummy forming region 1C.

However, in the first comparative embodiment, a resist pattern used for patterning the silicon film PS1 at the step S6 (corresponding to the photoresist pattern PR1) has no opening OP2 described above. That is, the resist pattern has the opening OP1 for forming the control gate electrode CG in the memory cell region 1A, whereas it has no opening formed therein since the gate electrode or the dummy gate electrode are not yet formed in the peripheral circuit region 1B and the dummy forming region 1C. Accordingly, in the resist pattern, the ratio of the area of the opening to the entire area is relatively small. That is, in the first comparative embodiment, when the silicon film PS1 is patterned at the step S6, the ratio of the area of the silicon film PS1 to be edged (area of the portion exposed not being covered by the resist pattern) of the silicon film PS1 to the entire area of the silicon film PS1 is relatively small.

As described above, when the gate forming film (silicon film PS1 in this embodiment) is patterned by etching using the resist pattern, the state of etching the gate forming film (for example, etching rate) depends on the area of the gate forming area to be etched. In the case of the first comparative embodiment, the silicon film PS1 is patterned by etching using the resist pattern having the opening OP1 for forming the control gate electrode CG. Since the exposed area of the silicon film PS1 is relatively small and the area of the silicon film PS1 to be edged is relatively small, the state of etching (for example, etching rate) tends to be fluctuated.

Further, when the capacitance of the non-volatile memory to be mounted on the semiconductor device is changed, the area of the opening OP1 for forming the control gate electrode CG is also changed and, accordingly, also the area of the silicon film PS1 to be etched upon patterning the silicon film PS1 at the step S6 is also changed. In the first comparative embodiment, since the area of the opening of the resist pattern used in the step S6 is small and the area of the silicon film PS1 to be etched is small, when the capacitance of the non-volatile memory is changed, the ratio of changing the area of the silicon film PS1 to be etched is increased. Therefore, when the capacitance of the non-volatile memory to be mounted on the semiconductor device is changed by the design change, the state of etching the silicon film PS1 at the step S6 (for example, etching rate) tends to be fluctuated.

Fluctuation of the state of etching (for example, etching rate) of the silicon film PS1 at the step S6 may possibly result in overetching or cause etching residue upon patterning the silicon film PS1 at the step S6. Further, characteristics of the formed transistor (control transistor having the control gate electrode CG in this embodiment) (for example, threshold voltage) may also possibly be fluctuated.

On the contrary, this embodiment has the first feature as described above. That is, when the silicon film PS1 is patterned to form the control gate electrode CG and the silicon film PS1a at the step S6, the dummy gate electrode DG1 is also formed. Therefore, in this embodiment, the area of the opening of the resist pattern (photoresist pattern PR1) can be increased by so much as the opening OP2 for forming the dummy gate electrode DG1 upon patterning the silicon film PS1 at the step S6 compared with the first comparative embodiment and the exposed area of the silicon film PS1 can be increased. Accordingly, the area of the silicon film PS1 to be etched can be increased when the silicon film PS1 is patterned at the step S6 in this embodiment compared with the first comparative embodiment. That is, in this embodiment, when the silicon film PS1 is patterned at the step S6, the ratio of the area of the silicon film PS1 to be etched to the entire area of the silicon film PS1 can be increased by so much as the opening OP2 for forming the dummy gate electrode DG1 in this embodiment by adopting the first feature compared with the first comparative embodiment.

The area of the silicon film PS1 to be etched corresponds to the area of the region to be etched in the silicon film PS1 (area in a plan view). Accordingly, the area of the silicon film PS1 to be etched at the step S6 corresponds to the area of the region not covered by the photoresist pattern PR1 in the silicon film PS1. This is because the silicon film PS1 in the region not covered by the photoresist pattern PR1 is removed by etching while the silicon film PS1 in the region covered by the photoresist pattern PR1 remains unetched at the step S6

As described above, when the gate forming film (silicon film PS1 in this embodiment) is patterned by etching using the resist pattern, the state of etching the gate forming film (for example, etching rate) depends on the area of the gate forming film to be etched. On the contrary, in this embodiment, since the area of the silicon film PS1 to be etched can be increased by so much as the opening OP2 for forming the dummy gate electrode DG 1 upon patterning the silicon film PS1 at the step S6, fluctuation of the state of etching (for example, etching rate) can be suppressed.

Further, when the capacitance of the non-volatile memory to be mounted on the semiconductor device is changed, the area of the opening OP1 for forming the control gate electrode CG is also changed and, accordingly, the area of the silicon film PS1 to be etched upon patterning the silicon film PS1 at the step S6 is also changed. On the contrary, in this embodiment, when the silicon film PS1 is patterned at the step S6, since the area of the silicon film PS1 to be etched can be increased by so much as the opening OP2 for forming the dummy gate electrode DG1, when the capacitance of the non-volatile memory is changed, the ratio of the change of the area of the silicon film PS1 to be etched can be decreased. Therefore, even when the capacitance of the non-volatile memory to be mounted on the semiconductor device is changed by design change, fluctuation of the state of etching the silicon film PS1 (for example, etching rate) at the step S6 can be suppressed.

As described above, since the first feature is adopted in this embodiment, when the silicon film PS1 is patterned at the step S6, fluctuation of the state of etching the silicon film PS1 (for example, etching rate) can be suppressed. Accordingly, when the silicon film PS1 is patterned at the step S6, occurrence of overetching can be suppressed or prevented and occurrence of etching residue can be suppressed or prevented. Therefore, the reliability of the semiconductor device can be improved. Further, fluctuation of characteristics of the formed transistor (control transistor having the control electrode CG in this embodiment) (for example, threshold voltage) can be suppressed or prevented. Accordingly, the performance of the semiconductor device can be improved.

Further, in this embodiment, since the fluctuation of the state of etching the silicon film PS1 at the step S6 (for example, etching rate) can be prevented even when the capacitance of the non-volatile memory mounted on the semiconductor device is changed, it is not necessary to change the etching condition at the step S6. Accordingly, since the etching condition at the step S6 can be made in common to plurality kinds of products having different capacity of the non-volatile memory, it is not necessary to adjust the etching condition at the step S6 for every kind of products, so that semiconductor devices can be manufactured easily and administration for the manufacturing step is also facilitated. Further, manufacturing time in total can be shortened for plurality kinds of products.

In the step of patterning the silicon film PS1 at the step S6, etching end point of the silicon film PS1 is sometimes detected, for example, by examining (detecting) gas ingredients. The detection accuracy for the etching end point tends to be higher as the area to be etched increases. In this embodiment, since the area of the silicon film PS1 to be etched can be increased upon patterning the silicon film PS1 at the step S6 by the application of the first feature, the detection accuracy for the etching end point of the silicon film PS1 at the step S6 can be improved. Also with this view point, occurrence of overetching at the step S6 can be suppressed or prevented and, further, occurrence of etching residue can be suppressed or prevented. Accordingly, the reliability of the semiconductor device can be improved. Further, fluctuation of characteristics (for example, threshold voltage) of the formed transistor (control transistor having the control gate electrode CG) can be suppressed or prevented. Accordingly, the performance of the semiconductor device can be improved.

Further, when the control gate electrode CG and the silicon film PS1$a$ are formed by patterning the silicon film PS1 at the step S6, it may also be considered, different from this embodiment, that the dummy gate electrode DG1 is not formed and the silicon film PS1 for the entire dummy forming region 1C is removed, which is hereinafter referred to as a second comparative embodiment. In the second comparative embodiment, an opening for opening the entire dummy forming region 1C is provided in the resist pattern corresponding to the photoresist pattern PR1. In the second comparative embodiment, since the dummy gate electrode DG1 is not formed at the step S6 and the silicon film PS1 for the entire dummy forming region 1C is removed, the dummy gate electrode can no more be provided in the dummy forming region 1C. Accordingly, in the case of the second comparative embodiment, there may be a possibility of causing disadvantage accompanying the polishing step for the interlayer insulation film IL1, for example, dishing tends to be generated in the dummy forming region 1C when the upper surface of the interlayer insulation film IL1 is polished by a CMP method.

On the contrary, in this embodiment, the silicon film PS1 for the entire dummy forming region 1C is not removed but the dummy gate electrode DG1 is formed in the dummy forming region 1C. That is, the silicon film PS1 other than the portion to form the dummy gate electrode DG1 is removed in the dummy forming region 1C. That is, the silicon film PS1 at the periphery of the dummy gate electrode DG1 is removed while leaving the dummy gate electrode DG1. When the dummy gate electrode DG1 is formed in the dummy forming region 1C at the step S6, the silicon film PS1 at the periphery of the dummy gate electrode DG1 is naturally removed.

In this embodiment, since the dummy gate electrode DG1 can be provided also in the dummy forming region 1C, occurrence of defect (such as dishing) accompanying the polishing step for the interlayer insulation film IL1 can be suppressed or prevented. Accordingly, the reliability of the semiconductor device can be improved. Further, the semiconductor device can be manufactured easily and administration of the manufacturing step can also be facilitated.

This embodiment also has the second feature described above. That is, when the gate electrode GE of the MISFET is formed by patterning the silicon film PS1a at the step S12, the dummy gate electrode DG2 is also formed.

It may be also considered a case, different from this embodiment, that the dummy gate electrode DG2 is not formed when the gate electrode GE of the MISFET is formed by patterning the silicon film PS1a at the step S12 and the case is hereinafter referred to as a third comparative embodiment. In the third comparative embodiment, however, since the dummy gate electrode DG2 is not formed, it is not easy to effectively arrange the dummy gate electrodes in a region in which a protrusion pattern such as of the gate electrode is not formed only by the dummy gate electrode DG1 formed at the step 6.

For example, if a vacant space (vacant region) is present between the gate electrodes GE not spaced apart sufficiently, it is difficult to provide the dummy gate electrode DG1 in the vacant space. Further, it is difficult to arrange the dummy gate electrode DG1 to a close position adjacent to the gate electrode GE. Further, in a case of forming the gate electrode GE by patterning the silicon film PS1a at the step S12, if it is intended to form the gate electrode GE to a position near the end (outer periphery) of the silicon film PS1a in a plan view, the cross sectional shape of the gate electrode GE tends to be different from the cross sectional shape of the gate electrode GE at the inner position. In view of the above, in a case of forming the gate electrode GE at the step S12, when the gate electrode GE is intended to provide at a position spaced apart to some extent from the end (outer periphery) of the silicon film PS1a in a plan view, the dummy gate electrode DG1 cannot be provided at a close position adjacent to the gate electrode GE.

On the contrary, the second feature described above is applied in this embodiment. That is, in a case of forming the gate electrode GE of the MISFET by patterning the silicon film PS1a at the step S12, the dummy gate electrode DG2 is also formed. Therefore, the dummy gate electrodes can be arranged easily and effectively in a region in which the protrusion pattern such as of the gate electrode is not formed compared with the third comparative embodiment not forming the dummy gate electrode DG2.

For example, when a vacant space (vacant region) is present between each of the gate electrodes GE not spaced apart sufficiently, the dummy gate electrodes DG1 are difficult to be arranged in the vacant space but the dummy gate electrodes DG2 can be arranged easily. This is because since the gate electrode GE and the dummy gate electrode DG2 are formed by patterning the identical silicon film PS1a in the identical step, the dummy gate electrode DG2 can be arranged easily in the vacant space between the gate electrodes GE to each other. Further, while the dummy gate electrode DG1 is difficult to be provided but the dummy gate electrode DG2 can be formed easily at a close position adjacent to the gate electrode GE. Further, in a case of forming the gate electrode GE by patterning the silicon film PS1a at the step S12, when the gate electrode GE is intended to be formed at a position near the end (outer periphery) of the silicon film PS1a in a plan view, the cross sectional shape of the gate electrode GE tends to be different from the cross sectional shape of the gate electrode GE at the inner position. In view of the above, in a case of forming the gate electrode GE at the step S12, when the gate electrode GE is arranged at a position spaced apart to some extent from the end (outer periphery) of the silicon film PS1a in a plan view, while the dummy gate electrode DG1 can no more be arranged but the dummy gate electrode DG2 can be arranged to a close position adjacent to the gate electrode GE. Accordingly, since the dummy gate electrode DG1 is difficult to be formed, but the dummy gate electrode DG2 is formed easily at the position adjacent to the gate electrode GE, it is preferred that the dummy gate electrode at the position closest to the gate electrode GE is not the dummy gate electrode DG1 but the dummy gate electrode DG2.

As described above, in this embodiment, since not only the first feature but also the second feature are adopted, dummy gate electrodes (DG1 and DG2) can be arranged easily and effectively in a region where the protrusion such as of the gate electrode is not formed. Therefore, occurrence of defects dishing or the like accompanying the polishing step for the interlayer insulation film IL1 can be suppressed or prevented. Accordingly, the reliability of the semiconductor device can be improved. Further, the semiconductor devices can be manufactured easily and the control for the manufacturing step is also facilitated.

As described above, in this embodiment, by adopting both of the first feature and the second feature described above, the reliability of the semiconductor device can be improved. Further, the performance of the semiconductor device can be improved.

Further, in this embodiment, the control gate electrode CG of the non-volatile memory and the gate electrode GE of the MISFET in the peripheral circuit are formed by using the first film as a common film. As the first film, the silicon film PS1 is used preferably. That is, the first film preferably comprises silicon. Thus, the patterning step at the step S6 and the patterning step at the step S12 can be performed easily. Further, since the control gate electrode CG is formed of silicon (silicon film), the reliability of the memory cell of the non-volatile memory can be improved. Accordingly, the performance of the semiconductor device having the non-volatile memory can be improved.

Further, in this embodiment, a silicon film PS2 is preferred as the film used for forming the memory gate electrode MG (second film). Thus, the memory gate electrode MG adjust to the control gate electrode CG can be formed easily. Further, since the memory gate electrode MG is formed of silicon (silicon film), the reliability of the memory cell of the non-volatile memory can be improved. Accordingly, the performance of the semiconductor device having the non-volatile memory can be improved.

In this embodiment, in a case of forming the gate electrode GE by patterning the silicon film PS1a at the step S12, the outer periphery of the silicon film PS1a (outer periphery in a plan view) is left preferably. Different from this embodiment in a case of removing the outer periphery of the silicon film PS1a at the step S12, if the oxide film remains on the side wall EG1 of the silicon film PS1a, the oxide film may possibly remain even after removal of the outer periphery of the silicon film PS1a. The oxide film (oxide film formed on the side wall EG1 of the silicon film PS1a) is a spontaneous oxide film formed on the side wall of the silicon film PS1a as an exposed surface of the silicon film PS1a after the step of removing the insulation film MZ at the step S11 and before etching of the silicon film PS1a at the step S12. If the oxide film is formed on the side wall EG1 of the silicon film PS1a, there may be a possibility that the oxide film remains without being removed completely even after the removal of the outer periphery of the silicon film PS1a at the step S12 and, if the oxide film remains, it is defoliated as dusts in the subsequent step to possibly result defects in the subsequent step.

In view of the above, in a case of forming the gate electrode GE by patterning the silicon film PS1a at the step S12, the outer periphery of the silicon film PS1a (outer periphery in a plan view) is left preferably. Thus, since the outer periphery of the silicon film PS1a remains as a dummy pattern DP also after the step S12, if the oxide film is formed on the side wall EG1 of the silicon film PS1a, the oxide film is closely adhered as it is on the side wall of the dummy pattern DP. That is, since the side wall (side surface) EG1 of the silicon film PS1a forms the side wall (side surface) of the dummy pattern DP after patterning at the step S12, the oxide film formed on the side wall EG1 of the silicon film PS1a can be present stably with no defoliation as the oxide film on the side wall of the dummy pattern DP. Accordingly, the oxide film can be suppressed or prevented from defoliating and forming dusts in the subsequent step. Therefore, occurrence of defects in the subsequent step due to formation of the dusts by the oxide film can be suppressed or prevented. Accordingly, the reliability of the semiconductor device can be improved. Further, the manufacturing yield of the semiconductor devices can be improved.

Further, in a case of forming the gate electrode GE by patterning the silicon film PS1a at the step S12, the outer periphery of the silicon film PS1a is left preferably and it is more preferred that the outer periphery of the silicon film PS1a is left continuously with no interruption. That is, in a case of forming the photoresist pattern PR3 at the step S12, it is more preferred that the entire side wall (side surface) EG1 of the silicon film PS1a is covered by the photoresist pattern PR3. In this case, the dummy pattern DP has no end in the extending direction but has a continuous pattern (planar shape) surrounding (turning around) a certain region. Thus, even if the oxide film is formed in any of the regions of the side wall EG1 of the silicon film PS1a, since the oxide film can remain in a state closely adhered to the side wall of the dummy pattern DP, occurrence of defects in the subsequent step caused by the formation of dusts of the oxide film can be suppressed or prevented more effectively. Accordingly, the reliability of the semiconductor device can be improved more effectively. Further, the manufacturing yield of the semiconductor devices can be improved more effectively.

In this embodiment, in a case of forming the control gate electrode CG and the silicon film PS1a by patterning the silicon film PS1 at the step S6, the area of the silicon film PS1 to be etched at the step S6 is increased by forming also the dummy gate electrode DG1. Therefore, the effect of applying this embodiment is remarkable in a case where the first comparative embodiment is adopted and the area of the silicon film PS1 to be etched is decreased at the step S6. In view of the above, when the patterning step at the step S6 is performed, the effect of applying this embodiment is remarkable in a case where the ratio of the area of the silicon film PS1 to be etched excluding the area of the opening OP2 for forming the dummy gate electrode DG1 (area of the silicon film PS1 at a portion exposed from the opening OP1) to the entire area of the silicon film is 10% or less.

Then, the feature in the layout of the manufactured semiconductor device is to be described when the semiconductor device is manufactured in accordance with the manufacturing step of this embodiment.

Figure 76:
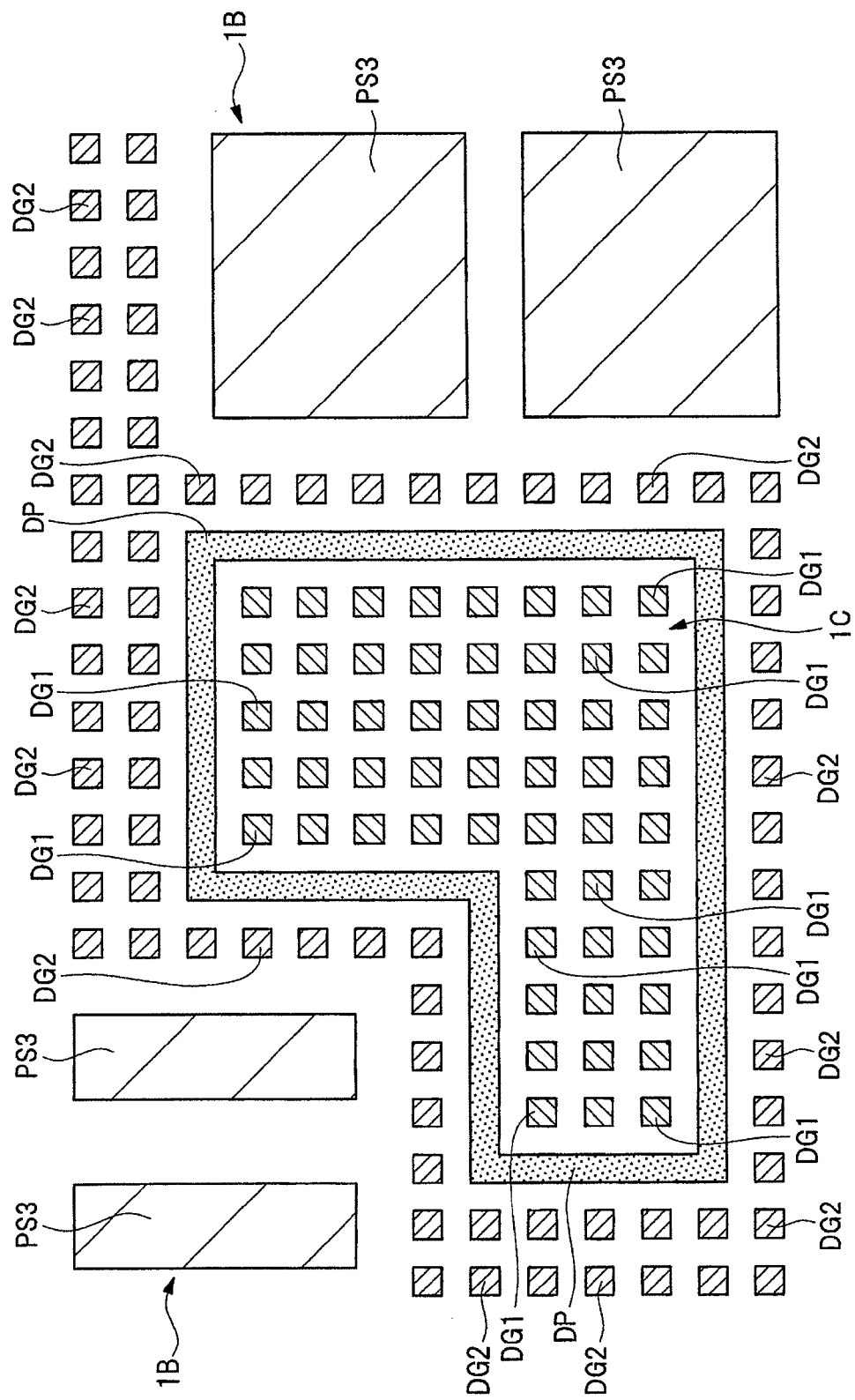
FIG. 76 is a fragmentary cross sectional view for a main portion of the semiconductor device as the preferred embodiment.

FIG. 76 is a plan view for a main portion of a semiconductor device according to this embodiment that illustrates a layout of a silicon pattern PS3, a dummy gate electrode DG1, a dummy gate electrode DG2, and a dummy pattern DP. While FIG. 76 is a plan view, the silicon pattern PS3, the dummy gate electrode DG1, the dummy gate electrode DG2, and the dummy pattern DP are hatched for easy understanding of the drawings. In FIG. 76, directions of hatched lines are reversed between the dummy gate electrode DG1 and the dummy gate electrode DG2 for easy discrimination of the dummy gate electrode DG1 and the dummy gate electrode DG2.

The silicon pattern (silicon film pattern) PS3 is formed by patterning the silicon film PS1a at the step S12 which comprises a silicon film pattern PS1a and functions as a constitutional element of the semiconductor device. That is, the silicon pattern PS3 mainly corresponds to the gate electrode GE but is not restricted to the gate electrode of the transistor and can include also those functioning as constitutional elements of the semiconductor device other than the transistor, for example, a resistance element or a capacitance element. For example, the silicon pattern PS3 can include also a silicon pattern forming a polysilicon resistance element or a silicon pattern forming the electrode of a capacitance element can also be included. On the other hand, the dummy gate electrode DG1, the dummy gate electrode DG2, and the dummy pattern DP do not function as the constitutional elements of the semiconductor device. Accordingly, the dummy gate electrode DG1, the dummy gate electrode DG2, and the dummy pattern DP are formed at positions keeping out of the semiconductor device formed to the main surface of the semiconductor substrate SB, and accordingly, formed at positions not overlapping the semiconductor device formed to the main surface of the semiconductor substrate SB in a plan view.

In accordance with the manufacturing step of this embodiment, the silicon pattern PS3, the dummy gate electrode DG2, the dummy pattern DP, and the dummy gate electrode DG1 are formed by using an identical film (silicon film PS1 in this embodiment) and formed in a coplanar layer. Then, the silicon pattern PS3, the dummy gate electrode DG1, and the dummy pattern DP are formed in one identical step (patterning step at the step S12). On the other hand, the dummy gate electrode DG1 is formed by the step different from that for the silicon pattern PS3, the dummy gate electrode DG2, and the dummy pattern DP. Specifically, the dummy gate electrode DG1 is formed by the step identical with that for the control gate electrode CG (patterning step at the step S6 described above).

When the semiconductor device is manufactured in accordance with the manufacturing step of this embodiment, the manufactured semiconductor device has the following features in view of the layout.

When this embodiment is applied, the dummy forming region 1C is preferably arranged in a vacant space (region) where neither the non-volatile memory nor the peripheral circuit is formed at the main surface of the semiconductor substrate. That is, if a portion capable of ensuring a certain extent of area for a region not forming the semiconductor device (area in which a plurality of dummy gates electrode DG1 can be arranged) can be ensured at the main surface of the semiconductor substrate SB, the dummy forming region 1C is preferably arranged in such portion. Accordingly, a layout tens to have a configuration in which a dummy forming region 1C having a plurality of dummy gate electrodes DG1 arranged therein is surrounded by a peripheral circuit region 1B having a plurality of dummy gate electrodes DG2 and a plurality of silicon pattern PS3 therein. Further, the dummy pattern DP formed by leaving the outer periphery of the silicon film PS1a is arranged at the boundary between the dummy forming region 1C and the peripheral circuit region 1B.

Accordingly, this provides a layout, as illustrated also in FIG. 76, in which a region having a plurality of dummy gate electrodes DG1 disposed or arranged therein (corresponding to the dummy forming region 1C) is surrounded by a linear or a ring-shaped dummy pattern DP, and a region having a plurality of dummy gate electrodes DG2 and a region having a plurality of silicon patterns PS3 disposed or arranged therein (corresponding to the peripheral circuit region 1B) is present to the outside thereof. That is, this provides a layout in which a region having a plurality of dummy gate electrodes DG1 disposed or arranged therein (dummy forming region 1C) is surrounded by a region having a plurality of silicon patterns PS3 and a plurality of the dummy gate electrodes DG2 disposed or arranged therein (peripheral circuit region 1B), and the dummy pattern DP is disposed between both of the regions.

As the planar shape of the dummy gate electrode DG1 and that of the dummy gate electrode DG2, a rectangular planar shape can be used preferably. Further, the dummy pattern DP is in a continuously linear pattern, has no terminal end in the extending direction, and extends continuously so as to surround a certain region. Accordingly, this provides a layout in which a linear terminal pattern DP is formed between a region having a plurality of rectangular dummy gate electrodes DG1 disposed or arranged therein (dummy forming region 1C) and a region having a plurality of rectangular dummy gate electrodes DG2 and a plurality of silicon patterns PS3 disposed or arranged therein (peripheral circuit 1B) so as to surround the region having the plurality of rectangular dummy gate electrodes DG1 disposed or arranged therein.

Further, the dummy gate electrodes DG1 are formed but the semiconductor device is not formed in the dummy forming region 1C. Accordingly, this provides a layout in which the semiconductor device is not formed in a region surrounded by the dummy pattern DP and in a region where the dummy gate electrodes DG1 are disposed therein (corresponding to the dummy forming region 1C) in a plan view.

In a plan view, the dummy pattern DP is present between the dummy gate electrodes DG1 and the dummy gate electrodes DG2.

In a plan view, the dummy gate electrodes DG2 are arranged at the periphery of the silicon patterns PS3 and the dummy pattern DP is present between the silicon pattern PS3 and the dummy gate electrode DG1. The dummy gate electrodes DG2 are arranged at the periphery of the silicon pattern PS3 not by way of the dummy pattern DP. Further, dummy gate electrode closest the silicon pattern PS3 not the dummy gate electrodes DG1 but the dummy gate electrodes DG2.

Second Embodiment

The second embodiment corresponds to a modified example of the first embodiment.

In the second embodiment, description is to be made to a case where the control gate electrode CG of the non-volatile memory in the first embodiment is formed of a lamination film of a silicon film PS2 and an insulation film.

FIG. 77 to FIG. 94 are cross sectional views for a main portion of the semiconductor device according to the second embodiment during manufacturing steps. FIG. 77 to FIG. 94, FIG. 77, FIG. 80, FIG. 83, FIG. 86, FIG. 89, and FIG. 92 illustrate cross sectional regions corresponding to FIG. 70, etc. of the first embodiment described above and substantially correspond to cross sectional views along line A-A illustrated in the plan view of FIG. 19 to FIG. 21, FIG. 37, FIG. 47, and FIG. 48. Further, FIG. 78, FIG. 81, FIG. 84, FIG. 87, FIG. 90, and FIG. 93 illustrate cross sectional regions corresponding to FIG. 71, etc. of the first embodiment and substantially correspond to the cross sectional views along line B-B illustrated in the plan views of FIG. 19 to FIG. 21, FIG. 37, FIG. 47, and FIG. 48. Further, FIG. 79, FIG. 82, FIG. 85, FIG. 88, FIG. 91, and FIG. 94 illustrate cross sectional regions corresponding to FIG. 72, etc. of the first embodiment, and substantially correspond to the cross sectional views along line C-C shown in the plan views of FIG. 19 to FIG. 21, FIG. 37, FIG. 47, and FIG. 48.

Since the manufacturing step of the second embodiment is identical with the manufacturing step of the first embodiment till the silicon film PS1 is formed at the step S5 to obtain the structures of FIG. 10 to FIG. 12, duplicate explanation is to be omitted and the steps after the step S5 are to be described.

Figure 77:
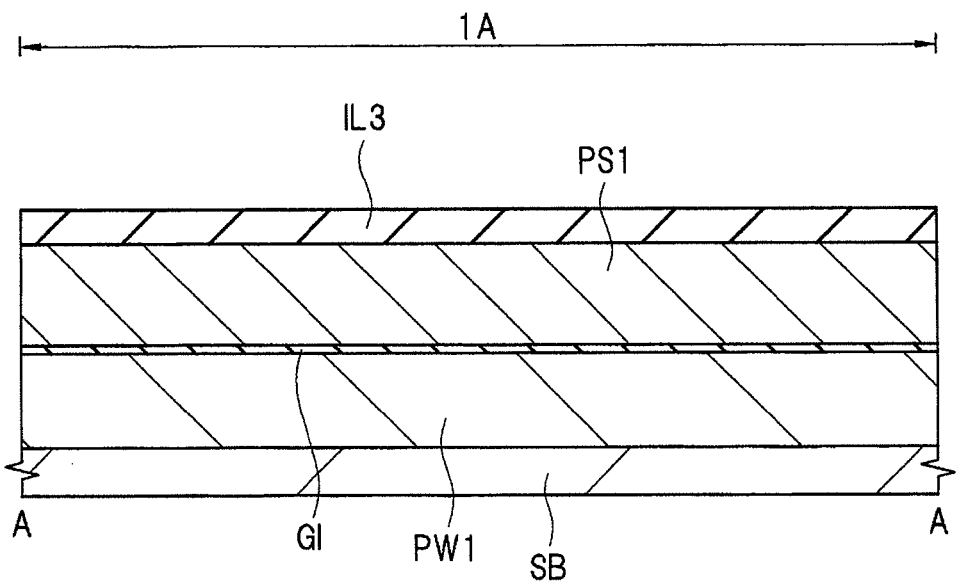
FIG. 77 is a fragmentary cross sectional view for a main portion of a semiconductor device according to another embodiment of the present invention during the manufacturing step thereof.
Figure 78:
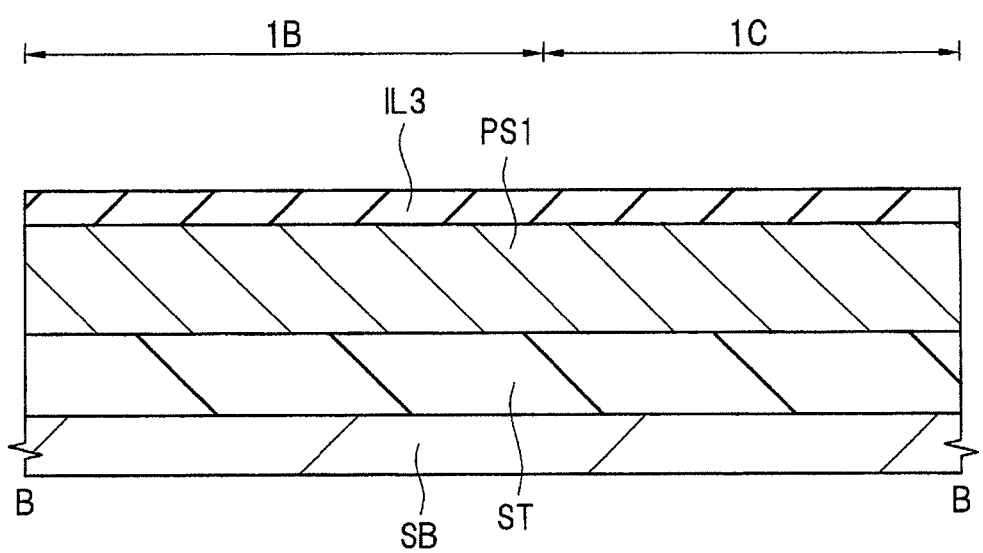
FIG. 78 is a fragmentary cross sectional view for a main portion of the semiconductor device identical with that of FIG. 77 during the manufacturing step thereof.
Figure 79:
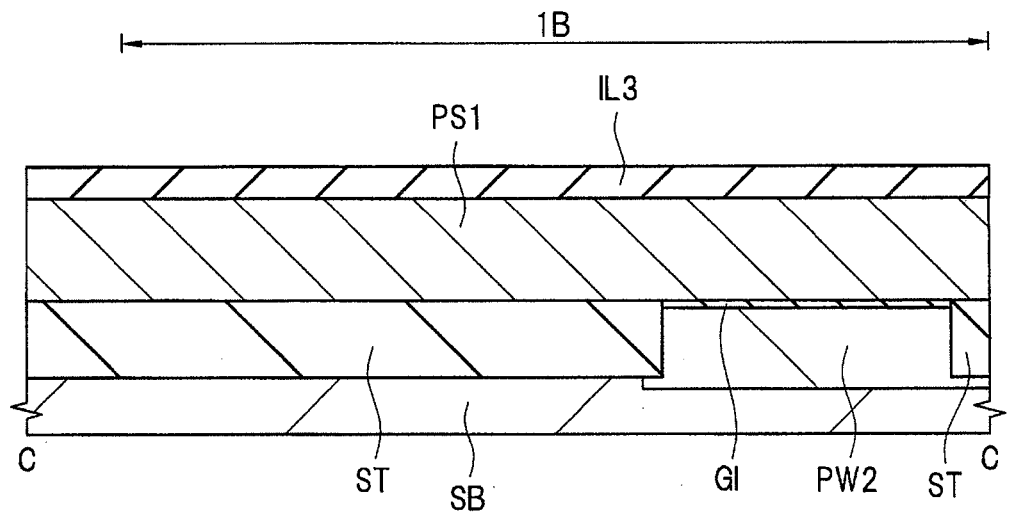
FIG. 79 is a fragmentary cross sectional view for a main portion of the semiconductor device identical with that of FIG. 77 during the manufacturing step thereof.

After performing the steps up to the step S5 (step of forming the silicon film PS1) to obtain the structures of FIG. 10 to FIG. 12 in the same manner as the first embodiment, an insulation film IL3 is formed over the main surface of the semiconductor substrate SB (entire main surface), that is, over the silicon film PS1 as illustrated in FIG. 77 to FIG. 79 in the second embodiment. That is, in the second embodiment, the insulation film IL3 is formed over the silicon film PS1 after the step of forming the silicon film PS1 at the step S5 and before the patterning step at the step S6.

The insulation film IL3 comprises, for example, a single film of a silicon nitride film, or a lamination film of a silicon oxide film and a silicon nitride film on the silicon oxide film. When the insulation film IL3 comprises a lamination film of the silicon oxide film and the silicon nitride film on the silicon oxide film, the thickness of the silicon oxide film can be less than the thickness of the silicon nitride film. The insulation film IL3 can be formed, for example, by CVD.

Further, when n-type impurities are introduced by an ion implantation method, etc. into the silicon film PS1 in the memory cell region 1A after forming the silicon film PS1 as has been described above for the first embodiment, the insulation film IL3 is preferably formed after the ion implantation.

Then, a step of patterning the silicon film PS1 at the step S6 is performed also in the second embodiment. However, in the second embodiment, since the insulation film IL3 is formed over the silicon film PS1, the insulation film IL3 and the silicon film PS1 are patterned at the step S6 in the second embodiment. That is, in the second embodiment, the lamination film of the silicon film PS1 and the insulation film IL3 on the silicon film PS1 is patterned at the step S6. The method of patterning at the step S6 in the second embodiment is substantially identical with that of the first embodiment. In the second embodiment, the patterning step at the step S6 can be performed as to be described below.

Figure 80:
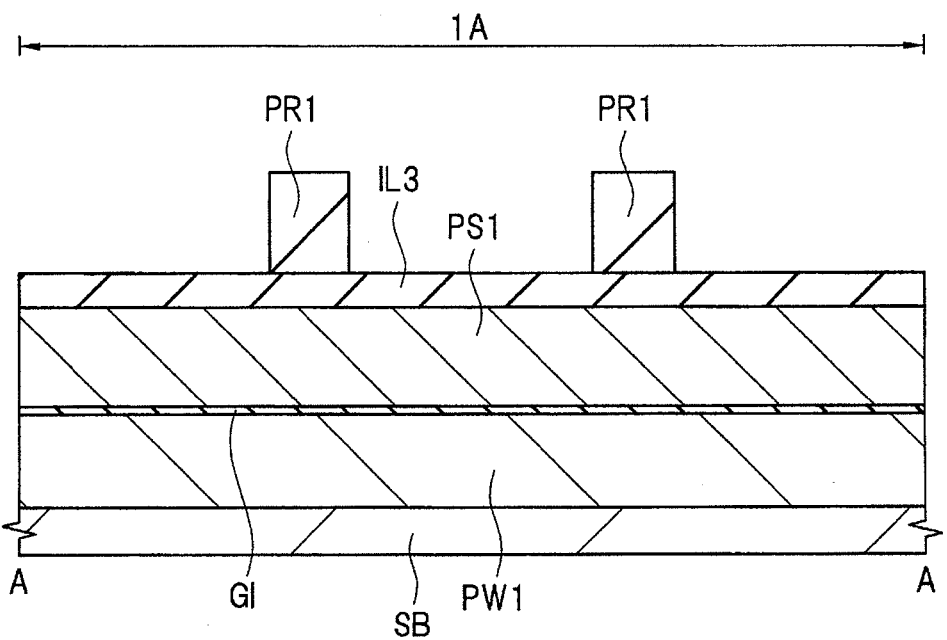
FIG. 80 is a fragmentary cross sectional view for a main portion of the semiconductor device during the manufacturing step thereof succeeding to that of FIG. 77.
Figure 81:
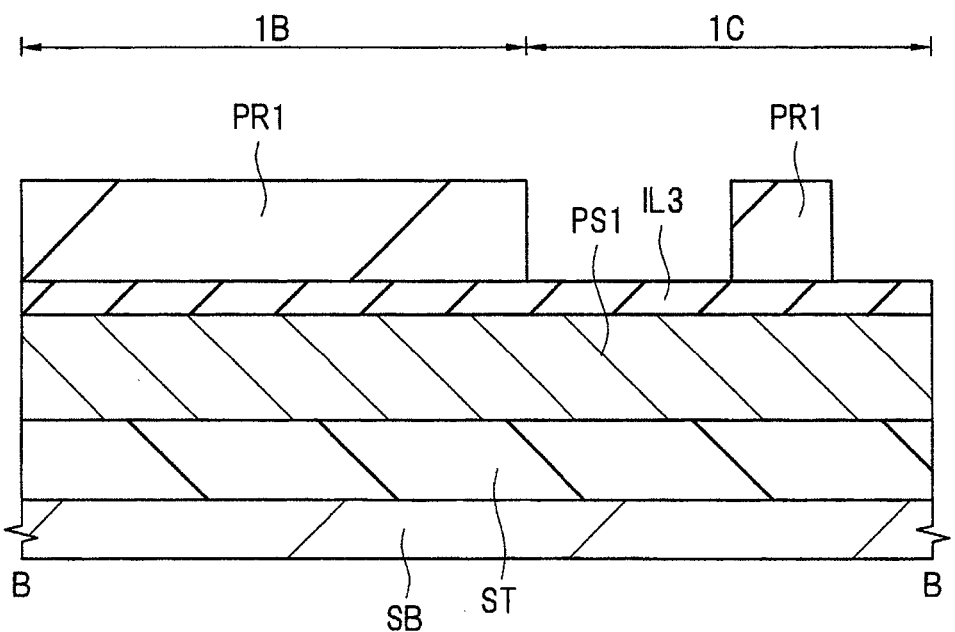
FIG. 81 is a fragmentary cross sectional view for a main portion of the semiconductor device identical with that of FIG. 80 during the manufacturing step thereof.
Figure 82:
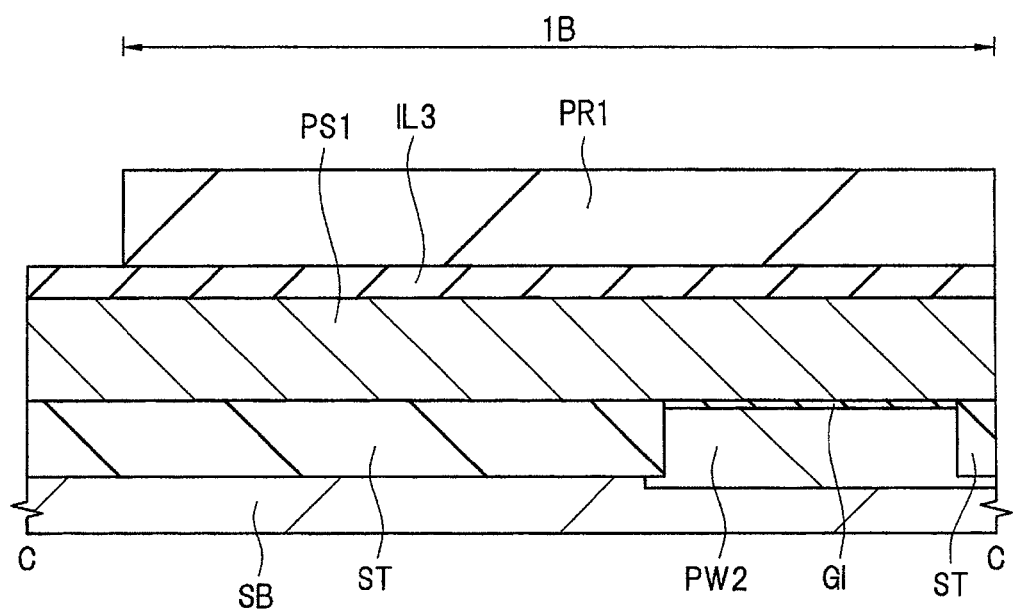
FIG. 82 is a fragmentary cross sectional view for a main portion of the semiconductor device identical with that of FIG. 80 during the manufacturing step thereof.
Figure 83:
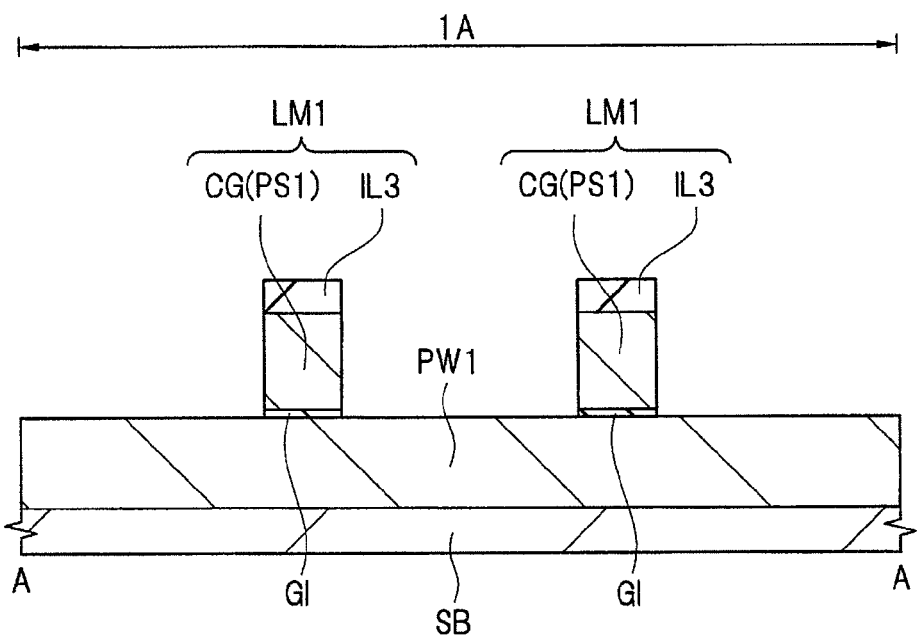
FIG. 83 is a fragmentary cross sectional view for a main portion of the semiconductor device during the manufacturing step thereof succeeding to that of FIG. 80.
Figure 84:
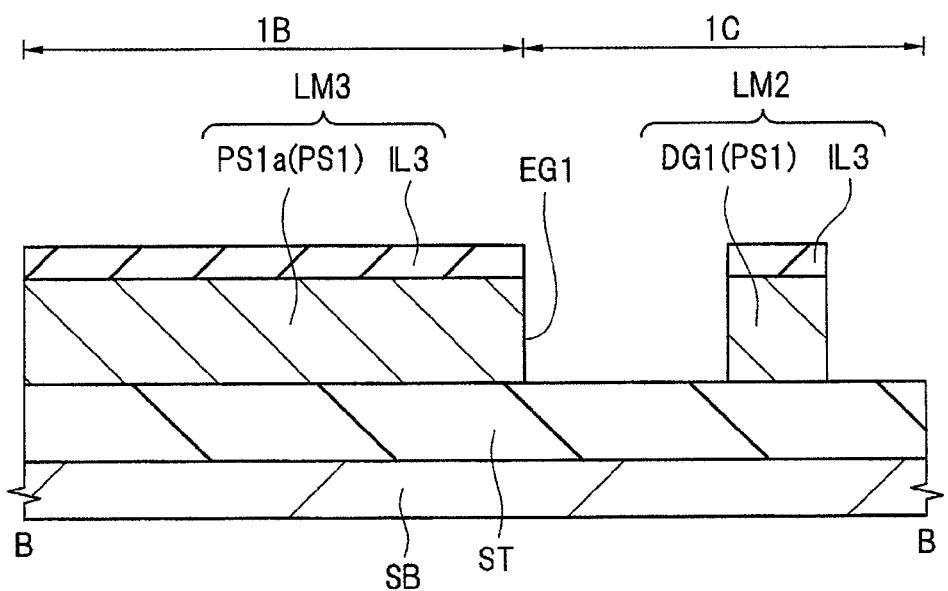
FIG. 84 is a fragmentary cross sectional view for a main portion of the semiconductor device identical with that of FIG. 83 during the manufacturing step thereof.
Figure 85:
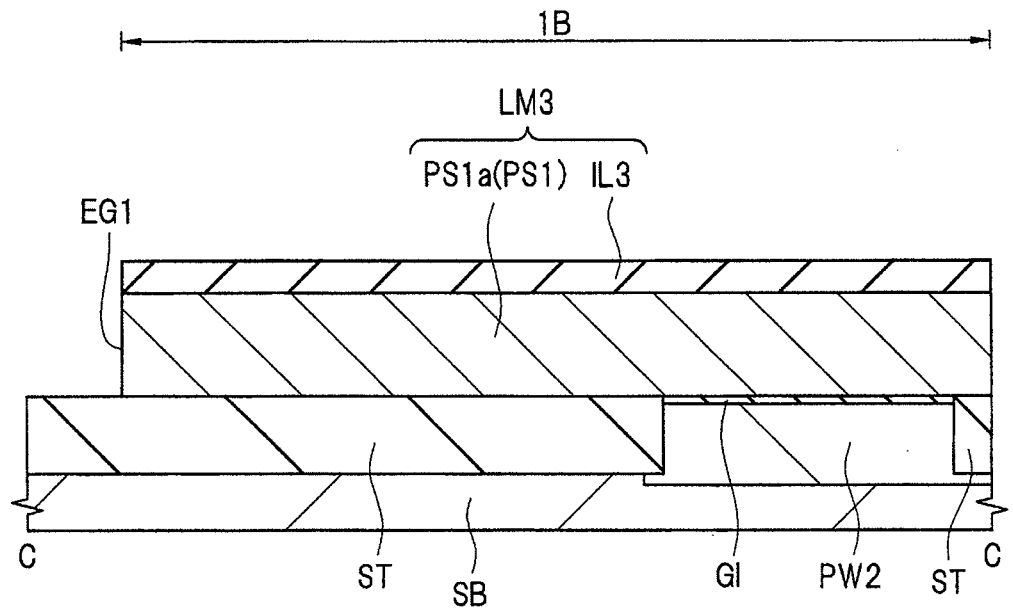
FIG. 85 is a fragmentary cross sectional view for a main portion of the semiconductor device identical with that of FIG. 83 during the manufacturing step thereof.

That is, in the second embodiment, after forming the insulation film IL3, a photoresist pattern PR1 is formed as a resist pattern over the insulation film IL3 by using photolithography as illustrated in FIG. 80 to FIG. 82. The photoresist pattern PR1 in the second embodiment is also identical with that of the first embodiment. That is, the second embodiment is identical with the first embodiment also with respect to the planar shape of the photoresist pattern PR1 and with respect to the region where the photoresist pattern is formed. For example, also in the second embodiment, the photoresist pattern PR1 has the pattern as shown in FIG. 20. Then, the insulation film IL3 and the silicon film PS1 are patterned by etching (preferably, dry etching) by using the photoresist pattern PR1 as an etching mask and then the photoresist pattern PR1 is removed. Thus, a control gate electrode CG comprising a patterned silicon film PS1, a dummy gate electrode DG1 comprising the patterned silicon film PS1, and a silicon film comprising the patterned silicon film PS1 (silicon film pattern, conductive film pattern) PS1a are formed as illustrated in FIG. 83 to FIG. 85.

The planar shape of the control gate electrode CG, the dummy gate electrode DG1, and the silicon film PS1a of the second embodiment is identical with that of the first embodiment. The second embodiment is different from the first embodiment in that, at the stage where the step S6 has been completed, the insulation film IL3 is formed over the control gate electrode CG, the insulation film IL3 is formed over the dummy gate electrode DG1, and the insulation film IL3 is formed over the silicon film PS1a in the second embodiment. The insulation film IL3 over the control gate electrode CG has a substantially identical planar shape with that of the control gate electrode CG, the insulation film IL3 over the dummy gate electrode DG1 has substantially the same planar shape as that of the dummy gate electrode DG1, and the insulation film IL3 over the silicon film PS1a has substantially the same planar shape as that of the silicon film PS1a. The insulation film IL3 is not formed in the first embodiment.

That is, in the second embodiment, the insulation film IL3 and the silicon film PS1 are patterned at the step S6. Thus, the lamination pattern LM1 comprising the control gate electrode CG and the insulation film IL3 thereon is formed in the memory cell region 1A, a lamination pattern LM2 comprising the dummy gate electrode DG1 and the insulation film IL3 is formed in the dummy forming region 1C, and a lamination pattern LM3 comprising the silicon film PS1a and the insulation film IL3 thereon is formed in the peripheral circuit region 1B.

Since the second embodiment is basically identical with the first embodiment for the step S6, except for the difference described above, duplicate explanation therefor is to be omitted.

Then, in the second embodiment, a step of removing the insulation film IL3 over the dummy gate electrode DG1 and the insulation film IL3 over the silicon film PS1a is performed. However, in this step, the insulation film IL3 over the control gate electrode CG is not removed but left as it is That is, in the second embodiment, after the patterning step at the step S6 and before the step of forming the insulation film MZ at the step S7, a step of removing the insulation film IL3 of the lamination pattern LM2 and the insulation film IL3 of the lamination pattern LM3 while leaving the insulation film IL3 on the lamination pattern LM1 is performed.

In the second embodiment, the step of removing the insulation film IL3 over the dummy gate electrode DG1 and the insulation film IL3 over the silicon film PS1a can be performed as described below.

Figure 86:
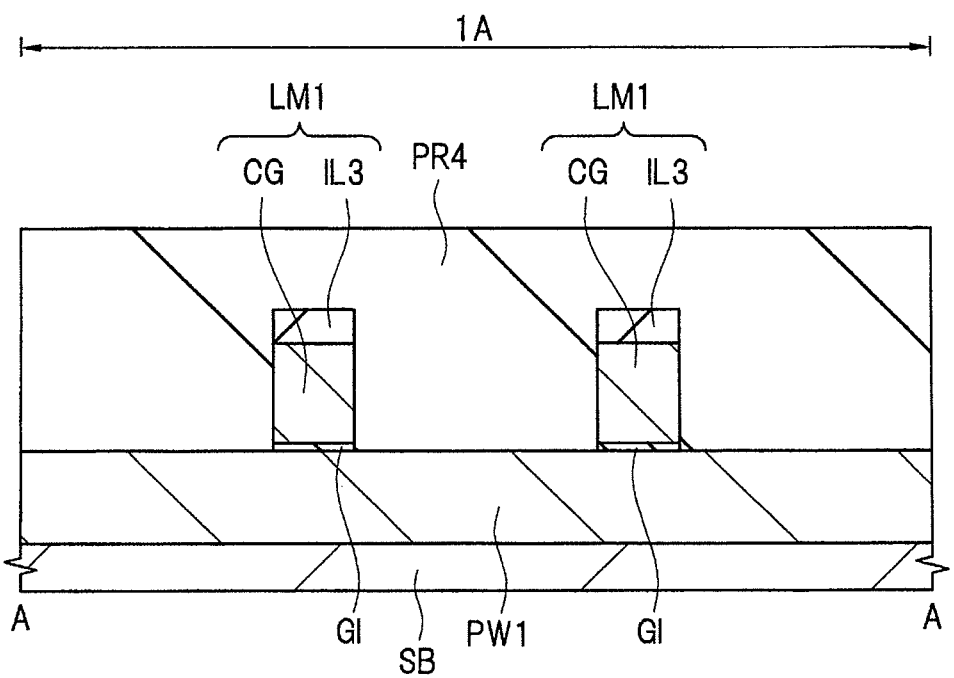
FIG. 86 is a fragmentary cross sectional view for a main portion of the semiconductor device during the manufacturing step thereof succeeding to that of FIG. 83.
Figure 87:
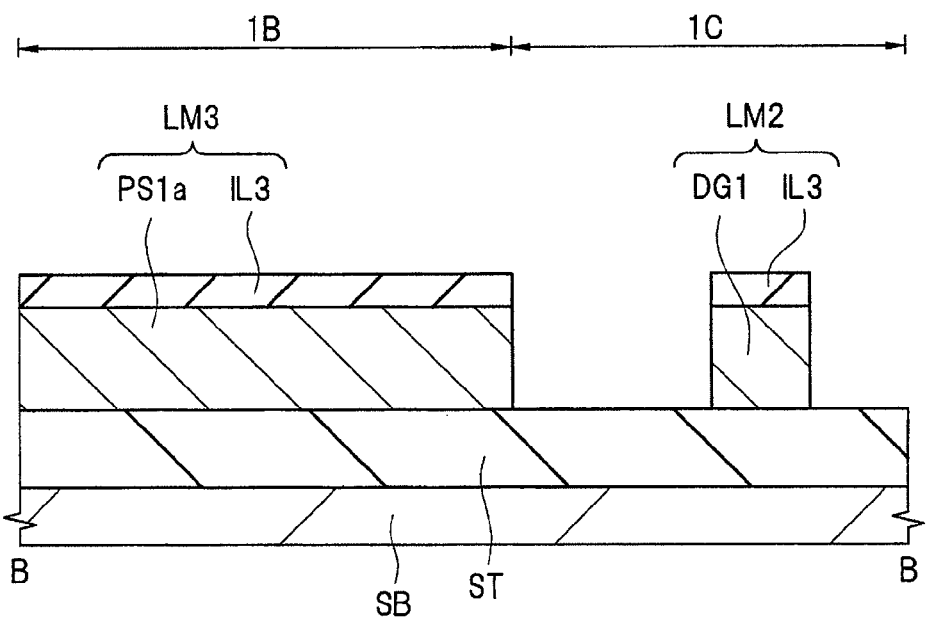
FIG. 87 is a fragmentary cross sectional view for a main portion of the semiconductor device identical with that of FIG. 86 during the manufacturing step thereof.
Figure 88:
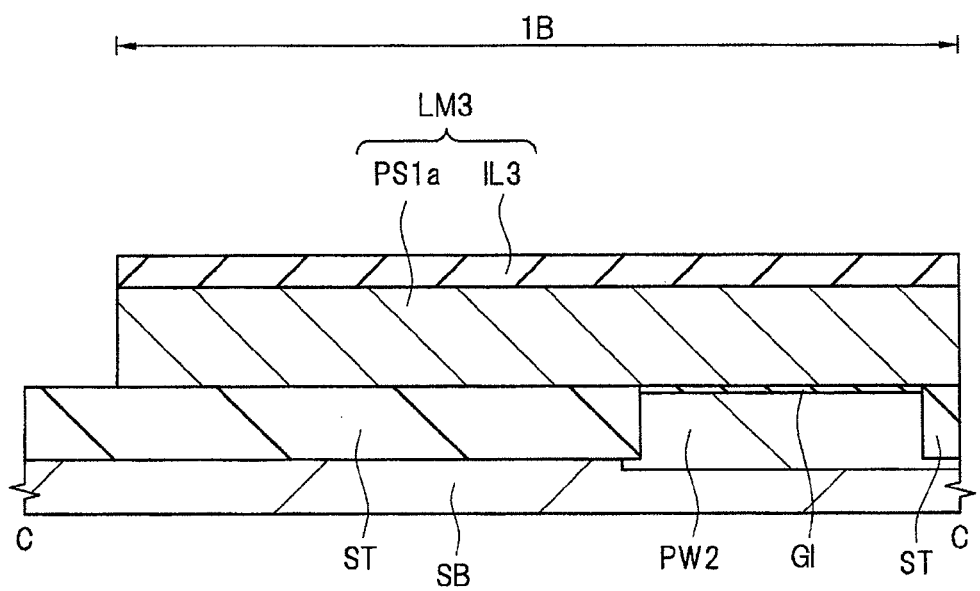
FIG. 88 is a fragmentary cross sectional view for a main portion of the semiconductor device identical with that of FIG. 86 during the manufacturing step thereof.

That is, as illustrated in FIG. 86 to FIG. 88, a photoresist pattern PR4 is formed as a resist pattern over the main surface of the semiconductor substrate SB by photolithography. The photoresist pattern PR4 is formed in the entire memory cell region 1A, but is not formed in the peripheral circuit region 1B and the dummy forming region 1C. Accordingly, the photoresist pattern PR4 is formed so as to cover the lamination pattern LM1 and expose the lamination patterns LM2 and LM3. Then, the insulation film IL3 is etched by using the photoresist pattern PR4 as an etching mask. Thus, the insulation film IL3 of the lamination pattern LM2 and the insulation film IL3 of the lamination pattern LM3 are removed. That is, the insulation film IL3 over the dummy gate electrode DG1 and the insulation film IL3 over the silicon film PS1a are removed. In this step, since the lamination pattern LM1 is covered by the photoresist pattern PR4, the insulation film IL3 of the lamination pattern LM1, that is, the insulation film IL3 over the control gate electrode CG is not removed but left as it is. Then, the photoresist pattern PR4 is removed. The step is shown in FIG. 89 to FIG. 91.

In the step of removing the insulation film IL3 over the dummy gate electrode DG1 and the insulation film IL3 over the silicon film PS1a, the insulation film IL3 is etched under a condition (etching condition) that the insulation film IL3 tends to be etched more than the dummy gate electrode DG1 and the silicon film PS1a. That is, the insulation film IL3 is etched under the condition (etching condition) that the etching rate of the insulation film IL3 is higher than the etching rate of the dummy gate electrode DG1 and the silicon film PS1a. In other words, the insulation film IL3 is etched under the condition (etching condition) that the dummy gate electrode DG1 and the silicon film PS1a are less etched than the insulation film IL3. That is, the insulation film IL3 is etched under the condition (etching condition) that each of the etching rates of the dummy gate electrode DG1 and the silicon film PS1a is lower than the etching rate of the insulation film IL3. Thus, the insulation film IL3 can be etched selectively while suppressing etching of the dummy gate electrode DG1 and the silicon film PS1a.

Figure 89:
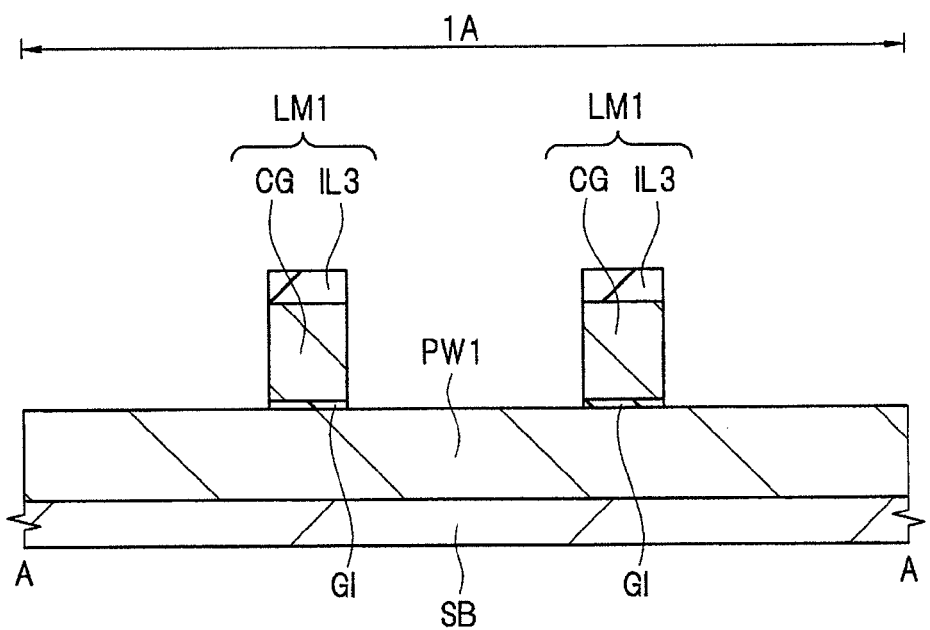
FIG. 89 is a fragmentary cross sectional view for a main portion of the semiconductor device during the manufacturing step thereof succeeding to that of FIG. 86.
Figure 90:
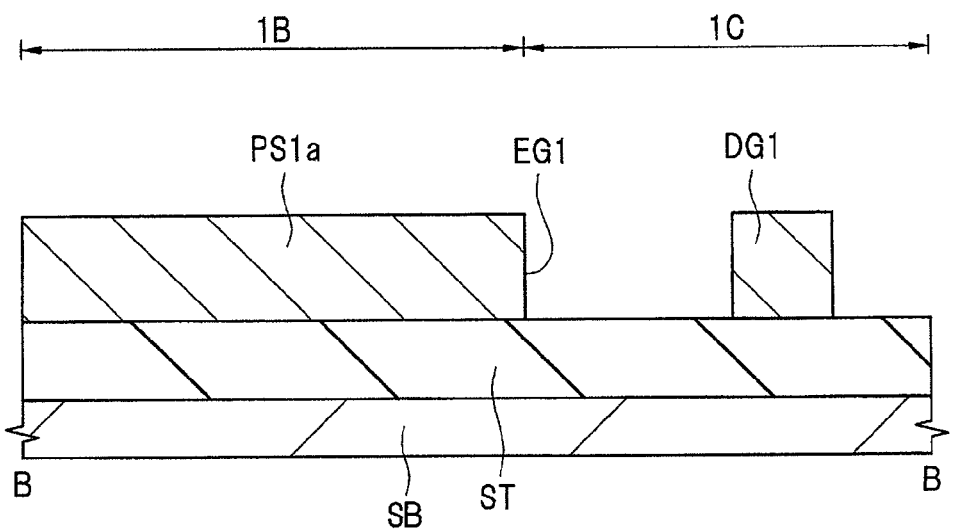
FIG. 90 is a fragmentary cross sectional view for a main portion of the semiconductor device identical with that of FIG. 89 during the manufacturing step thereof.
Figure 91:
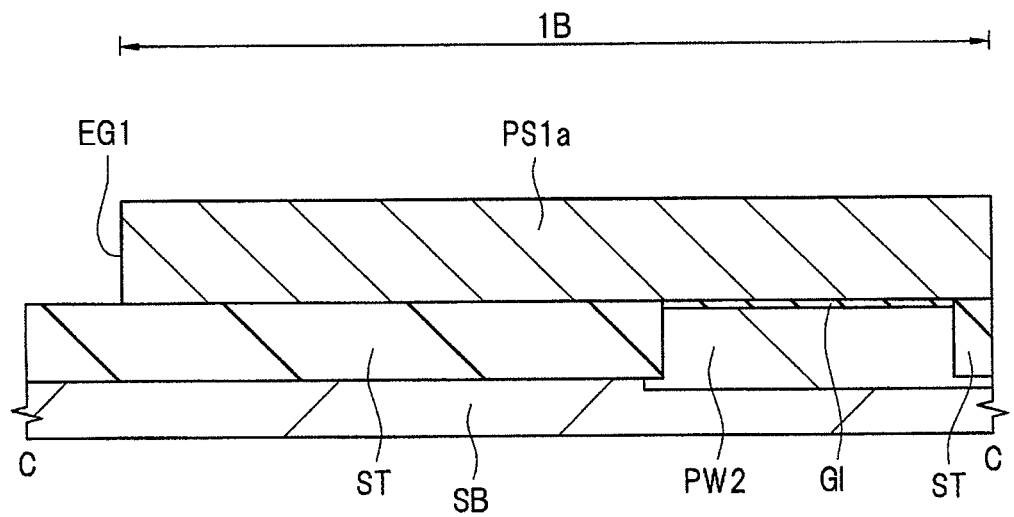
FIG. 91 is a fragmentary cross sectional view for a main portion of the semiconductor device identical with that of FIG. 89 during the manufacturing step thereof.

Thus, as illustrated in FIG. 89 to FIG. 91, it is possible to obtain a structure in which the insulation film IL3 is formed over the control gate electrode CG but the insulation film IL3 is not formed over the dummy gate electrode DG1 and over the silicon film PS1a.

The subsequent steps are basically identical with those of the first embodiment. That is, the step of forming the insulation film MZ at the step S7 and the succeeding steps are performed also in the second embodiment in the same manner as in the first embodiment, described above, but duplicate description therefor is to be omitted.

Figure 92:
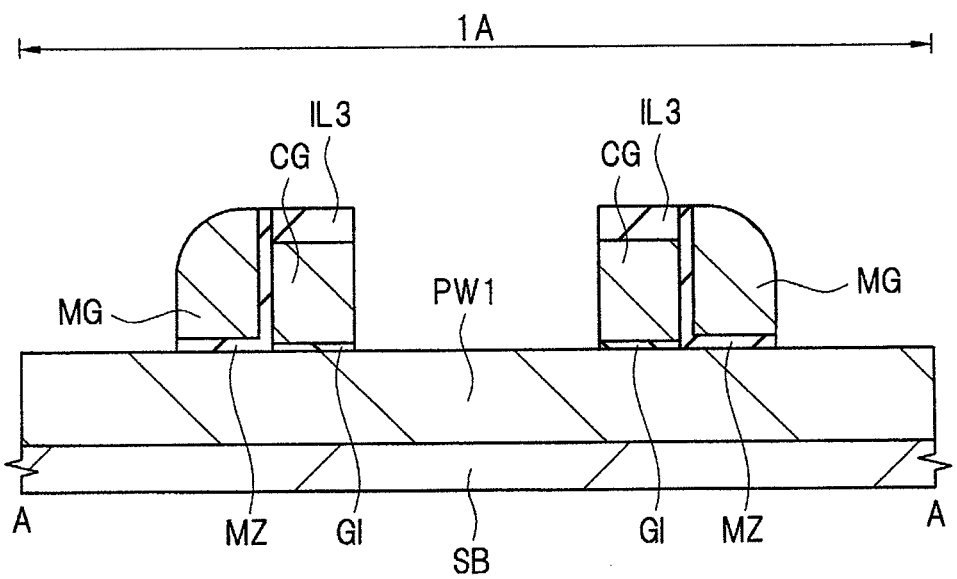
FIG. 92 is a fragmentary cross sectional view for a main portion of the semiconductor device during the manufacturing step thereof succeeding to that of FIG. 89.
Figure 93:
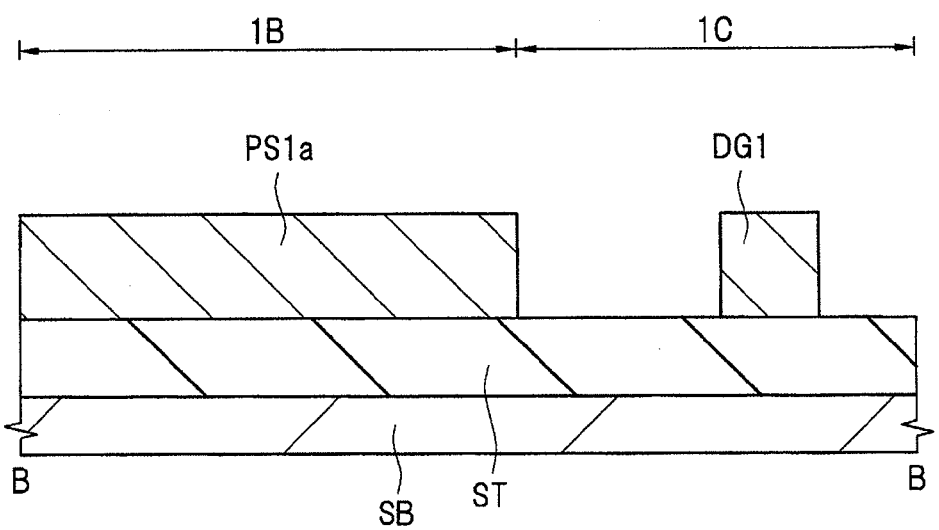
FIG. 93 is a fragmentary cross sectional view for a main portion of the semiconductor device identical with that of FIG. 92 during the manufacturing step thereof.
Figure 94:
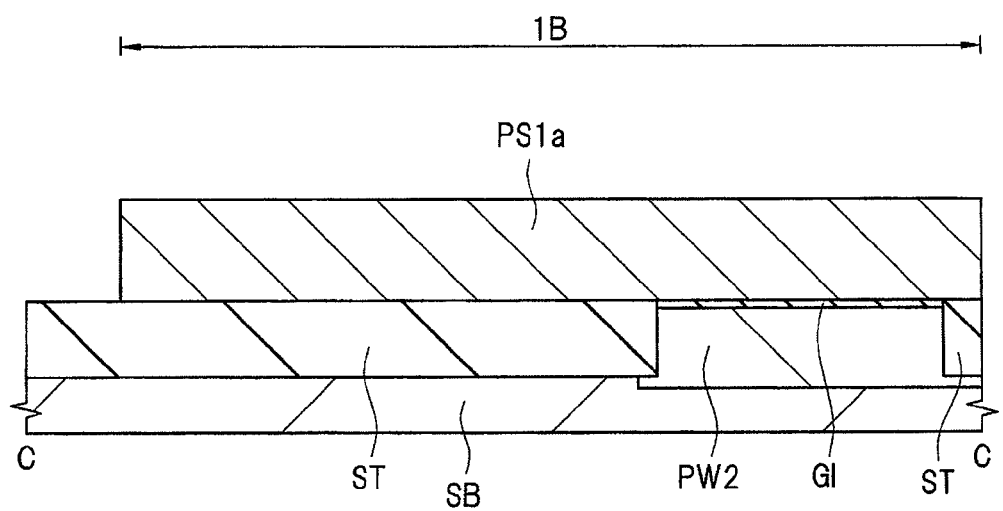
FIG. 94 is a fragmentary cross sectional view for a main portion of the semiconductor device identical with that of FIG. 92 during the manufacturing step thereof.

FIG. 92 to FIG. 94 illustrate a stage of performing the step of removing the insulation film MZ at the step S1 in the second embodiment and they correspond to FIG. 38 to FIG. 40 of the first embodiment respectively. The second embodiment is different from the first embodiment in that the memory gate electrode MG is formed adjacent to the control gate electrode CG by way of the insulation film MZ in the first embodiment, whereas the memory gate electrode MG is formed adjacent to the lamination pattern LM1 having the control gate electrode CG and the insulation film IL3 by way of the insulation film MZ in the second embodiment. That is, the memory gate electrode MG is formed on the side wall of the control gate electrode CG by way of the insulation film MZ in the first embodiment, whereas the memory gate electrode MG is formed on the side wall of the lamination pattern LM1 having the control gate electrode CG and the insulation film IL3 by way of the insulation film MZ in the second embodiment.

Figure 95:
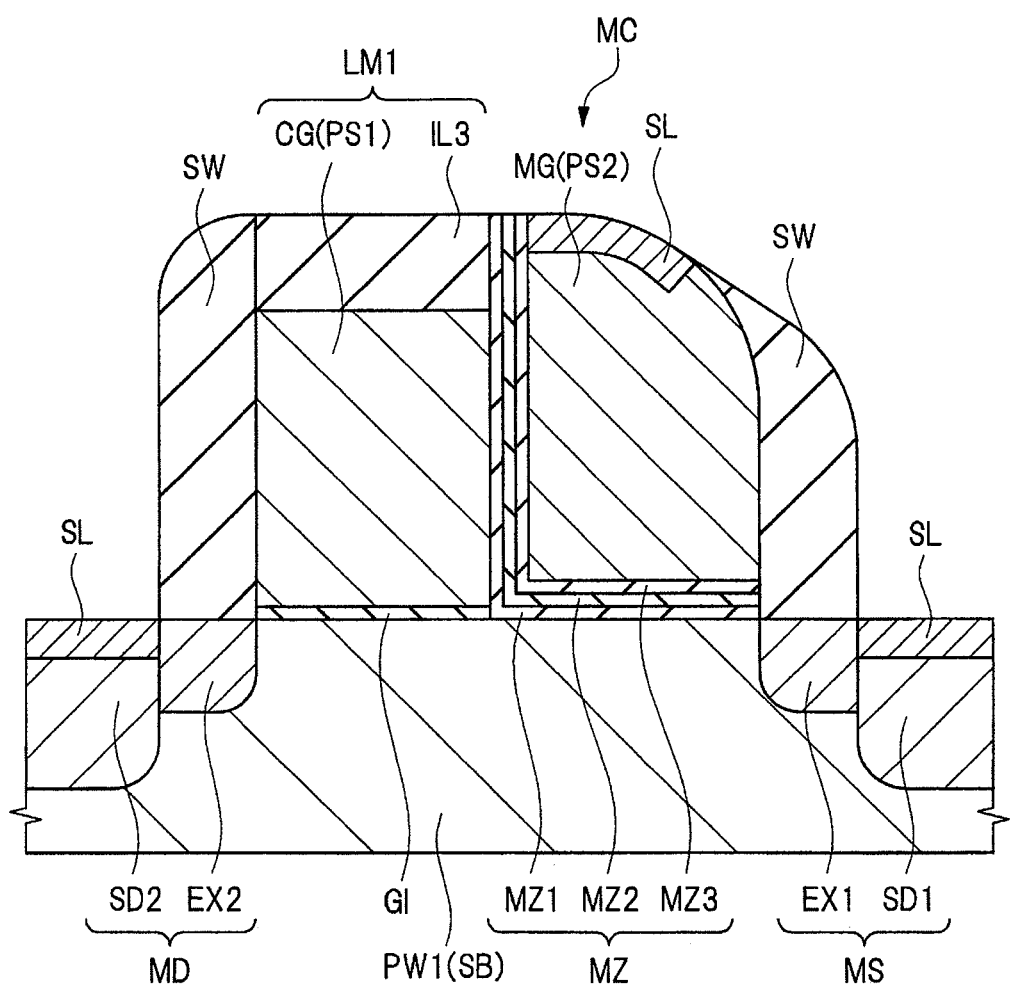
FIG. 95 is a fragmentary cross sectional view for a main portion of a semiconductor device according to another embodiment of the present invention during the manufacturing step thereof.

FIG. 95 is a cross sectional view for a main portion of the semiconductor device according to the second embodiment and illustrates a cross sectional view for a main portion of a memory cell region 1A, which corresponds to FIG. 73 of the first embodiment. The interlayer insulation film ILL the insulation film IL2, the control hole CT, the plug PG, and the interconnect M1 are not illustrated in order to simplify the drawing also in FIG. 95 in the same manner as in FIG. 73.

As illustrated in FIG. 95, in the memory cell MC of the non-volatile memory of the second embodiment, the control gate electrode CG comprises a lamination film of the silicon film PS1 and the insulation film IL3 (lamination pattern, lamination body, and lamination structure). Since the insulation film IL3 is formed over the control gate electrode CG of the memory cell, the metal silicide layer SL is not formed over the control gate electrode CG of the memory cell.

That is, the first embodiment in which the control gate electrode CG comprising the silicon film PS1 and the metal silicide layer SL thereon are replaced with a lamination pattern LM1 comprising the control gate electrode CG comprising the silicon film PS1 and the insulation film IL3 thereon corresponds to the semiconductor device of the second embodiment.

Since other configurations of the memory cell in this embodiment are identical with those of the first embodiment, duplicate description therefor is to be omitted.

Also in this embodiment, substantially the same effect as that of the first embodiment can be obtained.

In addition, since the memory gate electrode MG is formed on the side wall of the lamination pattern LM1 having the control gate electrode CG and the insulation film IL3 by way of the insulation film MZ in the second embodiment, even when the silicon film PS1 is formed to a thickness less than that of the first embodiment, the height of the memory gate electrode MG formed on the side wall of the lamination pattern LM1 in the form of a side wall spacer can be ensured.

Further, in the second embodiment, a step of removing the insulation film IL3 over the dummy gate electrode DG1 and the insulation film IL3 over the silicon film PS1a and leaving the insulation film IL3 over the control gate electrode CG is performed after the patterning step at the step S6 and before the step of forming the insulation film MZ at the step S7 is performed. Since the insulation film IL3 is removed from the silicon film PS1a, and the insulation film IL3 is not formed over the gate electrode GE to be formed later, the metal silicide layer SL can be formed over the gate electrode GE. Thus, since the resistance of the gate electrode GE can be lowered, the performance of the semiconductor device can be improved. Further, since the insulation film IL3 is removed from the silicon film PS1a, the insulation film IL3 is not formed also over the dummy gate electrode DG2 and over the dummy pattern DP to be formed later.

Further, after performing the patterning step at the step S6 after forming the insulation film IL3 over the silicon film PS1, if the insulation film IL3 over the dummy gate electrode DG1 is not removed different from the second embodiment, the insulation film IL3 is not formed over the gate electrode GE and over the dummy gate electrode DG2 but the insulation film IL3 is formed over the dummy gate electrode DG1. In this state, the interlayer insulation film IL1 is formed at the step S18 and the interlayer insulation film IL1 is polished at the step 19. In this case, since the insulation film IL3 is formed over the dummy gate electrode DG1, the apparent height of the dummy gate electrode DG1 is higher than the dummy gate electrode DG2 and there may be a possibility of reducing the effect of preventing the defect (dishing or the like) by the polishing step at the step 19 due to the dummy gate electrodes DG1 and DG2.

On the contrary, in the second embodiment, after forming the insulation IL3 over the silicon film PS1 and after performing the patterning step at the step S6, not only the insulation film IL3 over the silicon film PS1a but also the insulation film IL3 over the dummy gate electrode DG1 is also removed. Therefore, when the step of patterning the silicon film PS1a is performed at the step S12, the insulation film IL3 is formed over the control gate electrode CG but the insulation film IL3 is not formed over the gate electrode GE, over the dummy gate electrode DG1, and over the dummy gate electrode DG2. Therefore, the gate electrode GE, the dummy gate electrode DG1, and the dummy gate electrode DG2 are substantially at an identical height. Accordingly, the effect of preventing the defect (dishing or the like) in the polishing step at the step S19 can be obtained more effectively by the dummy gate electrodes DG1 and DG2, and the planarity of the insulation film IL1 after performing the polishing step at the step 19 can be improved further.

While the invention made by the present inventors has been described specifically with reference to the preferred embodiments thereof, it will be apparent that the invention is not restricted to the embodiments described above but can be modified variously within a range not departing the gist of the invention.

What is claimed is:

1. A method of manufacturing a semiconductor device having:
a memory cell of a non-volatile memory formed in a first region of a semiconductor substrate and a MISFET formed in a second region of the semiconductor substrate, in which
the memory cell has a first gate electrode and a second gate electrode adjacent to each other formed over the semiconductor substrate, a first gate insulation film formed between the first gate electrode and the semiconductor substrate, and a second gate insulation film formed between the second gate electrode and the semiconductor substrate and having a charge accumulation portion in the inside, and
the MISFET has a third gate electrode formed over the semiconductor substrate and a third gate insulation film formed between the third gate electrode and the semiconductor substrate, the method comprising the steps of:
(a) providing the semiconductor substrate,
(b) forming a first film for the first gate electrode and the third gate electrode over the main surface of the semiconductor substrate,
(c) patterning the first film, thereby forming the first gate electrode in the first region, forming a first film pattern in the second region, and forming a first dummy gate electrode in a third region of the semiconductor substrate,
(d) forming a first insulation film for the second gate insulation film over the main surface of the semiconductor substrate so as to cover the first gate electrode, the first film pattern, and the first dummy gate electrode,
(e) forming a second film for the second gate electrode over the first insulation film,
(f) etching the second film, thereby forming the second gate electrode on the side wall of the first gate electrode by way of the first insulation film while leaving the second film,
(g) patterning the first film pattern, thereby forming the third gate electrode and a second dummy gate electrode in the second region,
(h) forming an interlayer insulation film so as to cover the first gate electrode, the second gate electrode, the third gate electrode, the first dummy gate electrode, and the second dummy gate electrode, and
(i) polishing the upper surface of the interlayer insulation film,
wherein the second gate insulation film extends for a region between the second gate electrode and the semiconductor substrate and for a region between the second gate electrode and the first gate electrode, and
wherein a height of the second gate insulation film which extends in the region between the second gate electrode and the first gate electrode is substantially the same as a height of the first gate electrode and the second gate electrode with respect to the semiconductor substrate.

2. The method of manufacturing the semiconductor device according to claim 1, wherein
the method further includes, after the step (f) and before the step (g),
a step (f1) of removing the first insulation film at a portion not covered by the second gate electrode.

3. The method of manufacturing the semiconductor device according to claim 2, wherein
the method further includes, after the step (g) and before the step (h),
a step (g1) of forming a first semiconductor region for a source or a drain of the memory cell in the first region of the semiconductor substrate and forming a second semiconductor region for a source or a drain of the MISFET in the second region of the semiconductor substrate by ion implantation.

4. The method of manufacturing the semiconductor device according to claim 3, wherein
the method further includes, before the step (b),
a step (a1) of forming a second insulation film for the first gate insulation film and for the third gate insulation film over the main surface of the semiconductor substrate.

5. The method of manufacturing the semiconductor device according to claim 1,
wherein the upper surface of the interlayer insulation film is polished by using a CMP method in the step (i).

6. The method of manufacturing the semiconductor device according to claim 1, wherein the method includes, after the step (i), the steps of:
(j) forming a contact hole in the interlayer insulation film and
(k) forming a conductive plug in the contact hole.

7. The method of manufacturing the semiconductor device according to claim 1, wherein the first film comprises silicon.

8. The method of manufacturing the semiconductor device according to claim 7, wherein the second film comprises silicon.

9. The method of manufacturing the semiconductor device according to claim 1, wherein the outer periphery of the first film pattern is left in the step (g).

10. The method of manufacturing the semiconductor device according to claim 1, wherein the step (c) includes the steps of:
(c2) forming a resist pattern over the first film; and
(c3) patterning the first film by etching using the resist pattern as an etching mask after the step (c2), thereby forming the first gate electrode in the first region, forming the first film pattern in the second region, and forming the first dummy gate electrode in the third region.

11. The method of manufacturing the semiconductor device according to claim 10,
wherein the resist pattern formed over the first film in the step (c2) has a first opening for forming the first gate electrode in the first region and has a second opening for opening the first dummy gate electrode in the third region.

12. A method of manufacturing a semiconductor device having:
a memory cell of a non-volatile memory formed in a first region of a semiconductor substrate and a MISFET formed in a second region of the semiconductor substrate, in which
the memory cell has a first gate electrode and a second gate electrode adjacent to each other formed over the semiconductor substrate, a first gate insulation film formed between the first gate electrode and the semiconductor substrate, and a second gate insulation film formed between the second gate electrode and the semiconductor substrate and having a charge accumulation portion in the inside, and
the MISFET has a third gate electrode formed over the semiconductor substrate and a third gate insulation film formed between the third gate electrode and the semiconductor substrate, the method comprising the steps of:
(a) providing the semiconductor substrate,
(b) forming a first film for the first gate electrode and the third gate electrode over the main surface of the semiconductor substrate,
(c) forming a third insulation film over the first film in which the third insulation film and the first film are patterned, thereby forming a first lamination pattern comprising the first gate electrode and the third insulation film over the first gate electrode in the first region, forming a second lamination pattern comprising the first film pattern and the third insulation film in the second region,
(d) patterning the first film, thereby forming the first gate electrode in the first region, forming a first film pattern in the second region, forming a first dummy gate electrode in a third region of the semiconductor substrate, and forming a third lamination pattern comprising the first dummy gate electrode and the third insulation film over the first dummy gate electrode in the third region of the semiconductor substrate,
(e) removing the third insulation film over the first film pattern and the third insulation film over the dummy gate electrode while leaving the third insulation film over the first gate electrode,
(f) forming a first insulation film for the second gate insulation film over the main surface of the semiconductor substrate so as to cover the first gate electrode, the first film pattern, and the first dummy gate electrode,
(g) forming a second film for the second gate electrode over the first insulation film,
(h) etching the second film, thereby forming the second gate electrode on the side wall of the first gate electrode by way of the first insulation film while leaving the second film,
(i) patterning the first film pattern, thereby forming the third gate electrode and a second dummy gate electrode in the second region,
(j) forming an interlayer insulation film so as to cover the first gate electrode, the second gate electrode, the third gate electrode, the first dummy gate electrode, and the second dummy gate electrode, and
(k) polishing the upper surface of the interlayer insulation film,
wherein the second gate insulation film extends for a region between the second gate electrode and the semiconductor substrate and for a region between the second gate electrode and the first gate electrode, and
wherein a height of the second gate insulation film which extends in the region between the second gate electrode and the first gate electrode is substantially the same as a height of the first gate electrode and the second gate electrode with respect to the semiconductor substrate.

13. The method of manufacturing the semiconductor device according to claim 12,
wherein the second gate electrode is formed on the side wall of the first lamination pattern by way of the first insulation film in the step (h).

* * * * *